United States Patent
Zhang

(10) Patent No.: US 9,997,463 B2
(45) Date of Patent: Jun. 12, 2018

(54) MODULAR INTERCONNECTS FOR GATE-ALL-AROUND TRANSISTORS

(71) Applicant: STMicroelectronics, Inc., Coppell, TX (US)

(72) Inventor: John H. Zhang, Altamont, NY (US)

(73) Assignee: STMicroelectronics, Inc., Coppell, TX (US)

(*) Notice: Subject to any disclaimer, the term of this patent is extended or adjusted under 35 U.S.C. 154(b) by 6 days.

(21) Appl. No.: 15/191,359

(22) Filed: Jun. 23, 2016

(65) Prior Publication Data

US 2017/0005106 A1    Jan. 5, 2017

Related U.S. Application Data

(60) Provisional application No. 62/187,245, filed on Jul. 1, 2015.

(51) Int. Cl.
*H01L 27/115* (2017.01)
*H01L 29/06* (2006.01)
(Continued)

(52) U.S. Cl.
CPC .. *H01L 23/5386* (2013.01); *H01L 21/823871* (2013.01); *H01L 21/823885* (2013.01);
(Continued)

(58) Field of Classification Search
CPC ......... H01L 29/66666; H01L 29/78642; H01L 21/823885; H01L 29/42392; H01L 29/7827; H01L 21/8221; H01L 23/0676
See application file for complete search history.

(56) References Cited

U.S. PATENT DOCUMENTS

| 4,737,837 A * | 4/1988 | Lee ..................... H01L 27/0207 257/268 |
| 2010/0187601 A1* | 7/2010 | Masuoka ............ H01L 29/7827 257/329 |

(Continued)

OTHER PUBLICATIONS

Koji Yano et al., IEEE Transactions on Electronic Devices, vol. 57, No. 4, Apr. 2010. p. 919-927.

(Continued)

*Primary Examiner* — Matthew Reames
*Assistant Examiner* — John Bodnar
(74) *Attorney, Agent, or Firm* — Seed IP Law Group LLP

(57) ABSTRACT

A modular interconnect structure facilitates building complex, yet compact, integrated circuits from vertical GAA FETs. The modular interconnect structure includes annular metal contacts to the transistor terminals, sectors of stacked discs extending radially outward from the vertical nanowires, and vias in the form of rods. Extension tabs mounted onto the radial sector interconnects permit signals to fan out from each transistor terminal. Adjacent interconnects are linked by linear segments. Unlike conventional integrated circuits, the modular interconnects as described herein are formed at the same time as the transistors. Vertical GAA NAND and NOR gates provide building blocks for creating all types of logic gates to carry out any desired Boolean logic function. Stacked vertical GAA FETs are made possible by the modular interconnect structure. The modular interconnect structure permits a variety of specialized vertical GAA devices to be integrated on a silicon substrate using standard CMOS processes.

32 Claims, 55 Drawing Sheets

(51) Int. Cl.

| | |
|---|---|
| *H01L 29/423* | (2006.01) |
| *H01L 27/06* | (2006.01) |
| *H01L 29/08* | (2006.01) |
| *H01L 27/07* | (2006.01) |
| *H01L 27/02* | (2006.01) |
| *H01L 29/786* | (2006.01) |
| *H01L 29/66* | (2006.01) |
| *H01L 29/788* | (2006.01) |
| *H01L 23/538* | (2006.01) |
| *H01L 29/417* | (2006.01) |
| *H01L 29/775* | (2006.01) |
| *H01L 29/792* | (2006.01) |
| *H01L 21/8238* | (2006.01) |
| *H01L 27/092* | (2006.01) |
| *H01L 27/11582* | (2017.01) |
| *H01L 29/51* | (2006.01) |

(52) U.S. Cl.
CPC ...... *H01L 23/5384* (2013.01); *H01L 27/0255* (2013.01); *H01L 27/0688* (2013.01); *H01L 27/0705* (2013.01); *H01L 27/0727* (2013.01); *H01L 27/092* (2013.01); *H01L 29/41741* (2013.01); *H01L 29/42392* (2013.01); *H01L 29/66439* (2013.01); *H01L 29/66666* (2013.01); *H01L 29/66742* (2013.01); *H01L 29/775* (2013.01); *H01L 29/78642* (2013.01); *H01L 29/7926* (2013.01); *H01L 27/11582* (2013.01); *H01L 29/0676* (2013.01); *H01L 29/517* (2013.01)

(56) References Cited

U.S. PATENT DOCUMENTS

| | | | |
|---|---|---|---|
| 2010/0270611 A1* | 10/2010 | Masuoka | H01L 21/823885 257/329 |
| 2011/0049532 A1 | 3/2011 | Odekirk et al. | |
| 2013/0341596 A1 | 12/2013 | Chang et al. | |
| 2015/0372104 A1 | 12/2015 | Liu et al. | |
| 2016/0087059 A1* | 3/2016 | Hsieh | H01L 21/823475 257/329 |

OTHER PUBLICATIONS

H.Tanaka et al; "Bit Cost Scalable Technology with Punch and Plug Process for Ultra High Density Flash Memory," 2007 Symposium on VLSI Technology Digest of Technical Papers, p. 14-15.
U.S. Appl. No. 14/588,337, filed Dec. 31, 2014 Zhang et al.
U.S. Appl. No. 14/675,536, filed Mar. 31, 2015 Zhang.

* cited by examiner

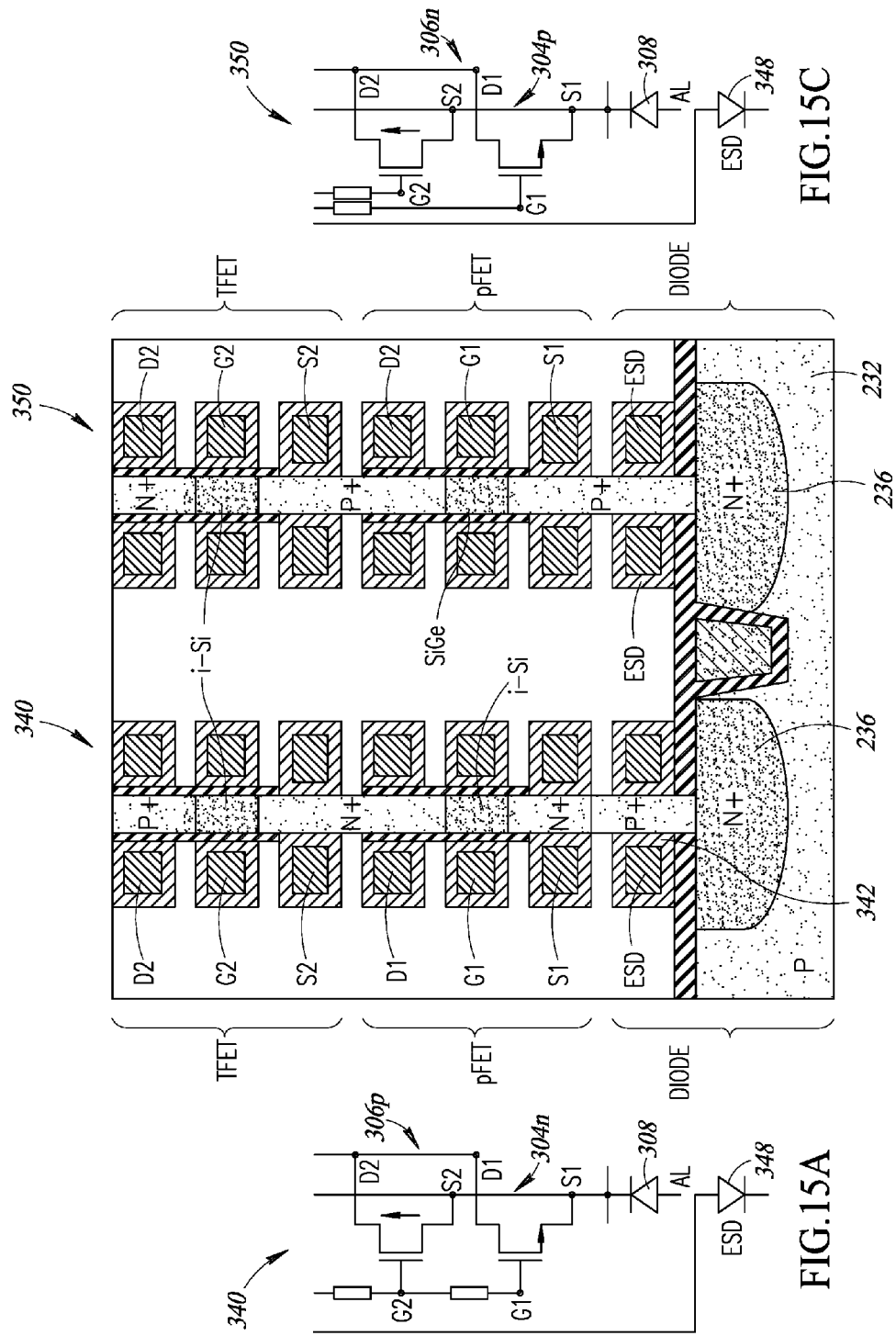

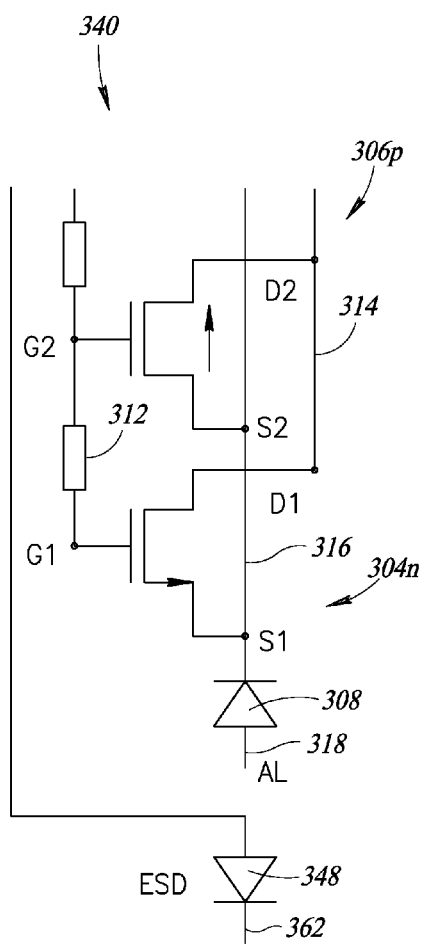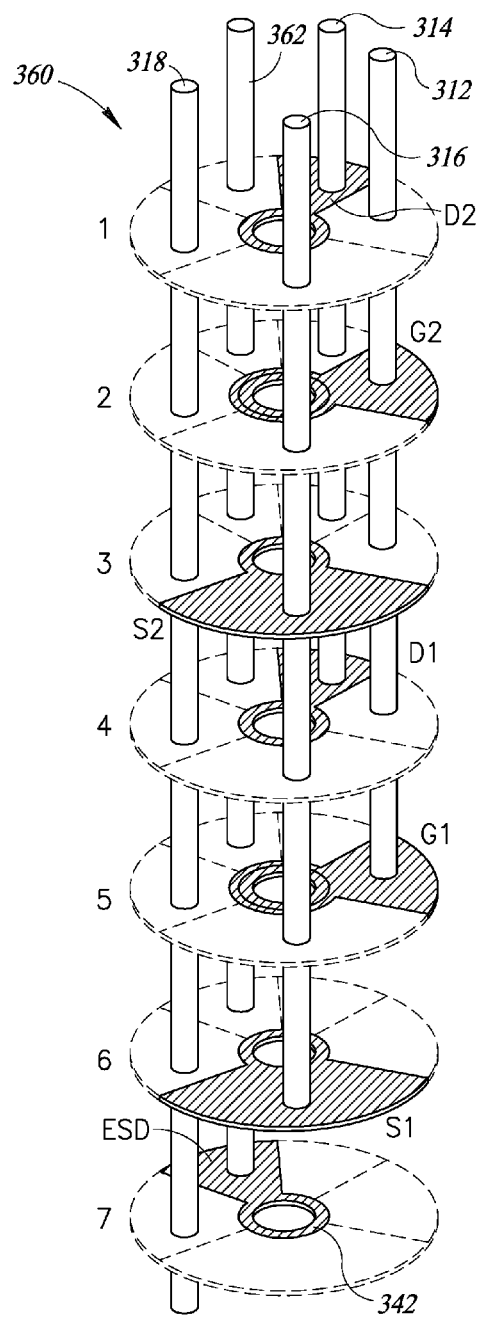
FIG.16A
FIG.16B

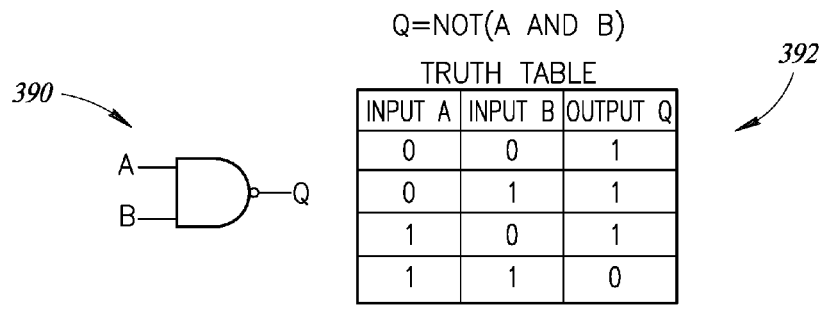
FIG.18A
(PRIOR ART)
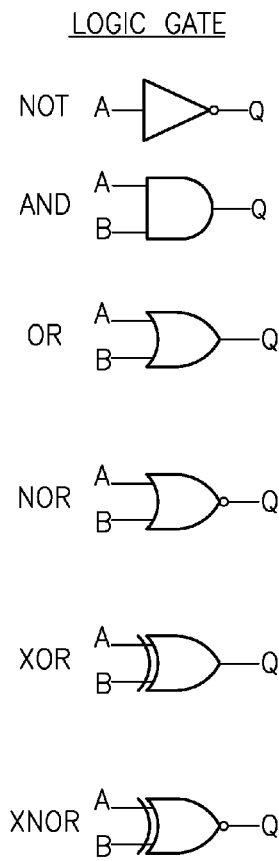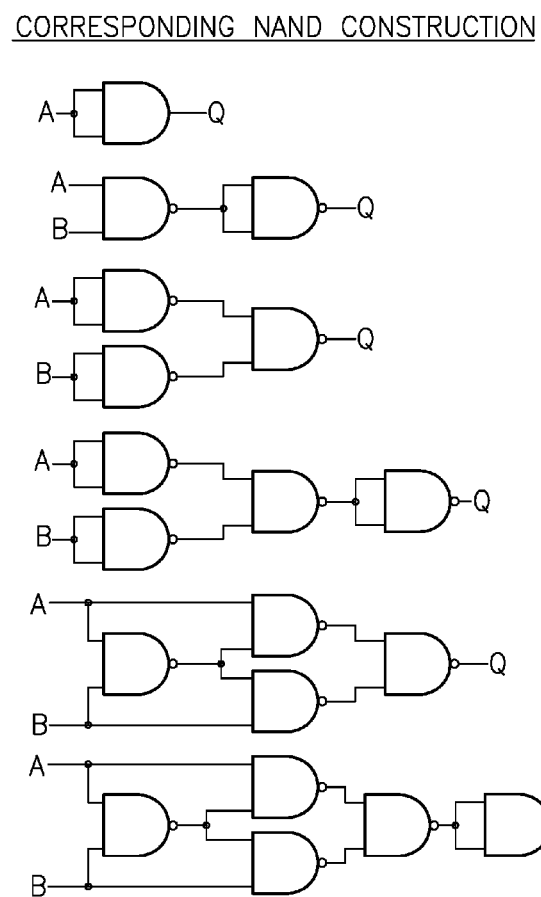
FIG.18B
(PRIOR ART)

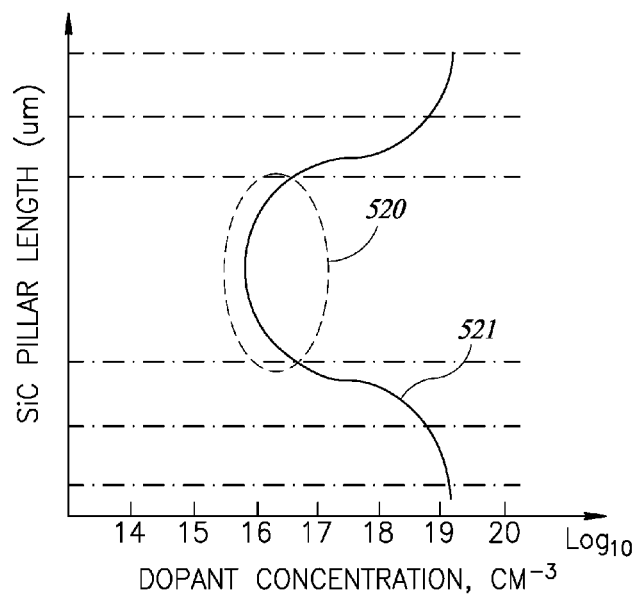
FIG.26A
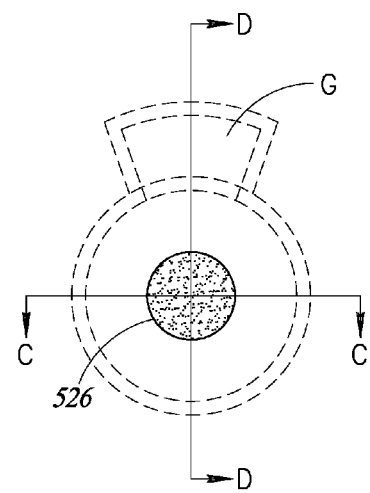
FIG.26B
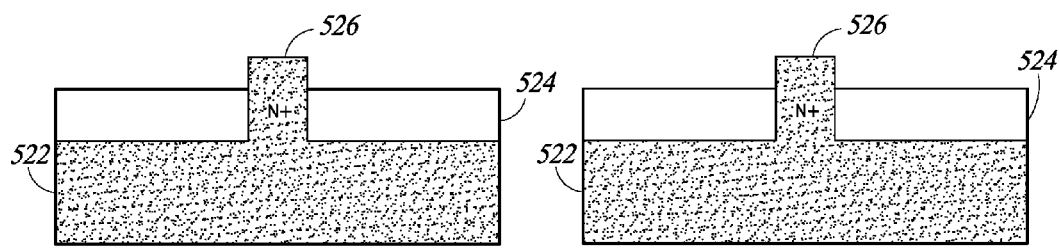
FIG.26C
FIG.26D

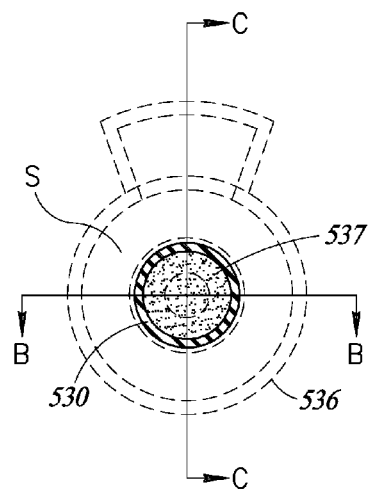
FIG.29A
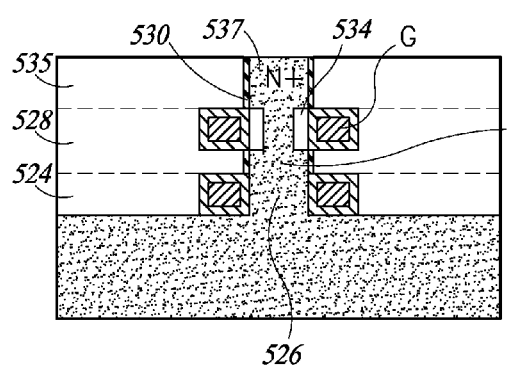 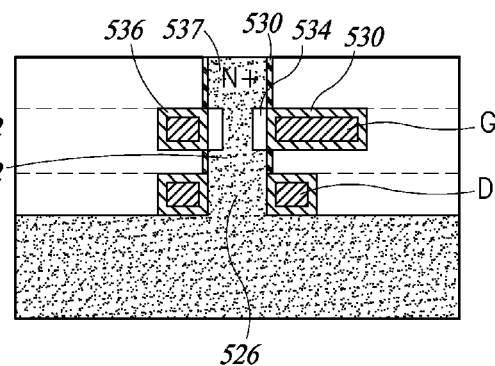
FIG.29B          FIG.29C

MODULAR INTERCONNECTS FOR GATE-ALL-AROUND TRANSISTORS

BACKGROUND

Technical Field

The present disclosure generally relates to various geometries for gate-all-around transistor devices built on a semiconductor substrate and, in particular, to vertically oriented gate-all-around transistors in which current flows in a direction transverse to the surface of the semiconductor substrate.

Description of the Related Art

A gate-all-around FET, or GAA FET, is a non-planar metal-oxide-semiconductor (MOS) transistor design in which the gate fully wraps around the conducting channel for maximum control of current flow therein. In the GAA FET, the channel is configured as a cylindrical nanowire that is surrounded by a gate oxide. The gate then surrounds the gate oxide.

Source and drain regions are positioned on either end of the channel. Some existing GAA FETs are horizontal GAA FETs, oriented such that the nanowire extends in a horizontal direction that is substantially parallel to the surface of the semiconductor substrate. Such horizontal GAA FETs are described in, for example, U.S. Patent Application Publication No. 2013/0341596 to Chang et al., of IBM, and in U.S. Patent Publication No. 2015/0372104, to Liu et al., of STMicroelectronics.

Vertical GAA FET structures have also been developed in which a current-carrying nanowire is oriented substantially perpendicular to a top surface of a silicon substrate. The nanowire is grown epitaxially and doped appropriately to form source, channel, and drain regions in a stacked arrangement. The vertical GAA FET is intended to meet design and performance criteria for integrated circuits of the 7 nm technology generation. Such devices are described in U.S. patent application Ser. Nos. 14/588,337 and 14/675,536 assigned to the same assignee as the present patent application.

One particular challenging aspect of the vertical GAA FET stacked design is the interconnect structure. In particular, making electrical contact to the lowest terminal of the vertical GAA FET, i.e., the source or the drain, can be awkward because the lower terminal is not accessible from the top side of the semiconductor substrate, once the vertical GAA FET is formed. In previous designs, some electrical contacts to the lower terminals of GAA FETs were made via the back side of the substrate.

BRIEF SUMMARY

A modular interconnect structure suitable for use with vertical gate-all-around FETs is disclosed. The modular interconnect structure includes annular metal contacts to the transistor terminals, metal interconnects in the form of radial sectors of stacked discs extending outward from the vertical nanowires, and vias in the form of conductive rods coupling the radial sectors. Extension tabs mounted onto the radial sector interconnects further increase the surface area accessible to connecting vias, thus allowing signals to fan out from each transistor terminal. Adjacent interconnects can be linked by linear segments. Unlike conventional integrated circuits, in which transistors are formed in a semiconductor substrate during "front end" processing, and then after the transistors are fully formed, an interconnect structure is constructed on top of the silicon substrate during "back end" processing, the modular interconnects as described herein are formed at the same time as the transistors. Thus, when fabricating integrated circuits using the modular interconnect approach disclosed herein, there is no distinction between front end and back end processing. Such a development presents a radically new paradigm for future generations of process technology.

The modular interconnect structure facilitates building complex, yet compact, integrated circuits from vertical GAA FETs. Vertical NAND gate and NOR gate designs are disclosed that can be used as building blocks for creating all types of logic gates, and thus to carry out any desired Boolean logic function using a vertical GAA FET architecture. In some configurations, it is advantageous to stack vertical GAA FETs on top of one another. Stacked vertical GAA FETs are made possible by the modular interconnect structure. In addition, vertical GAA FET versions of specialized transistors are presented, including a vertical GAA tunneling field effect transistor (VGAA TFET), a vertical GAA silicon-oxide-nitride-oxide-silicon (VGAA SONOS) device, a vertical GAA silicon-on-insulator (VGAA SOD device, and a vertical GAA static induction transistor (VGAA SIT). The modular interconnect structure disclosed herein permits any of these VGAA devices to be integrated on a silicon substrate using standard CMOS processes.

Increasing the transistor density by stacking devices vertically and by using the radial modular interconnect structure disclosed herein facilitates manufacture of state-of-the-art consumer electronic products that contain microprocessor chips and mixed-signal chips. These products may include tablet computers, smart phones, desktop computers and servers, gaming consoles, television set top boxes, internet video streaming consoles, automotive micro-controllers, high density memory devices, and the like. Chip fabrication of the structures disclosed can employ older processing equipment, because the vertical transistors and the radial interconnect structures are more compact, and therefore they are more spatially efficient.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

FIGS. 15A-15C correspond to FIGS. 13A-13C in which the anti-leakage type diode is replaced by an electrostatic discharge (ESD) type diode.

FIGS. 16A-16D correspond to FIGS. 14A-14D in which both the anti-leakage type diode and the electrostatic discharge (ESD) type diode are included.

FIG. 18A is a schematic diagram showing a NAND logic gate, and a truth table describing operation of the NAND gate, as is well known in the art.

FIG. 18B shows six types of Boolean logic gates (inverter, AND, OR, NOR, XOR, XNOR) and their corresponding construction using only NAND gates.

FIG. 26A is a plot of epitaxial doping concentration as a function of height along a vertical SiC pillar for a static induction transistor (SIT), according to an embodiment as described herein.

FIG. 26B is a horizontal cross-sectional view of the SiC pillar during fabrication of the drain terminal, according to an embodiment as described herein.

FIGS. 26C and 26D are vertical cross-sectional views along the cut lines shown in FIG. 26B, of the SiC pillar during fabrication of the drain terminal.

FIGS. 27A-29C are cross-sectional views of the SiC pillar and associated electrical connections during fabrication of the static induction transistor according to the sequence shown in FIG. 25.

DETAILED DESCRIPTION

Figure 1A:
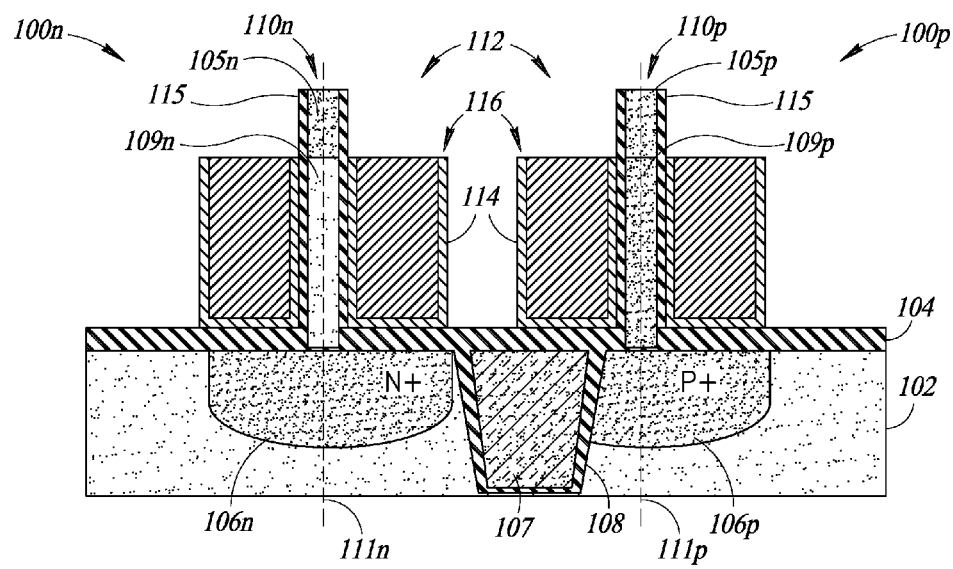
FIG. 1A is a cross-sectional view of N-P-N and P-N-P vertical GAAs reproduced from U.S. patent application Ser. No. 14/588,337.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to vertical gate-all-around device interconnects that have been produced; however, the present disclosure and the reference to certain materials, dimensions, and the details and ordering of processing steps are exemplary and should not be limited to those shown.

Turning now to the drawings, FIGS. 1A, 1B, 2A, and 2B show various examples of existing vertical GAA transistors having different interconnect configurations, as described in U.S. patent application Ser. No. 14/588,337 and Ser. No. 14/675,536, assigned to the same assignee as the present patent document.

FIG. 1A shows a pair of existing CMOS n-type and p-type vertical gate-all-around (GAA) transistors, 100n and 100p, built on a silicon substrate 102. The n-FET transistor 100n and the p-FET transistor 100p are electrically separated from one another by an isolation region 107. The isolation region 107 is filled with an insulator, e.g., an oxide material, and has a silicon nitride liner 108 between the oxide material and the silicon substrate 102. Each one of the vertical GAA transistors is essentially a linear, or 1-D, device in the form of a nanowire oriented in a direction transverse to planar front and back surfaces of the silicon substrate 102. Two such nanowires are shown in FIG. 1A, 110n and 110p. The nanowire 110n is the channel region of the n-FET transistor 100n and the nanowire 110p is the channel region of the p-FET transistor 100p. The nanowire 110n includes a silicon channel 109n that couples an N+ drain region 106n to an N+ source region 105n. The N+ drain region 106n is located below the channel 109n, and the N+ source region 105n is located above the channel 109n along a channel axis 111n. The nanowire 110p includes a SiGe channel 109p that couples a P+ drain region 106p below the channel 109p to a P+ source region 105p above the channel 109p. The source and drain regions may be switched so that the source region is located below the drain region. Alternatively, one or both channels 109 can be made of a III-V semiconducting material such as InAs, as suggested by Ionescu and Riel in "Tunnel Field-Effect Transistors as Energy-Efficient Electronic Switches," [Nature, Vol. 479, November 17, 201, p. 379]. The vertical nanowires 110n,p desirably have diameters in the range of 6-10 nm. The n-type material in the source and drain regions of the n-FET transistor 100n can be, for example, epitaxially grown indium-doped silicon. The p-type material in the source and drain regions of the p-FET transistor 100p can be, for example, epitaxially grown SiGe. The channel length can be as long as 100 nm.

Metal gates 114 wrap around each of the nanowires 110n,p. In one embodiment, the metal gates 114 include stacks of work function materials. For example, the metal gate for the n-FET transistor 100n is a three-layer stack that includes a 4-nm thick layer of titanium carbide (TiC) sandwiched between two 3-nm layers of titanium nitride (TiN). The metal stack for the p-FET device 101p is a three-layer stack of TiN that yields a total thickness of about 10 nm. The metal gates 114 are spaced apart from the channels 110 by wrap-around gate dielectrics 115 made of a high-k material, e.g., $SiO_2$ or $HfO_2$.

Figure 1B:
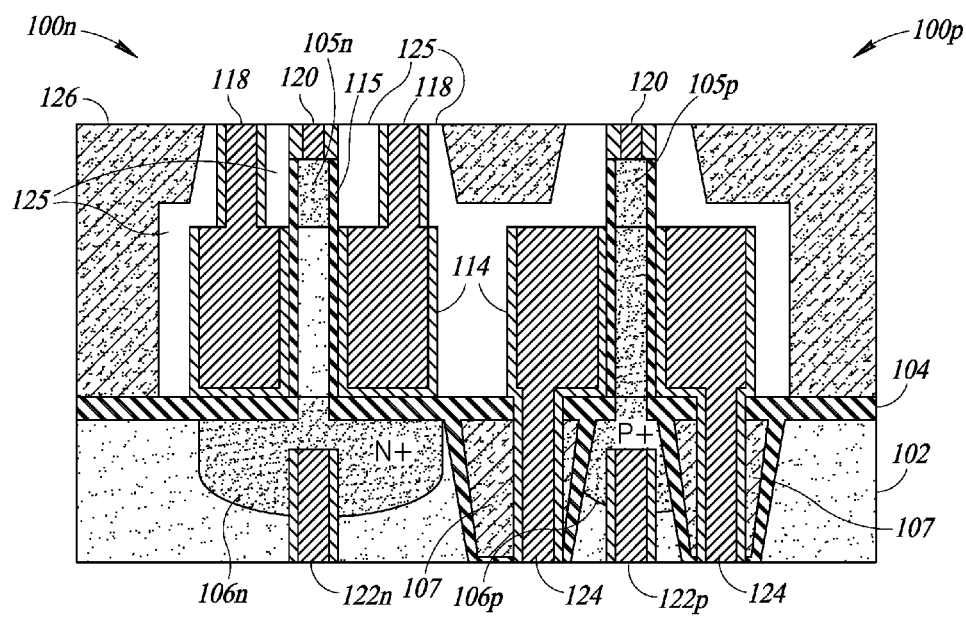
FIG. 1B is a cross-sectional view of vertical GAA FETs following formation of conventional linear contacts, reproduced from U.S. patent application Ser. No. 14/588,337.

The vertical geometry of the GAA transistors thus formed allows flexibility in circuit design by accessing the devices from different front side and back side locations by simply changing the contact configuration. FIG. 1B shows conventional front side gate contacts 118, 120 and back side gate contacts 124 to the vertical GAA transistors 100n,p, respectively. The back side gate contacts 124 pass through the isolation regions 107. Both the n-FET 100n and the p-FET 100p also have back side nanowire contacts 122n,p to the drain regions 106n,p and front side nanowire contacts 120n,p to the source regions 105n,p. Long channels 109n,p having aspect ratios in the range of about 4:1-10:1 provide high gate contact areas to maintain low resistances at the front side gate contacts 118. Each contact 118, 120, 122, 124 may include a bulk metal and a liner, as is customary in the art. The nanowires are also covered by a low-k encapsulant 125, which is, in turn, covered by an insulating material 126. The low-k encapsulant 125 may be made of SiOCN or SiBCN, having a thickness in the range of about 8-30 nm.

Figure 2A:
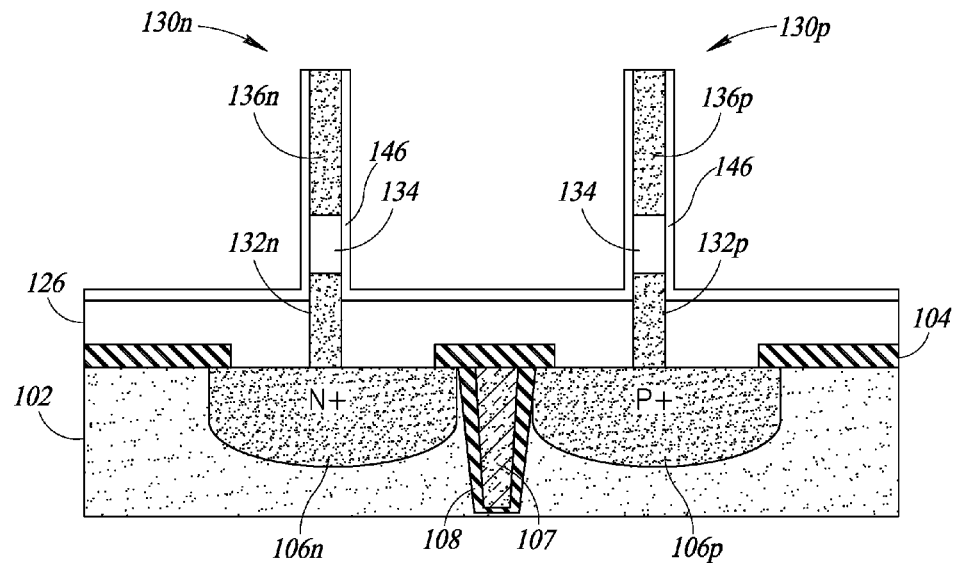
FIG. 2A is a cross-sectional view of P-N-N and N-P-P vertical GAA TFETs reproduced from U.S. patent application Ser. No. 14/675,536.
Figure 2B:
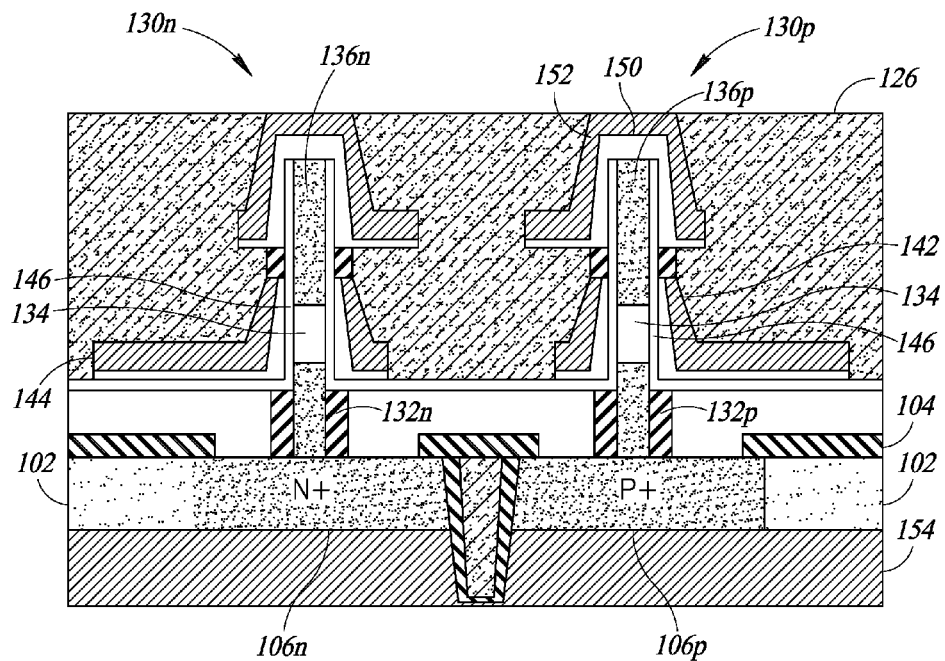
FIG. 2B is a cross-sectional view of vertical GAA TFETs following formation of conventional front side and back side linear contacts taken from U.S. patent application Ser. No. 14/675,536.

FIGS. 2A and 2B show existing n-type and p-type vertical gate-all-around (GAA) tunneling FETs (TFETs) 130n,p, respectively, built on a silicon substrate 102. TFETs are considered to be promising alternatives to conventional CMOS devices for use in integrated circuits having low-voltage, low-power applications. Unlike a MOSFET, the source and drain of a TFET are doped to have opposite polarity. During operation of the TFET, charge carriers tunnel through a potential barrier rather than being energized to surmount the potential barrier, as occurs in a MOSFET. Because switching via tunneling requires less energy, TFETs are particularly useful in low-power applications such as mobile devices, for which battery lifetime is an important factor.

The TFETs 130n,p include lower drain regions 132n,p, channel regions 134, and upper source regions 136n,p, which are grown epitaxially from the doped wells 106n,p. The channel regions 134 are made of intrinsic silicon, while the source and drain regions are doped in-situ during epitaxial growth. An annular gate 146 surrounds each channel region 134, capacitively controlling current flow through the channel from all sides. The TFETs 130n,p are separated by an isolation region 107 containing insulating materials such as a bulk insulator made of oxide and a liner 108 made of, for example, SiN, as is customary in the art.

FIG. 2B shows the TFETs 130n,p having conventional contacts to the source, drain, and gate terminals. The source regions 136n,p are electrically accessible via front side contacts 152. Annular gates 146 of the TFETs are accessible by vias (not shown) that can land on contact pads 144 that extend outward from the nanowires. The TFET drain regions 132n,p are accessible via a back side contact 154 that provides low contact resistance and also serves as a heat sink.

Existing arrangements of contacts to vertical GAA devices as described above tend to be awkward and present obstacles to the development of high performance, high density vertical GAA integrated circuits. This is partly because of the inherent geometry of vertical nanowire devices, in which stacked source, gate, and drain terminals may not be easily accessible from the top surface, or front side, of the silicon substrate. The existing contact designs are awkward, in part, because they were originally designed to support horizontal, planar devices as opposed to vertical, stacked devices. Furthermore, in a conventional horizontal device, the transistor is made first, and then the interconnect structure is formed by dropping vertical contacts and vias from above the transistor. However, when the orientation of the transistor itself is vertical, it is difficult to access the various terminals from above, after the device is already formed, without substantially increasing the footprint of the device. Relying on back side contacts may not be a favorable solution because accessing the back side contacts may require thinning the wafers and introducing additional processing steps.

Figures 3A, 3B:
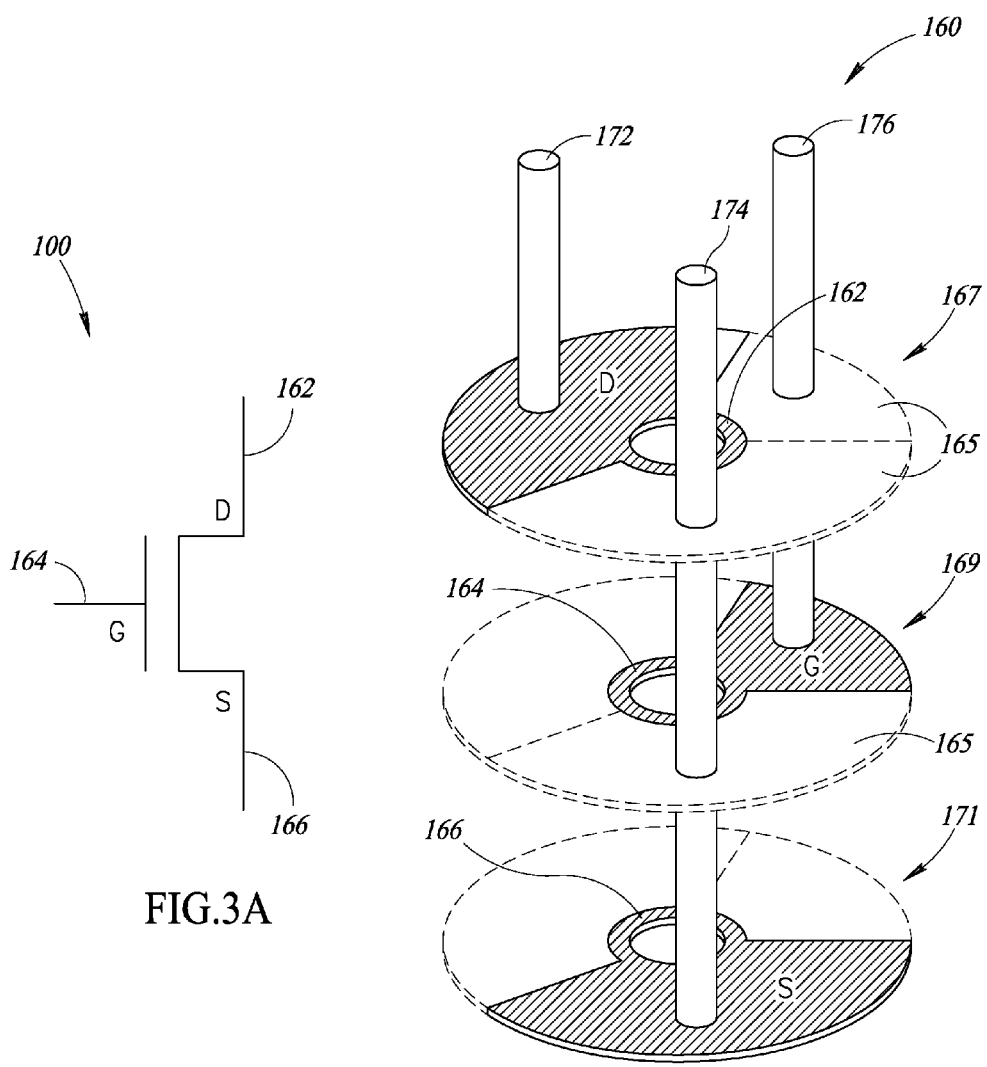
FIG. 3A is a schematic diagram of a MOSFET, indicating an arrangement of source, gate, and drain terminals, as is typically shown in a circuit diagram.
FIG. 3B is a perspective view of a modular interconnect structure having radial contacts as described herein, suitable for use with a vertical GAA implementation of a MOSFET such as the one shown in FIG. 1A, instead of using conventional linear contacts as shown in FIG. 1B.

FIG. 3A shows a CMOS transistor schematic representing a vertical GAA FET and associated connections, according to an embodiment of the present disclosure. Contacts to each of the three transistor terminals include a drain contact 162, a gate contact 164, and a source contact 166.

FIG. 3B shows a modular interconnect structure 160 that is suitable for integration on a silicon substrate having vertical nanowire devices such as the vertical GAA FETs 100n,p according to an embodiment of the present disclosure. In contrast to the conventional contacts shown in FIGS. 1A, 1B, 2A, 2B, the modular interconnect structure 160 features a radial design that complements the cylindrical nanowire geometry of the vertical GAA FETs 100n,p. In the modular interconnect structure 160, the drain, gate, and source connections respectively, take the form of the coaxial annular contacts 162, 164, 166. The coaxial annular contacts 162, 164, 166 are designed to encircle the nanowire at selected heights so as to align with, and couple to, the drain, gate, and source terminals, respectively, of the vertical GAA transistor.

The coaxial annular contacts 162, 164, and 166 then fan out to radial sectors D, G, and S, respectively, that provide conductive horizontal surfaces for receiving corresponding drain, gate, and source vias 172, 174, and 176. The radial sectors S, G, and D can be thought of as conductive domains of respective planar discs that are coaxial with the annular contacts and the cylindrical nanowires. Three such planar discs are shown in FIG. 3B—a top planar disc 167, a middle planar disc 169, and a bottom planar disc 171. The radial angle and position of each conductive domain can be specified by a logic circuit design. For example, the radial sector D is a conductive domain of the top planar disc 167 that also includes non-conductive domains 165. Generally, the number of conductive domains in a given disc will be determined by the number of device terminals that require connections. For example, a three-terminal device such as a transistor will typically be associated with a modular interconnect structure in which each one of the planar discs has three domains.

Vias 172, 174, 176 couple selected ones of the conductive domains of stacked nanowire devices according to a circuit design. The vias are aligned substantially transverse to the surface of the substrate 102. The drain via 172 serves as a connection to the radial sector D of the top planar disc 167. The gate via 176 passes through a non-conductive domain 165 of the top planar disc 167 containing the radial sector D to form an electrical connection with the radial sector G, located in the middle planar disc. The source via 174 passes through non-conductive domains 165 of the top and middle planar discs 167, 169 containing radial sectors D and G, to form an electrical connection with the radial sector S, located in the bottom planar disc 171. Sizes of the metal domains within the planar discs can be adjusted as part of the circuit design so that the domains to be coupled will overlap horizontally. Such an overlap permits short, direct connections to be established by the vias, thus conserving chip real estate. In some embodiments, a single via can couple a small domain on one planar disc to a large domain on another planar disc. In some embodiments, a single conductive domain can intersect with more than one via. Because the modular interconnect structure is radial, increasing the size of a domain is possible without consuming any additional chip area.

Figure 4A:
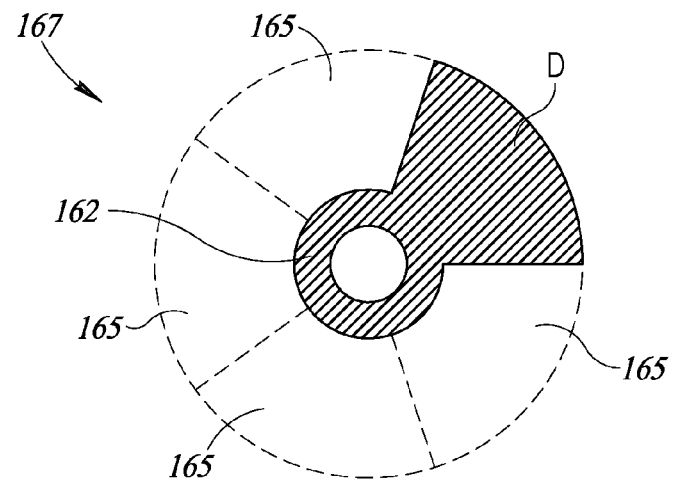
FIG. 4A is a top plan view of a silicon pillar and an annular contact coupled to a conductive domain in the form of a radial sector.

FIGS. 4A, 4B, 5A, 5B, and 5C show individual planar discs that represent individual ones of the top, middle, and bottom planar discs 167, 169, and 171, respectively. FIG. 4A shows an exemplary planar disc, e.g., 167 of the modular interconnect structure 160 according to an embodiment of the present disclosure. An exemplary annular contact, e.g., 162 couples to the drain of a vertical nanowire transistor. The planar disc 167 in FIG. 4A incldes one conductive domain, e.g., the radial sector D, and four non-conductive domains 165. In other embodiments, the planar disc can be divided into a different number of domains, some being conductive and others being non-conductive. The domains may or may not be of similar shape, size, and dimension.

Figure 4B:
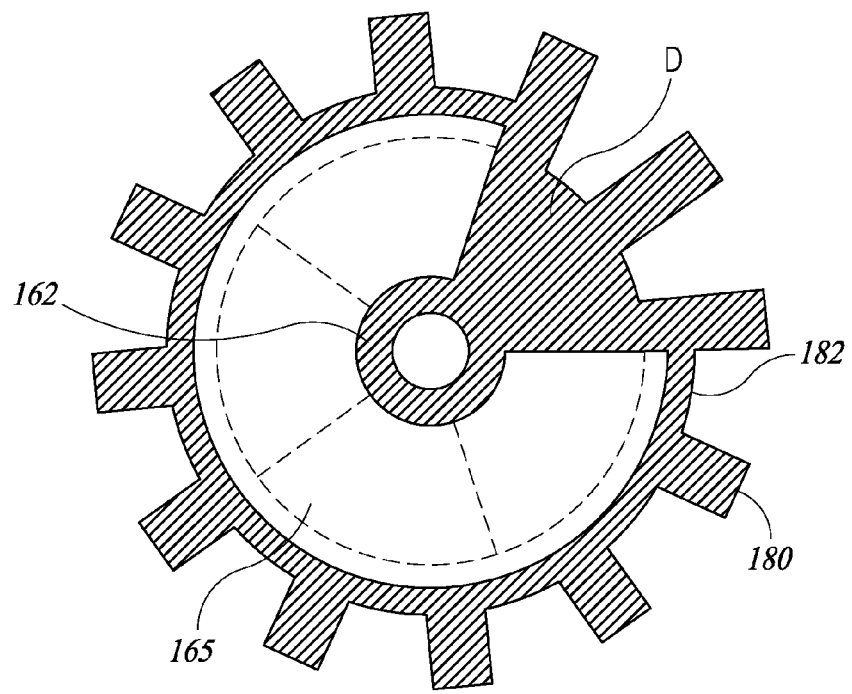
FIG. 4B is a top plan view of a silicon pillar, an annular contact, and various co-planar conductive domain elements, including a radial sector, fan-out extension spokes, and extension pads arranged around a circumference of a conducting ring.

FIG. 4B shows an exemplary planar disc of the modular interconnect structure 160 that further includes fan-out extension spokes having domain extension pads 180 joined by an extension pad coupling ring 182, according to an embodiment of the present disclosure. The domain extension pads 180 serve to increase the size of the conductive domains to encompass a surface area that exceeds the surface area of the radial sector D. A greater surface area can accommodate more via connections. In one embodiment, the domain extension pads 180 are in the shape of radial extension spokes coupled to, and extending radially outward from, the radial sectors. The extension pad coupling ring 182 provides electrical coupling among the domain extension pads 180.

Figure 5A:
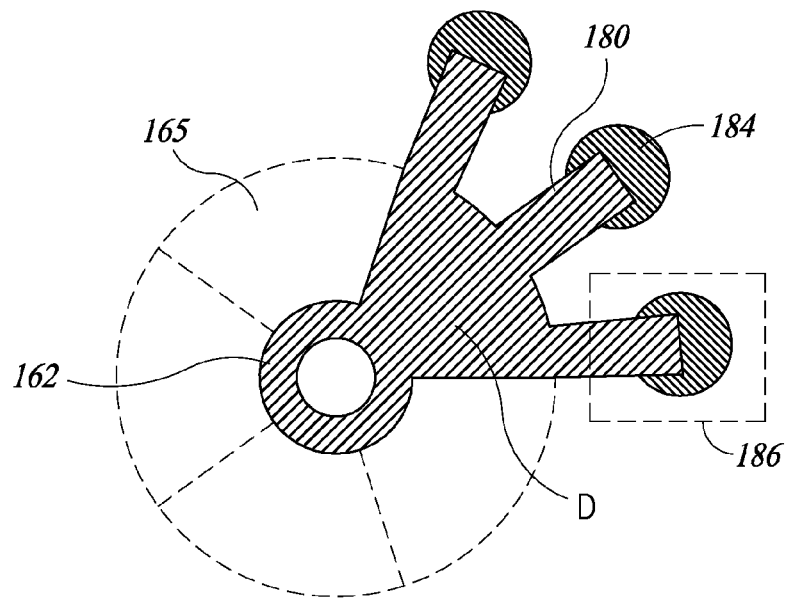
FIG. 5A is a top plan view of a silicon pillar, an annular contact, and various co-planar conductive domain elements, including a radial sector, fan-out extension spokes, and enlarged via landing pads.

FIG. 5A shows an exemplary planar disc, e.g., 167 of the modular interconnect structure 160, according to an embodiment of the present disclosure, in which the planar disc includes three domain extension pads 180. Each domain extension pad 180 is coupled to an enlarged via landing pad 184. Each enlarged via landing pad 184 can couple to a via 172 having a footprint diameter that exceeds a width of the domain extension pads 180.

Figure 5B:
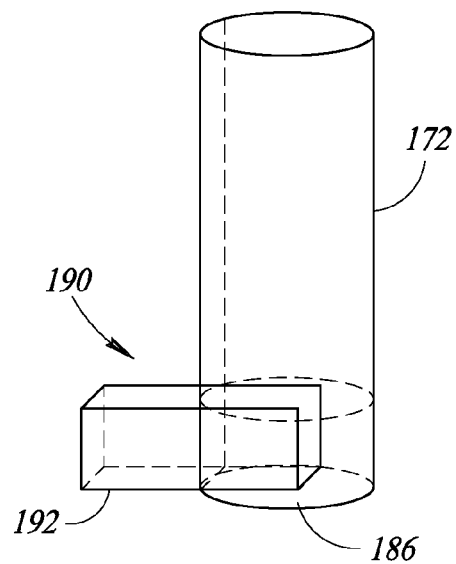
FIG. 5B is a side elevation view of a portion of FIG. 5A, showing a via making contact with an extension spoke at a via landing pad.

FIG. 5B shows a 3-D detailed view of the intersection 190 of an exemplary domain extension pad 180 with an exemplary cylindrical via, e.g., 172. The via 172 has a circular cross-section 186 that makes contact with the enlarged via landing pads 184. The enlarged via landing pad 184 accommodates a via 172 having a larger radius, and therefore a larger contact area, which causes the via resistance to be reduced. Use of the domain extension pads 180 provides additional contact faces 192 of a cube formed by the end of the extension pad 180 to further increase the contact area at the intersection with the via 172 and to further reduce the contact resistance. Four of the six faces of the cube therefore serve as contact faces 192 through which current flows between the extension pad 180 and the via 172.

Figure 5C:
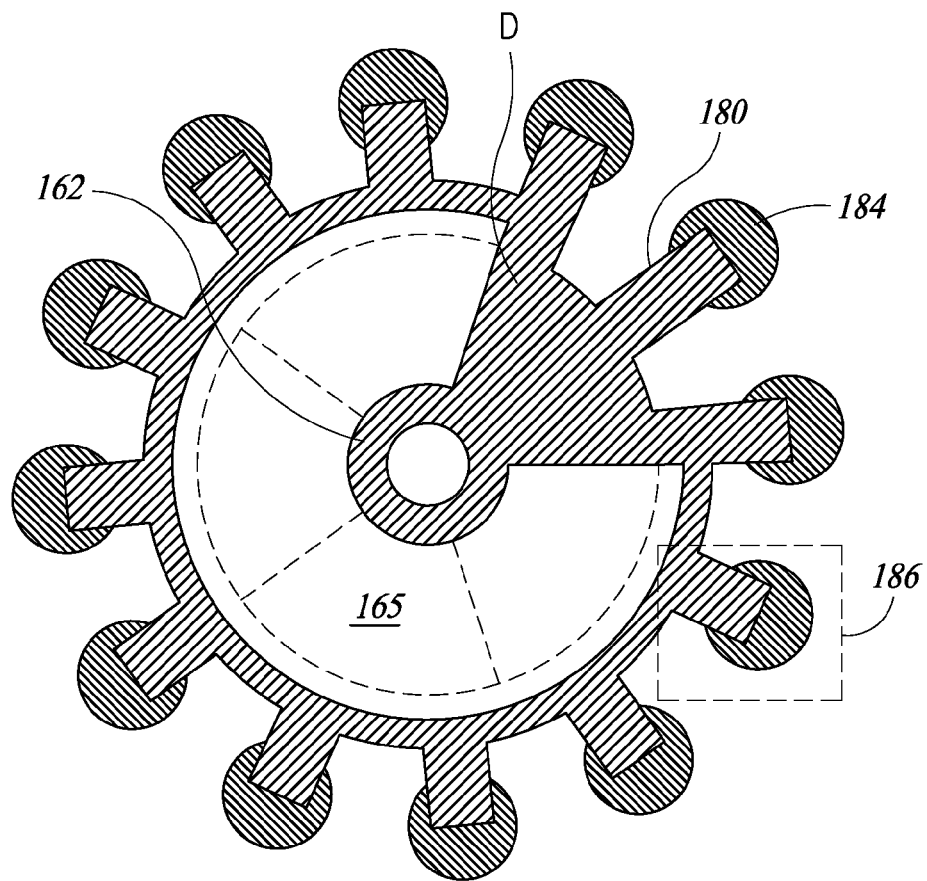
FIG. 5C is a top plan view showing how the modular interconnect structure extends electrical access to the annular contact by providing a plurality of via landing pads.

FIG. 5C shows an exemplary planar disc, e.g., 167 of the modular interconnect structure 160 according to an embodiment of the present disclosure in which twelve domain extension pads 180 are arranged around a circumference of the extension pad coupling ring 182. The extension pad coupling ring 182 is coupled to a radial sector, e.g., D. Each one of the domain extension pads 180 is also coupled to an enlarged via landing pad 184. In the examples shown, the enlarged via landing pads 184 are circular, however, the shape of the enlarged via landing pads 184 is not so limited. The number of enlarged via landing pads 184 increases as the circumference of the planar disc increases, thus permitting more connections with other layers. It is noted that elements of the modular interconnect structure 160, including the annular contacts, radial sectors, domain extension pads, enlarged via landing pads, and the vias are all made of a conductive material, e.g., one or more metals such as titanium (Ti), titanium nitride (TiN), tungsten (W), copper (Cu), aluminum (Al), silver (Ag), gold (Au), platinum (Pt), tantalum (Ta), nickel (Ni), cobalt (Co), chromium (Cr), and alloys thereof. In particular, metals or alloys that can withstand high temperatures associated with epitaxial processing may be advantageous. Such materials may include copper-tungsten (Cu—W) alloys, for example, that have melting points well above 600 C.

Figure 6:
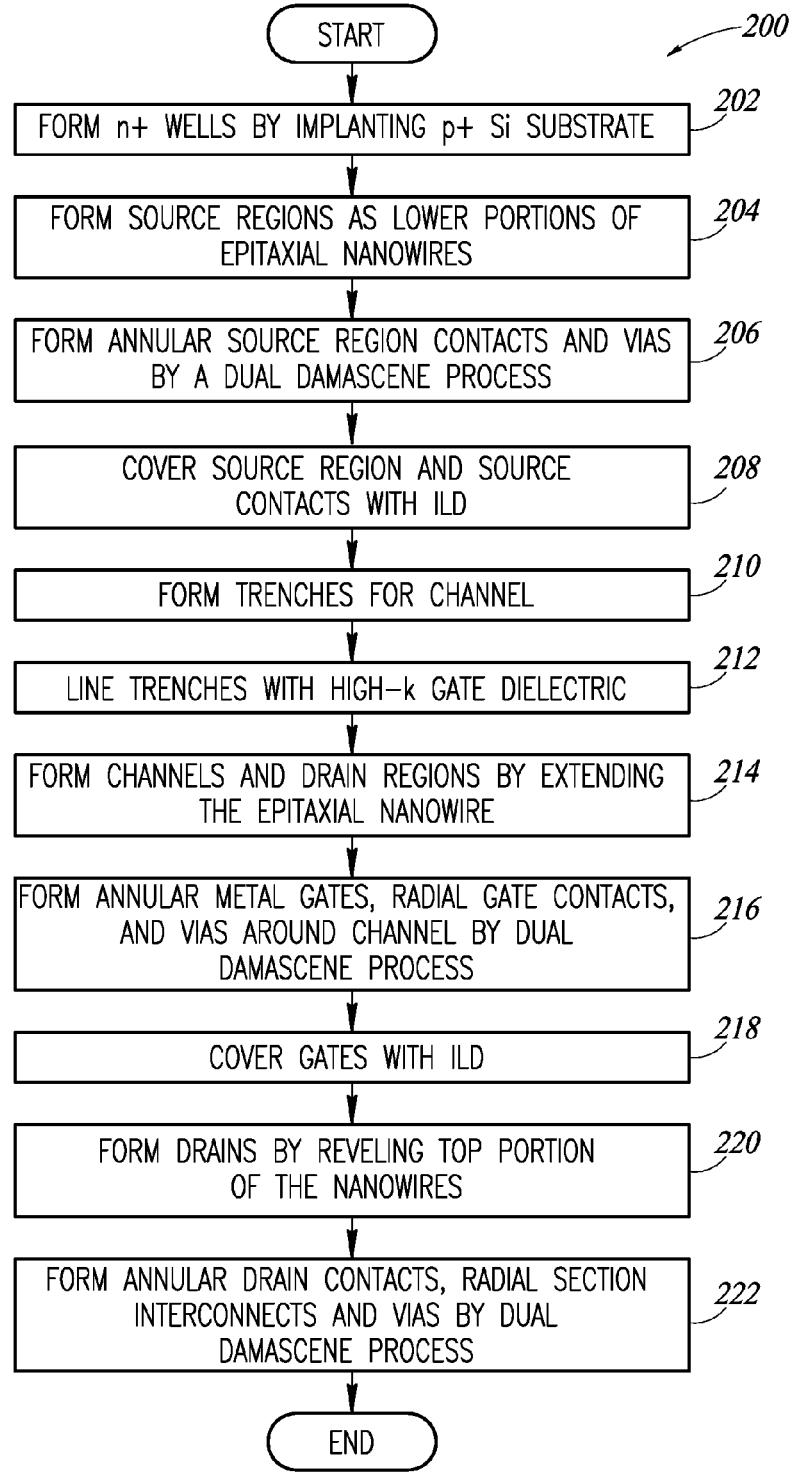
FIG. 6 is a flow diagram showing a sequence of steps in a method of fabricating a vertical GAA transistor and the modular interconnect structure according to an embodiment as described herein.
Figure 7A:
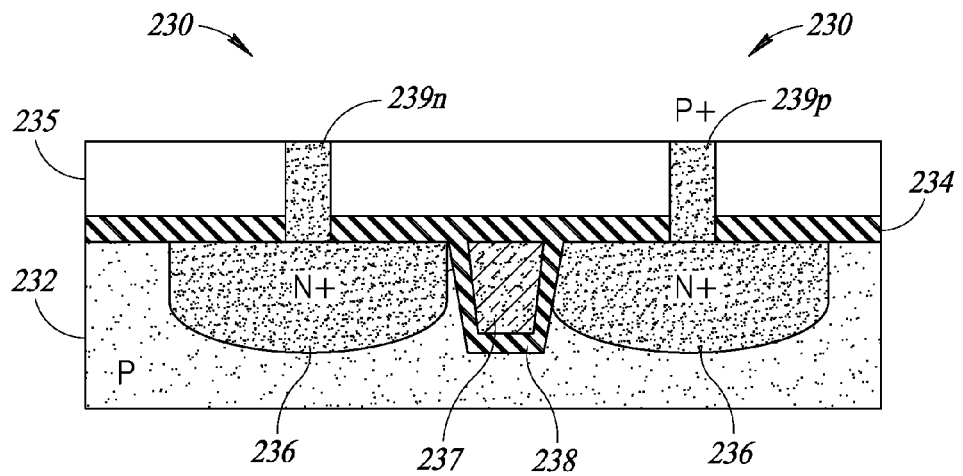
FIGS. 7A-9C are cross-sectional views of a pair of vertical GAA FETs during fabrication according to the sequence shown in FIG. 6.

FIG. 6 is a flow diagram showing a sequence of steps in an exemplary method 200 of fabricating a pair of adjacent epitaxial nanowire FETs 230 shown in FIG. 7A that are integrated with the modular interconnect structures 160, according to an embodiment of the present disclosure. The pair of epitaxial nanowire FETs 230 includes a p-FET and an n-FET, each having stacked source, gate, and drain terminals in the form of epitaxial semiconducting pillars extending out from a substrate 232 in a direction transverse to a surface of the substrate 232. Unlike conventional interconnect structures, the modular interconnect structure 160 is formed at the same time as the transistor, instead of being formed after completion of the transistor. Formation of the interconnect structure and the transistor together can be done using fewer processing steps, thereby providing significant cost savings.

FIG. 7A shows the silicon substrate 232, an insulator 234, a first inter-layer dielectric (ILD) 235, N-wells 236, an isolation region 237 having a liner 238, and source regions 239*n,p*.

At 202, the N-wells 236 are formed by ion implantation into a p-doped silicon substrate 232. For example, the N-wells 236 are formed by implanting negative ions such as phosphorous or arsenic, to a concentration in the range of about 1.0E16-3.0E20 cm$^{-3}$, with a target concentration of 2.0E19 cm$^{-3}$. The isolation region 237 provides electrical isolation between neighboring devices. The isolation region 237 is made in the usual way by forming a trench in the silicon substrate 232, lining the trench with the liner 238, made of silicon nitride (SiN) for example, and filling the rest of the trench with an oxide, e.g., SiO$_2$. The insulator 234 is a layer of SiN or silicon oxynitride, SiO$_x$N$_y$, having a thickness in the range of about 2-100 nm.

At 204, source regions 239$n,p$ are formed as lower portions of a pair of adjacent epitaxial nanowire transistors. The first ILD 235 is desirably formed of a low-k dielectric material, e.g., a material known in the art as OMCATS, having a dielectric constant in the range of about 2.4-2.8. The first ILD 235 is deposited to a thickness in the range of about 2-500 nm. The source regions 239$n,p$ are formed by etching trenches in the first ILD 235. The trenches have critical dimensions (CDs) in the range of about 2-300 nm, and growing doped epitaxial silicon in the trenches. P-doped source regions 239$p$ desirably have a concentration in the range of about 1.0E16-5.0E20 cm$^{-3}$, with a target concentration of about 5.0E19 cm$^{-3}$.

Figure 7B:
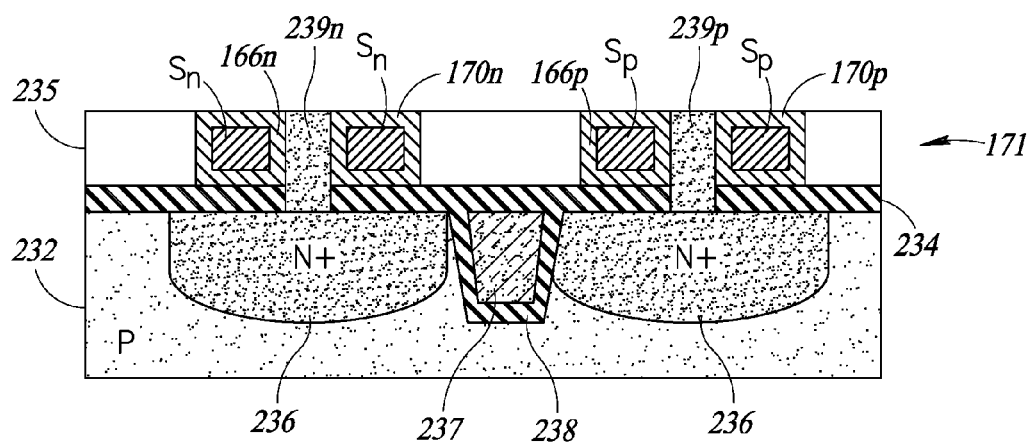

At 206, the annular source region contacts 166 and radial sectors of the bottom planar disc 171 are formed by a dual damascene process, as shown in FIG. 7B. The dual damascene process can be either a via-first process or a trench-first process. First, annular trenches having radii in the range of about 8-400 nm are formed by etching through the first ILD 235 surrounding the nanowire source regions 239$n,p$. Metal is then deposited in the annular trenches in the usual way to form the bottom planar disc 171. The metal deposition step includes a silicidation step, deposition of a metal liner to form the source region annular contacts 166$n,p$, and deposition of a bulk metal to form radial sectors $S_{n,p}$. A metal cap is then selectively deposited on top of the bulk metal. In one embodiment, the metal liner and the metal cap are made of a Ti/TiN bi-layer and the bulk metal is tungsten (W). Following metal deposition, a chemical-mechanical planarization (CMP) step can be used to polish the deposited metal and stop on the first ILD 235.

Figure 8A:
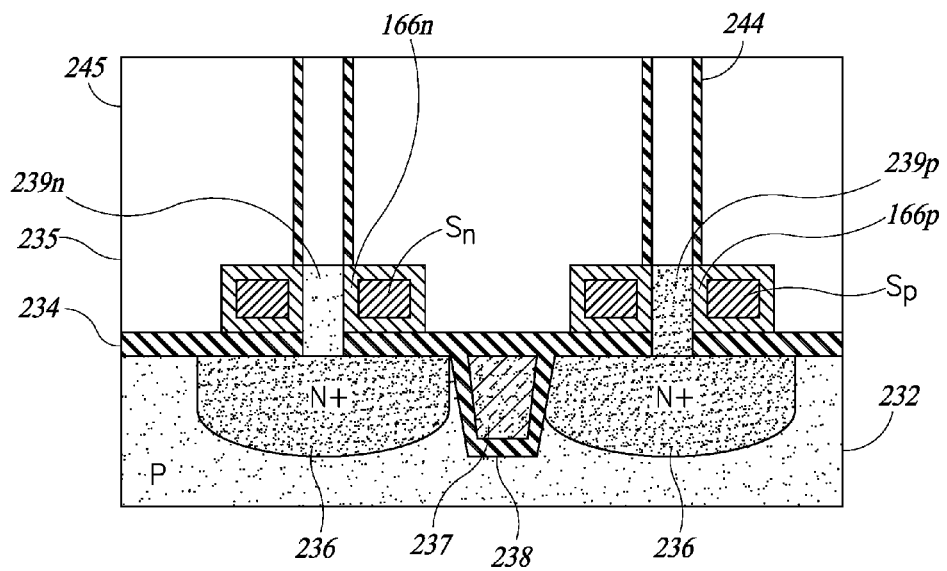

At 208, the source regions 239$n,p$, the annular source region contacts 166$n,p$, and the radial sectors $S_{n,p}$ are covered with a second ILD 245, as shown in FIG. 8A. The second ILD 245 and the processes used to form and planarize the second ILD 245 are similar to those of the first ILD 235, as described above.

At 210, channel region trenches are etched into the second ILD 245, as shown in FIG. 8A.

At 212, the channel region trenches are lined with a high-k gate dielectric 244. The high-k gate dielectric 244 may be, for example, HfO$_2$, which can be deposited using a plasma vapor deposition (PVD) process, as is well known in the art. The high-k gate dielectric 244 desirably has a thickness in the range of about 2-20 nm.

Figure 8B:
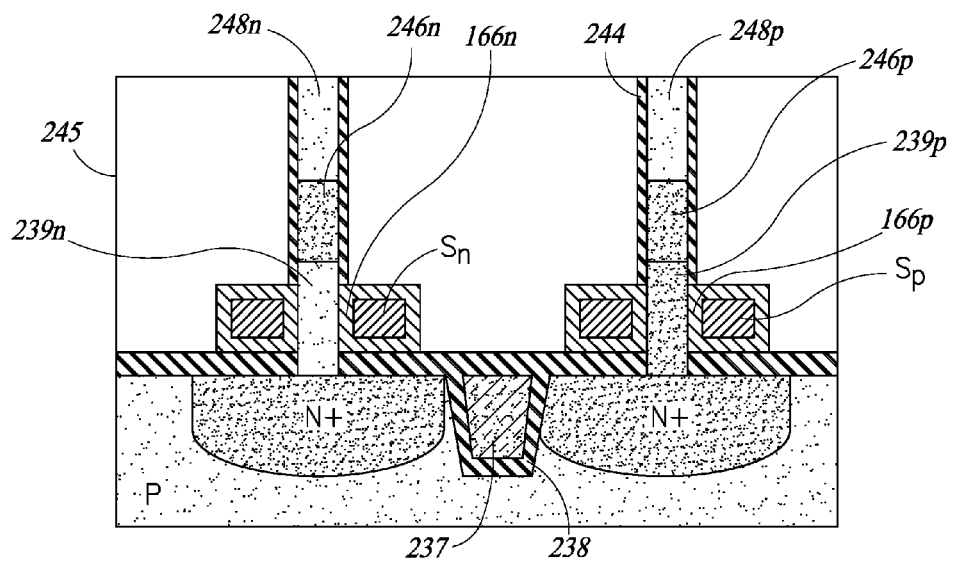

At 214, channels 246$n,p$ and drain regions 248$n,p$ are formed by extending the epitaxial nanowires, as shown in FIG. 8B. The channel 246$n$ is a three-layer epitaxially grown silicon film in which bottom and top layers of epitaxial silicon may be doped in-situ with negative ions to enhance carrier mobility within the channel region of the n-FET, made of epitaxial intrinsic Si (i-Si). The channel 246$p$ is made of a three-layer epitaxially grown silicon germanium (SiGe) film in which bottom and top layers of epitaxial SiGe may be doped in-situ with positive ions to enhance carrier mobility within the channel region of the p-FET. P-doped drain regions 248$p$ desirably have a concentration in the range of about 1.0E16-5.0E20 cm$^{-3}$, with a target concentration of about 5.0E19 cm$^{-3}$. In FIG. 8B, the nanowires and the bottom planar discs 171 are complete.

Figure 9A:
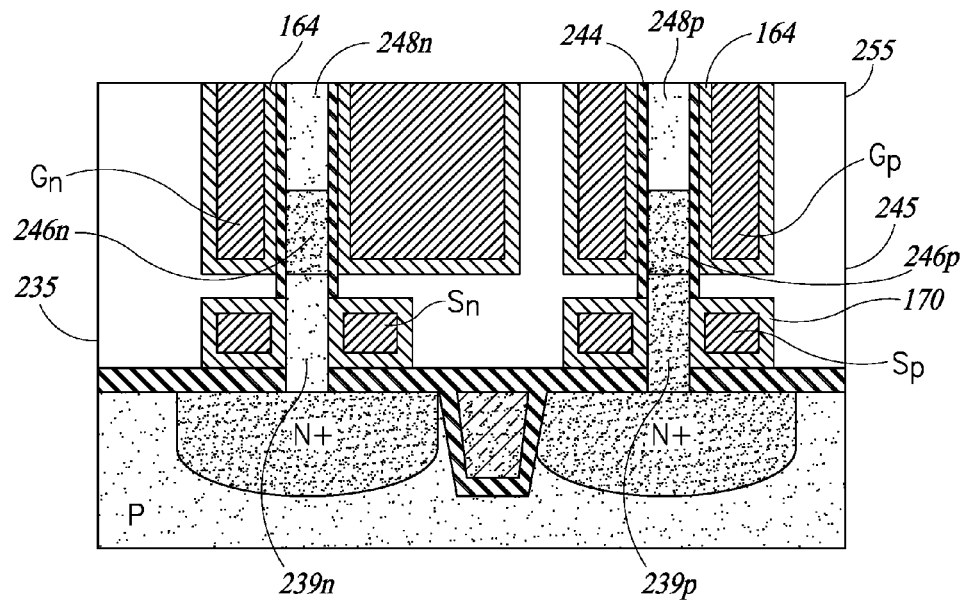
Figure 9B:
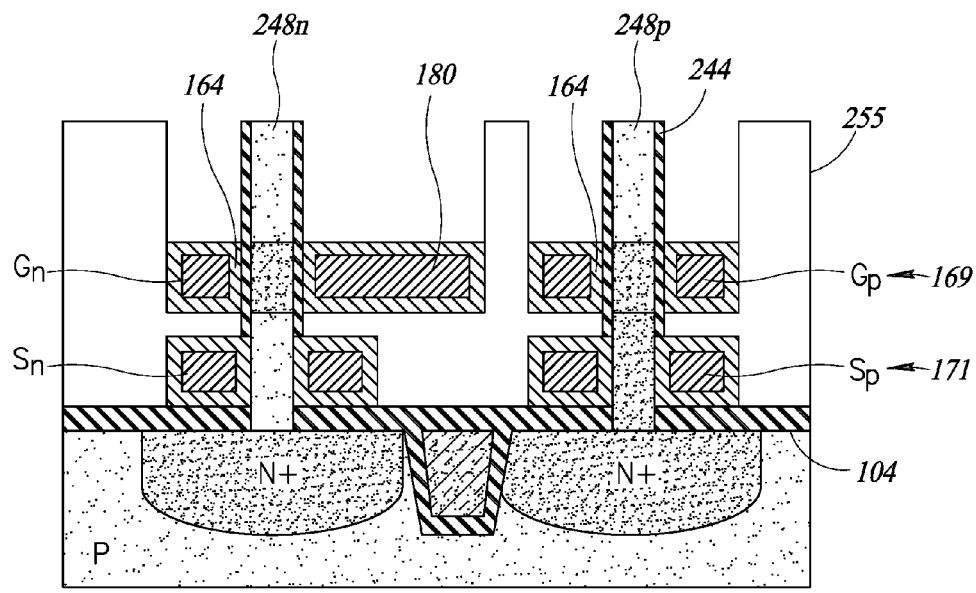

At 216, the annular metal gate contacts 164 and radial sectors $G_{n,p}$ of the middle planar discs are formed by a dual damascene process, as shown in FIGS. 9A and 9B. First, gate trenches and via openings are etched into the second ILD 245. Then, a metal liner and a bulk metal are deposited into both the gate trenches and the via openings. The metal layer forms the metal gates 164, radial sectors G to access the metal gates 164, and vias. An example of a domain extension pad 180 is shown in FIG. 9B.

At 218, the channels 246$n,p$, metal gates 164, and radial sectors $G_{n,p}$ are covered with a third ILD 255, as shown in FIGS. 9A and 9B. The third ILD 255 and the processes used to form and planarize the third ILD 255 are similar to those of the first and second ILDs 235 and 245, respectively, as described above. With the third ILD 255 in place, the metal gate contacts are recessed using a process that consumes metal selectively relative to the ILD 255. Following the metal recess, a metal cap is selectively deposited on the top surface of the bulk metal. Finally, the trenches on top of the completed metal gates and contacts are filled with ILD and planarized.

At 220, drain regions 248$n,p$ are formed as upper portions of the pair of adjacent epitaxial nanowire transistors 230, as shown in FIGS. 9A and 9B. First, drain trenches are etched in the ILD 255. The drain trenches desirably have critical dimensions (CDs) in the range of about 2-300 nm that define dimensions of the annular drain contacts 162$n,p$ and radial sectors $D_{n,p}$. At the same time, the dielectric 244 lining the top portions of the pillars is removed down to the bottoms of the drain trenches, thereby revealing the already formed drain regions 248$n,p$. The etching step can be performed with advanced process control (APC), in which the depth of the trenches is timed in accordance with in-line measurements of devices that have been processed. In FIG. 9B, the bottom and middle planar discs 171, 169 are complete.

Figure 9C:
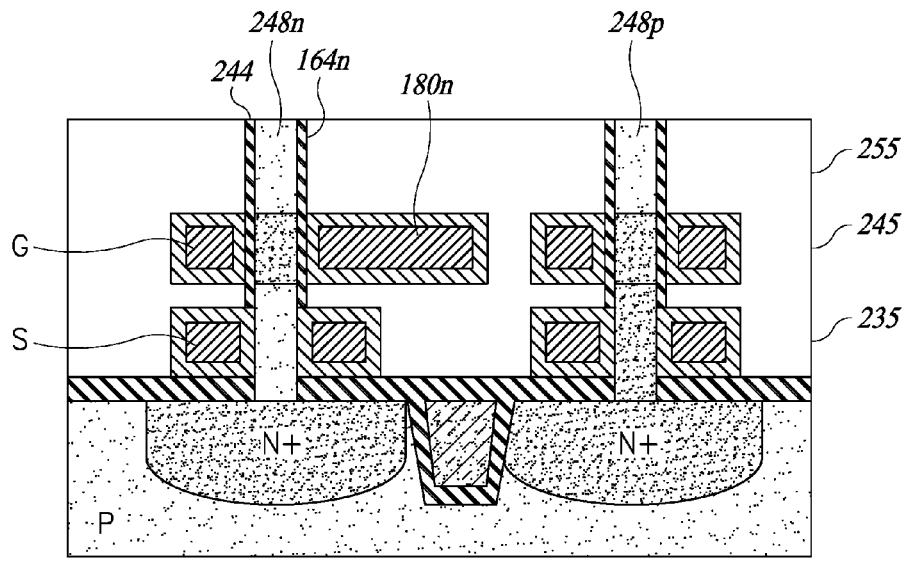
Figure 10:
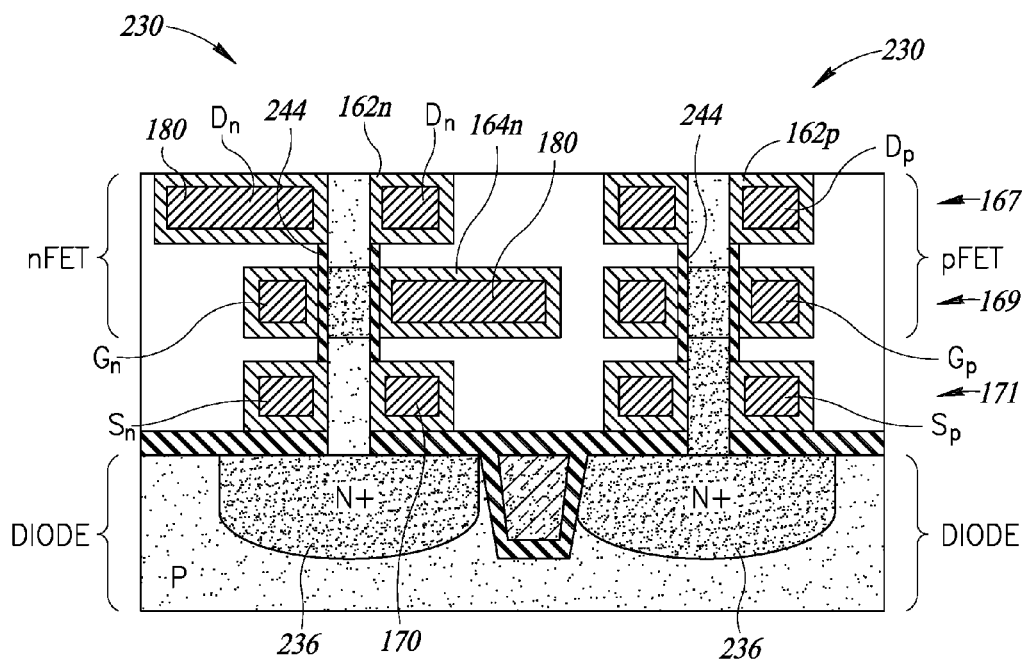
FIG. 10 is a cross-sectional view of completed nFET and pFET vertical GAA devices equipped with ESD-type diodes, annular contacts (nFET and pFET), and radial sector conductive domains (shown only for nFET).

At 222, annular drain contacts 162$n,p$ and radial sectors $D_{n,p}$ are formed by depositing a metal liner and a bulk metal in the drain trenches, as shown in FIGS. 9B, 9C, and 10. Following the metal deposition, a selective deposition is performed to fabricate the metal caps shown in FIG. 10.

FIG. 10 shows a completed pair of p-FET and n-FET nanowire transistors 230, according to an embodiment of the present disclosure. The nanowire transistors 230 are integrated with radial interconnect structures 160 including the top, middle, and bottom planar discs 167, 169, 171, and exemplary domain extension pads 180. The N-wells 236 and the p-doped substrate 232 form anti-leakage (AL) diodes underneath the GAA nanowire FETs 230. The anti-leakage diodes help to prevent current leakage from the transistors 230 into the substrate 232.

Figures 11A, 11B:
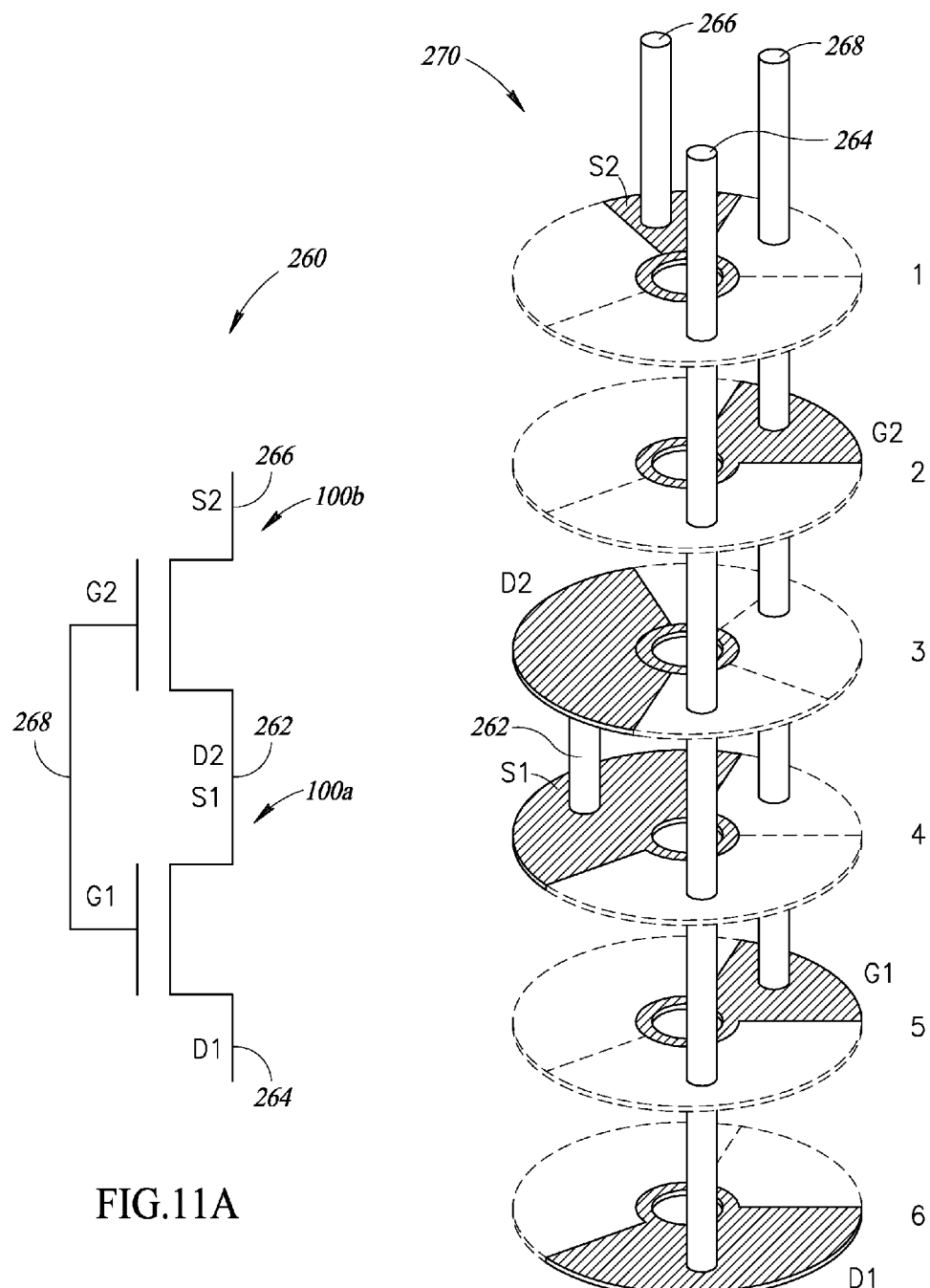
FIG. 11A is a schematic diagram of two MOSFET transistors coupled in series.
FIG. 11B is a perspective view of a modular interconnect structure suitable for electrically coupling two stacked vertical GAA devices in series.

FIG. 11A shows a schematic diagram of MOSFET circuit elements 260 representing two stacked vertical GAA FETs 100$a$, 100$b$ coupled in a series configuration. The MOSFET circuit elements 260 include contacts to each of the terminals of the FETs 100$a$, 100$b$: a drain contact 264, a source contact 266, a connection 262 between the source of transistor 100$a$ and the drain of transistor 100$b$, and a gate connection 268 coupling the gate of transistor 100$a$ to the gate of transistor 100$b$.

FIG. 11B shows a double-stacked single pillar modular interconnect structure 270, according to an embodiment of the present disclosure. The interconnect structure 270 is suitable for coupling the stacked vertical GAA FETs 100a, 100b in a series configuration. The interconnect structure 270 implements the connections 262, 268 and the connections 264 and 266 as vias coupling selected sectors of six planar discs labeled 1-6. For example, the contact 266 is implemented as a source via coupled to the radial sector S2 in planar disc 1 of the double stacked single pillar modular interconnect structure 270; the gate connection 268 is implemented as a via that couples the radial sector G2 in planar disc 2 to the radial sector G1 in planar disc 5; the connection 264 is implemented as a drain via coupled to the radial sector D1 in planar disc 6; and the connection 262 is implemented as a short via that couples the radial sector D2 in planar disc 3 to the radial sector S1 in planar disc 4.

Figures 12A, 12B:
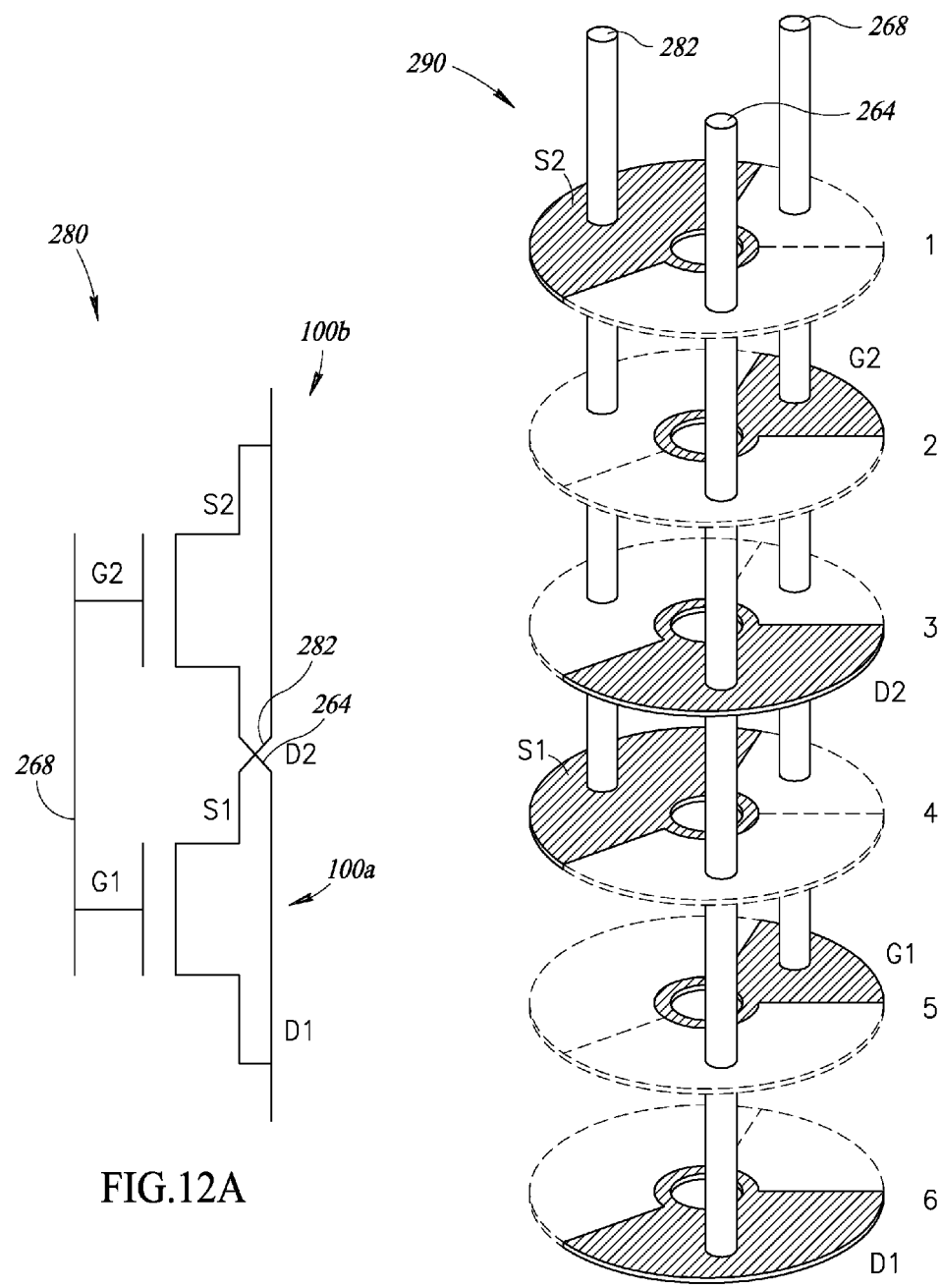
FIG. 12A is a schematic diagram of two MOSFET transistors coupled in parallel.
FIG. 12B is a perspective view of the modular interconnect structure described herein configured to electrically couple two stacked vertical GAA devices in parallel.

FIG. 12A shows a circuit schematic diagram representing the two stacked vertical GAA FETs 100a, 100b coupled in a parallel configuration 280, according to an embodiment of the present disclosure. The parallel configuration 280 includes contacts to each of the transistor terminals: a source connection 282 between the source terminal of transistor 100a and the source terminal of transistor 100b; a drain connection 284 between the drain of transistor 100a and the drain of transistor 100b; and a gate connection 268 coupling the gate terminal of transistor 100a to the gate terminal of transistor 100b.

FIG. 12B shows a double-stacked single pillar modular interconnect structure 290, according to one embodiment. The double stacked single pillar modular interconnect structure 290 is suitable for coupling the stacked vertical GAA FETs 100a, 100b in a parallel configuration. The double stacked single pillar modular interconnect structure 290 implements the connections 264, 268, 282 as vias coupling selected sectors of six planar discs. Each planar disc is divided into three radial sectors. In particular, the gate connection 268 is implemented as a via that couples the radial sector G2 in planar disc 2 to the radial sector G1 in planar disc 4; the connection 282 is implemented as a via that couples the radial sector S2 in planar disc 1 to the radial sector S1 in planar disc 4; and the connection 264 is implemented as a via that couples the radial sector D2 in planar disc 3 to the radial sector D1 in planar disc 6.

Figures 13A, 13B, 13C:
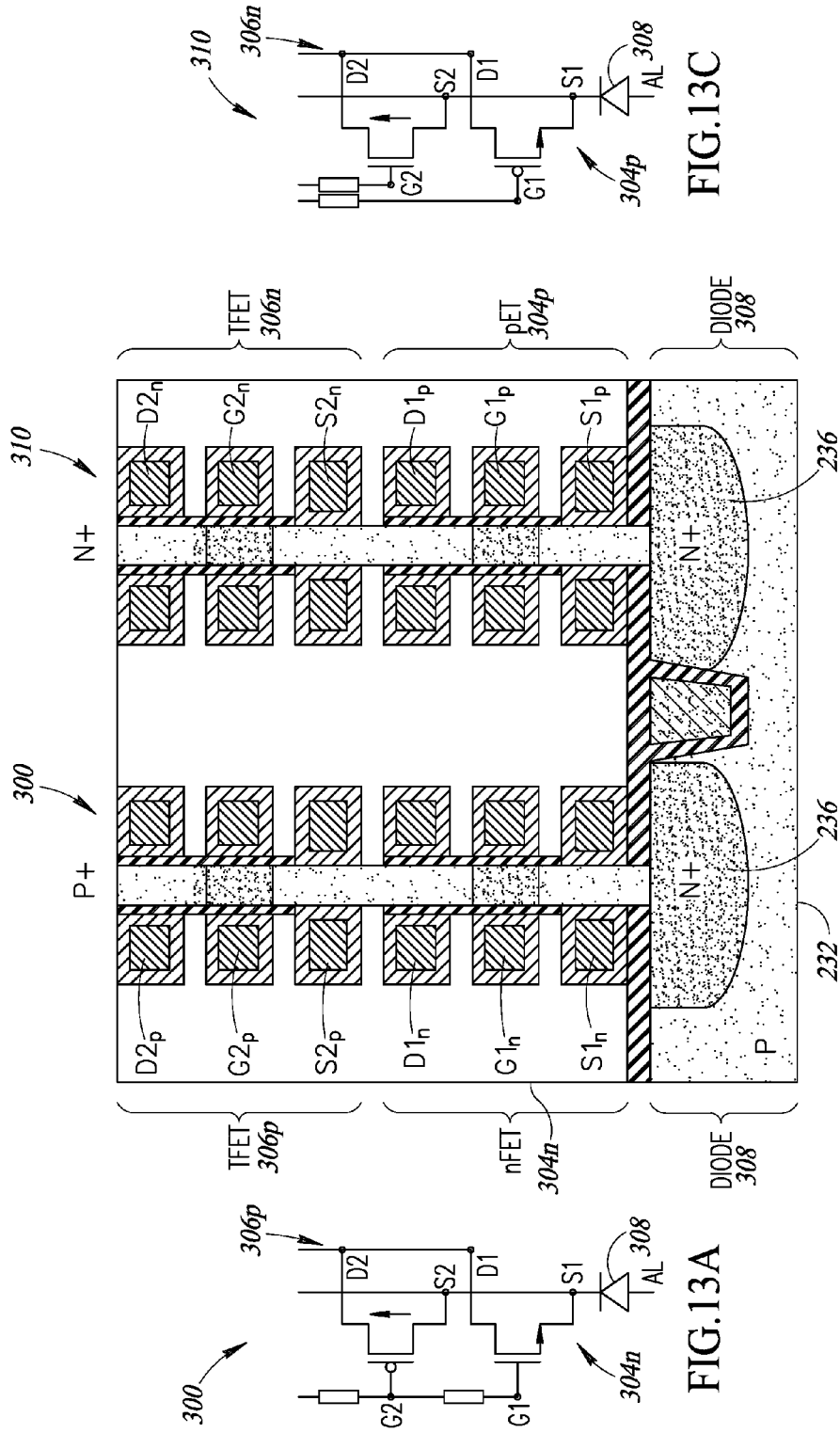
FIGS. 13A and 14A each show a schematic diagram of an nFET and a TFET coupled in series and protected by an anti-leakage type diode.
FIG. 13B is a cross-sectional view of a stacked vertical GAA TFET, nFET, and diode and associated annular contacts (left); and a stacked vertical GAA TFET, pFET, and diode and associated annular contacts (right).
FIGS. 13C and 14C show a schematic diagrams of a pFET and a TFET coupled in parallel and protected by an anti-leakage type diode.

FIG. 13A shows a circuit schematic diagram representing an n-FET 304n and a p-type TFET 306p, coupled in a first hybrid CMOS/TFET parallel configuration 300, according to an embodiment of the present disclosure. The first hybrid CMOS/TFET parallel configuration 300 is protected by an anti-leakage (AL) diode 308. FIG. 13C shows a circuit schematic diagram representing a p-FET 304p and an n-type TFET 306n coupled in a second hybrid CMOS/TFET parallel configuration 310, according to an embodiment of the present disclosure. The second hybrid CMOS/TFET parallel configuration 310 is protected by an anti-leakage diode 308.

Figures 14A, 14B:
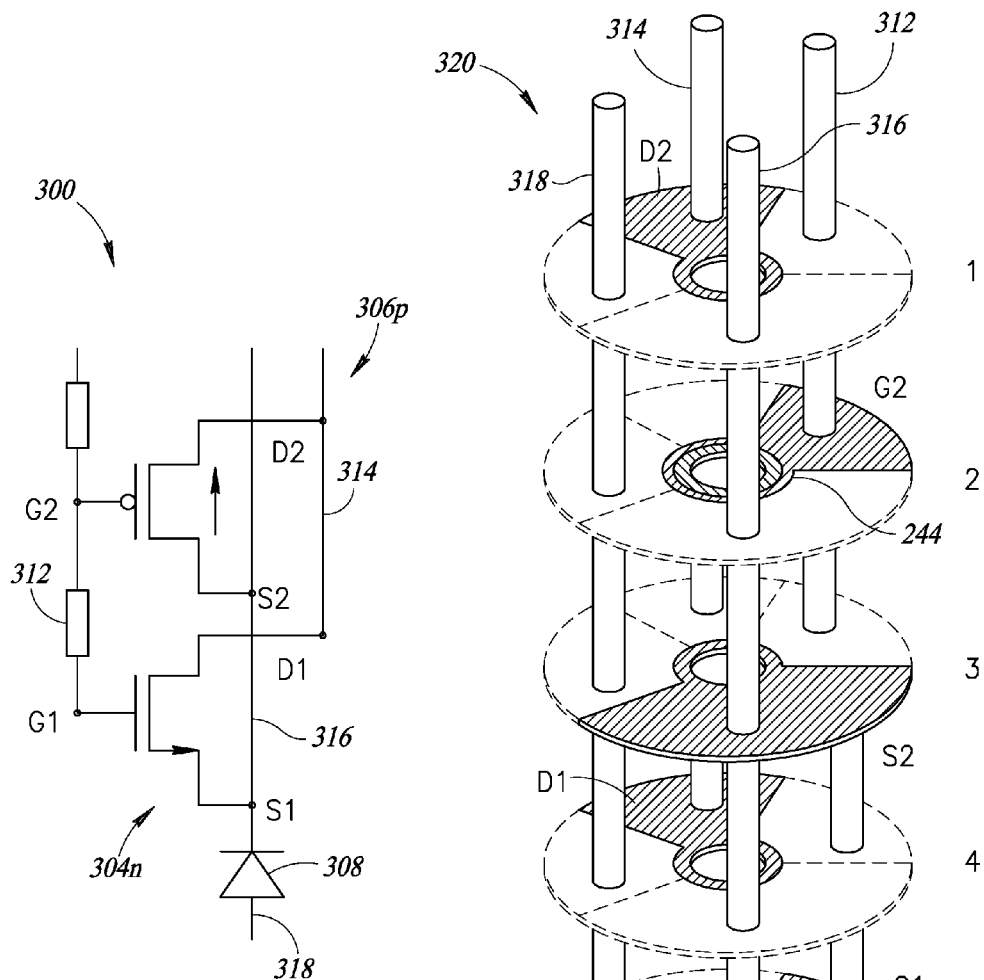
FIG. 14B is a perspective view of the modular interconnect structure described herein configured to couple stacked vertical GAA TFET and nFET devices in series.
Figures 14C, 14D:
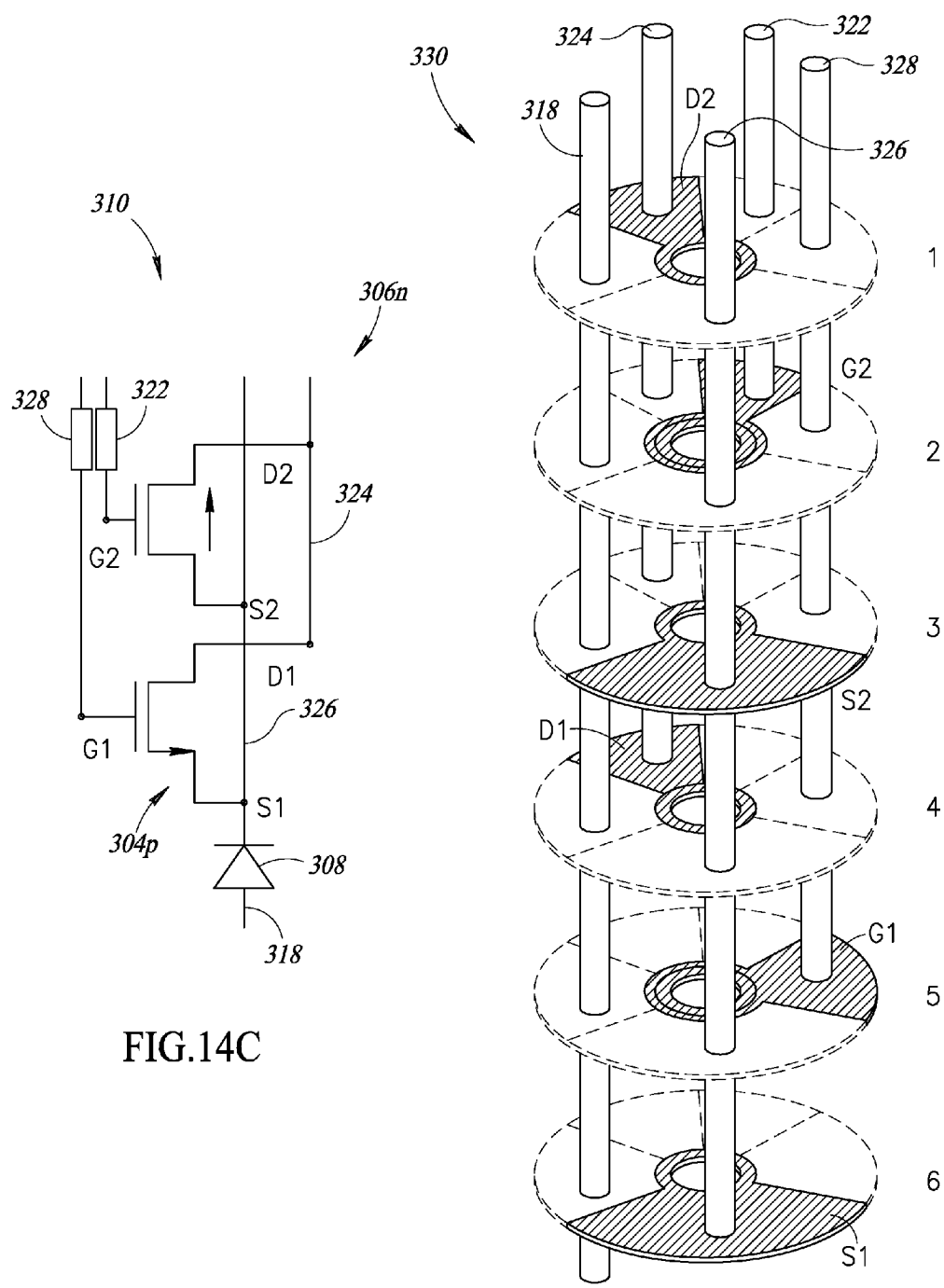
FIG. 14D is a perspective view of the modular interconnect structure described herein configured to electrically couple stacked vertical GAA TFET and pFET devices in parallel.

FIG. 13B shows the first and second hybrid CMOS/TFET parallel configurations 300, 310 in cross-section. The first and second hybrid CMOS/TFET parallel configurations 300, 310 are implemented as double stacks of GAA nanowire transistors with modular interconnect structures 320, 330, respectively, as shown in FIGS. 14B and 14D. The p-FET 304p has a SiGe channel, and the other three devices have channels made of intrinsic silicon. The doped source and drain terminals of the TFET devices 306n,p have opposite polarities. The N-wells 236 and the p-doped substrate 232 form the anti-leakage diodes 308 underneath the GAA FETs. FIGS. 13A, 13C are reproduced as FIGS. 14A, 14C, respectively.

FIG. 14B shows a double-stacked single pillar modular interconnect structure 320, according to an embodiment of the present disclosure. The modular interconnect structure 320 is suitable for coupling the CMOS and TFET devices in a hybrid series configuration as shown in FIG. 14A. The modular interconnect structure 320 implements gate, drain, and source connections 312, 314, 316 respectively, between the n-FET 304n and the p-type TFET 306p as vias coupling selected sectors of six planar discs 1-6. Each planar disc is divided into four radial sectors to provide contacts to both the transistors and to the anti-leakage diode 308. The gate connection 312 is implemented as a via that couples the radial sector G2 in planar disc 2 to the radial sector G1 in planar disc 5; the connection 314 is implemented as a via that couples the radial sector D2 in planar disc 1 to the radial sector D1 in planar disc 4; and the connection 316 is implemented as a via that couples the radial sector S2 in planar disc 3 to the radial sector S1 in planar disc 6. A connection 318 provides access to the anti-leakage diode 308.

FIG. 14D shows a double modular interconnect structure 330, according to an embodiment of the present disclosure. The double modular interconnect structure 330 is suitable for coupling the CMOS and TFET devices in a hybrid parallel configuration as shown in FIG. 14C. The double modular interconnect structure 330 implements drain and source connections 324, 326 between the p-FET 304p and the n-type TFET 306n as vias coupling selected sectors of six planar discs. Each planar disc is divided into four radial sectors to provide contacts to both the transistors and the connection 318 to the anti-leakage diode 308. The gate contact 322 is implemented as a via that couples to the radial sector G2 in planar disc 2. The gate contact 328 is implemented as a via that couples to the radial sector G1 in planar disc 5; the drain connection 324 is implemented as a via that couples the radial sector D2 in planar disc 1 to the radial sector D1 in planar disc 4; and the source connection 336 is implemented as a via that couples the radial sector S2 in planar disc 3 to the radial sector S1 in planar disc 6. A connection 318 provides access to the anti-leakage diode 308.

FIG. 15A shows a circuit schematic diagram representing the n-FET 304n and the p-type TFET 306p, coupled in a MOSFET/TFET parallel configuration 340, according to one embodiment. FIG. 15C shows a circuit schematic diagram representing the p-FET 304p and the n-type TFET 306n coupled in a MOSFET/TFET parallel configuration 350. Reliability of the MOSFET/TFET parallel configurations 340, 350 can be enhanced by coupling an additional electrostatic discharge diode (ESD) 348 to the GAA devices.

Figure 16C:
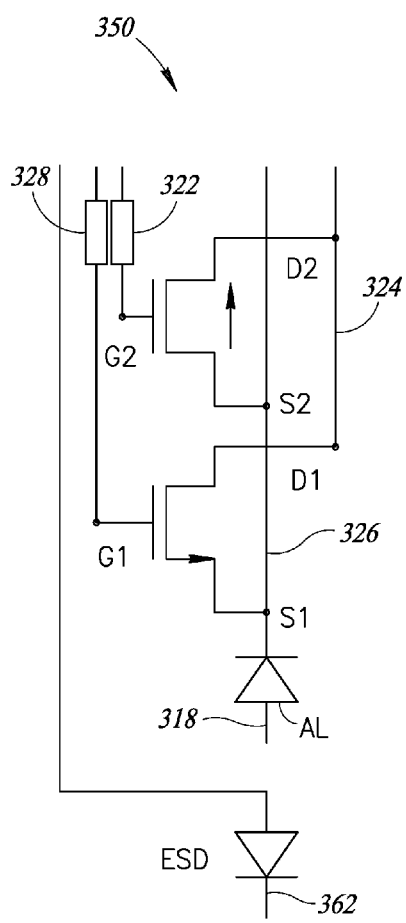
Figure 16D:
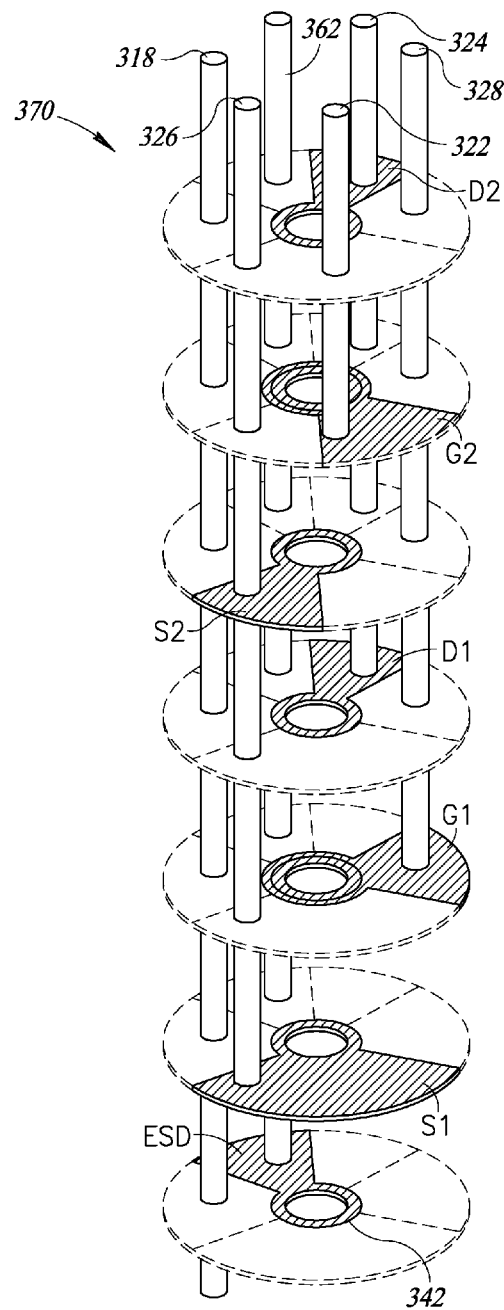

FIG. 15B shows the MOSFET/TFET parallel configurations 340, 350 in cross-section, according to an embodiment of the present disclosure. The MOSFET/TFET parallel configurations 340, 350 are implemented as two pillars, each pillar including double-stacked GAA nanowire transistors having double modular interconnect structures 360, 370, respectively, as shown in FIGS. 16B and 16D. The MOSFET/TFET parallel configurations 340, 350 are fabricated using a method similar to the method 200 used to fabricate the nanowire FETs 230 described above and shown in FIGS. 7A-10. The ESD 348 is implemented as an additional p-doped region of the nanowire, disposed between the insulating layer 234 and the source S1.

FIG. 16B shows a double modular interconnect structure 360 that implements gate, drain, and source connections 312, 314, 316, respectively, as shown in FIG. 13A, between the n-FET 304n and the p-type TFET 306p and the ESD diode 348 as vias coupling selected sectors of seven planar discs 1-7. Each planar disc is divided into five radial sectors to provide contacts to the transistors, the anti-leakage diode 308, and the ESD 348. The gate, source, and drain connections 312, 314, 316 are implemented as described above with reference to FIG. 14B. A contact 318 provides access to the anti-leakage diode 308. A contact 362 provides access to the ESD 348.

FIG. 16D shows a double modular interconnect structure 370, according to an embodiment of the present disclosure. The double modular interconnect structure 370 implements drain and source connections 324, 326 between the p-FET 304p and the n-type TFET 306n as vias coupling selected sectors of seven planar discs, one for each of the transistor terminals, and the ESD 348 as shown in FIG. 16C. Each planar disc is divided into five radial sectors to provide contacts to the transistors (3), the anti-leakage diode 308 (1), and the ESD 348 (1). The source, and drain connections 324, 326 and the gate contacts 322, 328 are implemented as described above with reference to FIG. 14D. A connection 318 provides access to the anti-leakage diode 308. A connection 362 provides access to the ESD 348.

The double modular interconnect structures 270, 290, 320, 330, 360, 370 overcome previous impediments to stacking vertical transistors. Using such an interconnect structure, all of the device terminals in the stack are accessible from the front side of the chip, regardless of their distance below the front surface. Meanwhile, the chip footprint remains unchanged. Furthermore, the amount of metal needed to build the modular interconnect structures described herein is considerably less than it would be otherwise, using a conventional, e.g., linear, interconnect structure.

Figure 17:
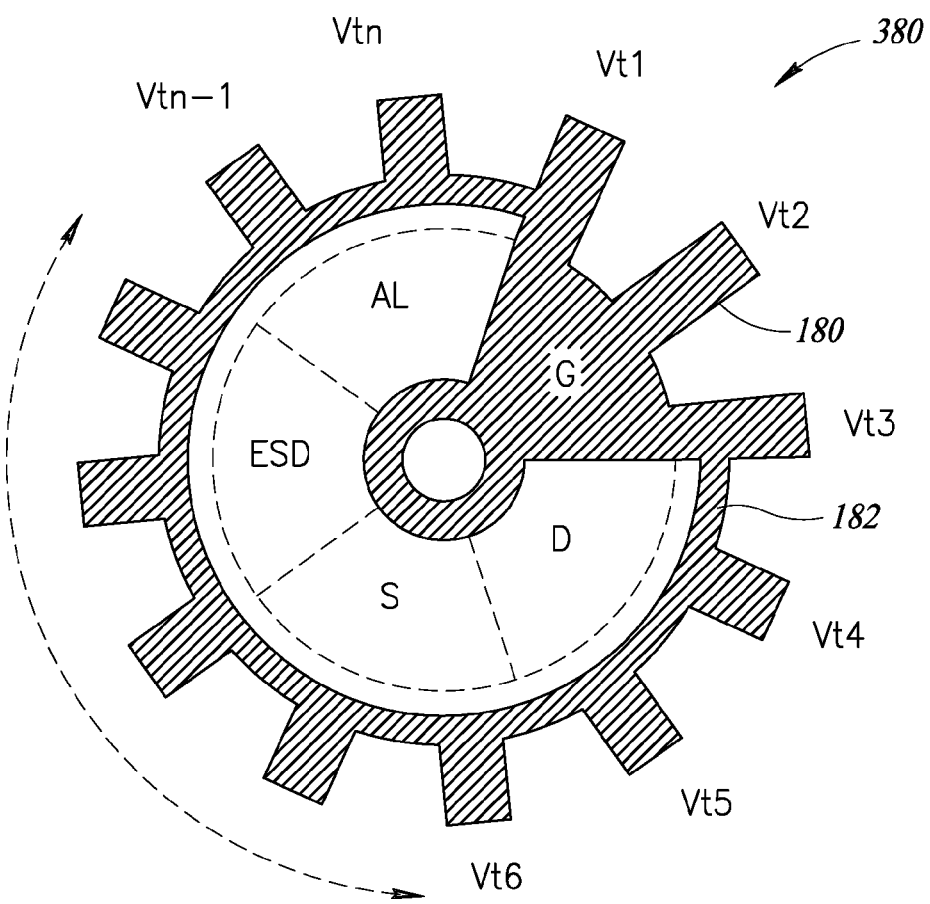
FIG. 17 is a top plan view of radial sector conductive domains assigned to various device terminals, as well as a fan-out of the gate contact providing a plurality of access pads for the gate terminal.

FIG. 17 shows a top plan view of an exemplary five-sector planar disc 380 of a modular interconnect structure, according to an embodiment of the present disclosure. The planar disc 380 can include one or more of the domain extension pads 180 and the extension pad coupling ring 182. The domain extension pads 180 serve to increase the sizes of the radial sector G to encompass a larger surface area for providing electrical access to a gate terminal. One or more of a plurality of domain extension pads 180 can be used to access the radial sector G, based on a desired value of the gate threshold voltage. By designing the planar disc 380 to include an integer number n of domain extension pads 180, the gate threshold voltage can be tuned to a value $V_{tn}$.

Figure 18C:
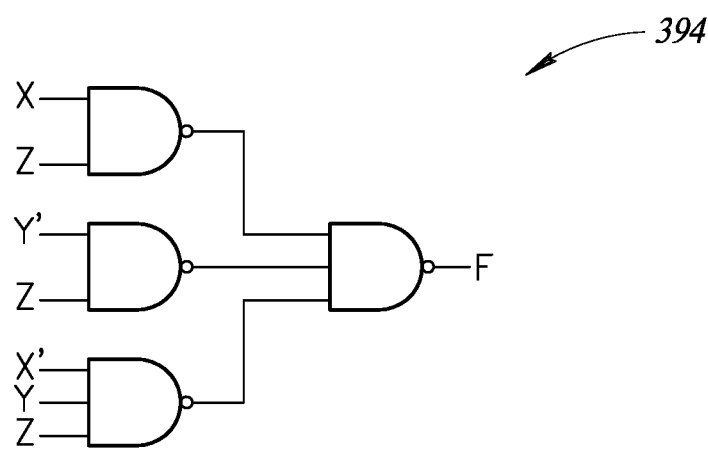
FIG. 18C is a digital circuit schematic of a sum-of-products (SOP) logic stage implemented only with NAND gates.

FIGS. 18A-18C provide information about Boolean logic devices that are well known in the art of digital integrated circuit design. FIG. 18A shows a corresponding NAND gate 390 and a NAND gate truth table 392 that defines the function of the NAND gate 390. The NAND gate 390 has two inputs A and B, and an output Q. According to the truth table 392, the output Q of the NAND gate 390 is low (logic "0") only when both inputs A and B are high (logic "1"). The NAND gate thus functions as an inverted AND gate.

It is recognized in the art that the NAND gate is a universal gate, meaning that every Boolean logic function can be realized by some interconnected combination of NAND gates. FIG. 18B shows symbols for six other logic gates, e.g., NOT, AND, OR, NOR, exclusive OR (XOR), and exclusive NOR (XNOR) gates. FIG. 18B also shows how to construct each of the six types of logic gates using only NAND gates as building blocks. It is apparent from FIG. 18B that the interconnections among the NAND gates can be complex. The present inventor has recognized that once such a universal NAND gate is constructed using vertical GAA nanowire transistors coupled by the modular interconnect structures as disclosed herein, it is possible to realize any desired digital logic circuit using such high-performance, high density building blocks. Furthermore, the modular interconnect structures can simplify interconnections among the NAND gates and conserve chip area.

FIG. 18C shows a sum-of-products (SOP) block 394, as is known in the art. The SOP block is a commonly known arithmetic block used in communication, multimedia, and graphic applications. The SOP block 394 is implemented as shown using only NAND Boolean logic gates to produce an output signal F from input signals X, Y, X', Y', and Z, according to the relationship $$F=XZ+Y'Z+X'YZ$$

in which F is a sum of the products XZ, Y'Z, and X'YZ. The present inventor has recognized that it would be advantageous to create a high performance, high density version of an SOP block, made of vertical GAA transistors coupled, for example, in the NAND gate configuration shown in FIG. 18C, using a modular interconnect structure as described herein.

Figures 19A, 19B:
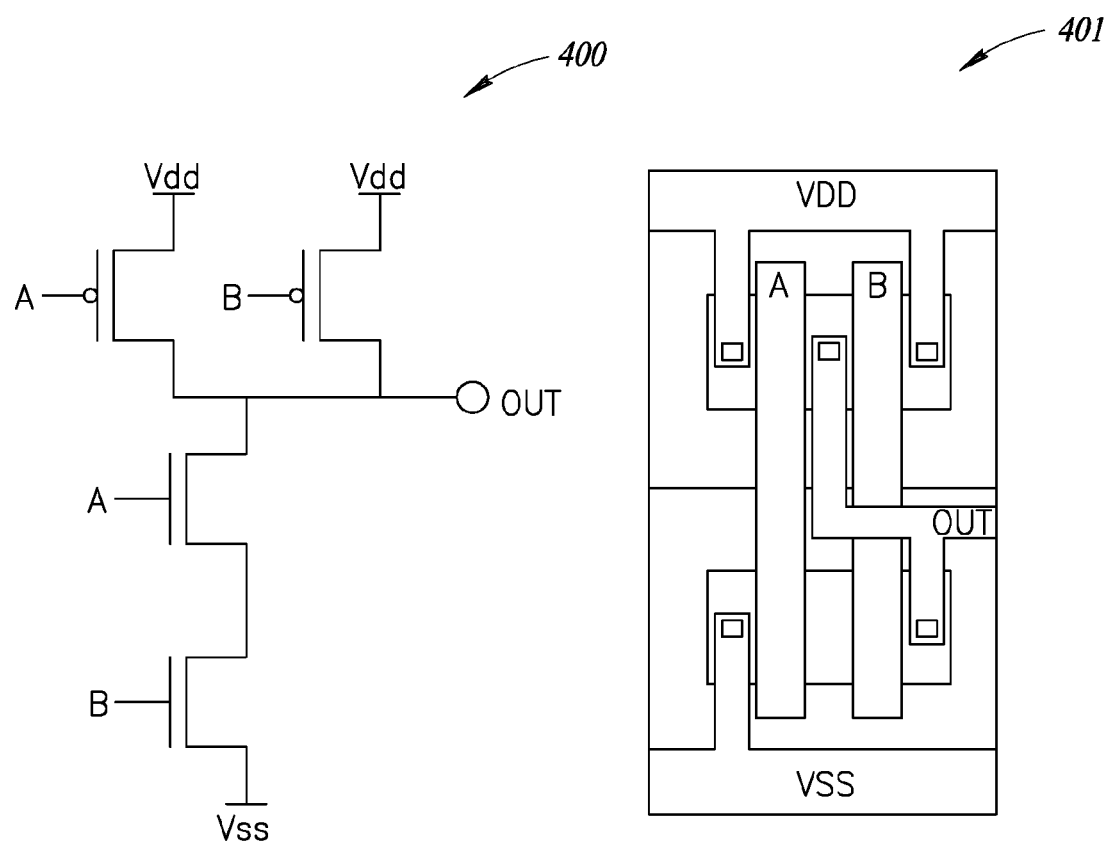
FIG. 19A is a circuit schematic of four MOS transistors coupled together in a conventional arrangement to create a NAND gate.
FIG. 19B is a circuit design layout of a four-transistor NAND gate.
Figure 19C:
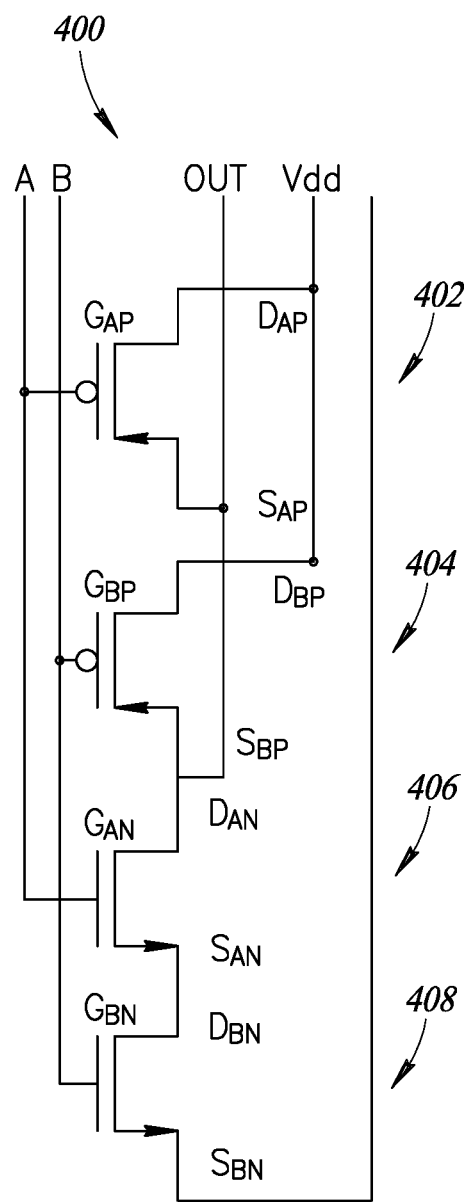
FIG. 19C is a circuit schematic of four MOS transistors coupled together to create a NAND gate, according to an embodiment as described herein.

FIGS. 19A-19D show different representations of a four-transistor NAND gate circuit 400. FIG. 19A shows a conventional circuit schematic of four transistors coupled together to form the NAND gate circuit 400. FIG. 19B shows a top plan view of a corresponding conventional transistor layout for the NAND gate circuit 400. FIG. 19C shows a circuit schematic of the NAND gate circuit 400, according to an embodiment of the present disclosure. In this representation, the NAND gate circuit 400 includes a first pFET 402 "AP", a second pFET 404 "BP", a first nFET 406 "AN," and a second nFET 408 "BN". In accordance with the transistor layout shown in FIG. 19A, the nFETs 406 and 408 are connected in series and the pFETs 402 and 404 are connected in parallel; the gate terminals of the transistors AP and AN are coupled together to the input A; the gate terminals of the transistors BP and BN are coupled together to the input B; the drain terminals of the transistors AP and BP are tied to $V_{DD}$, and the source terminals of the pFETs are coupled together to the output "OUT."

Figure 19D:
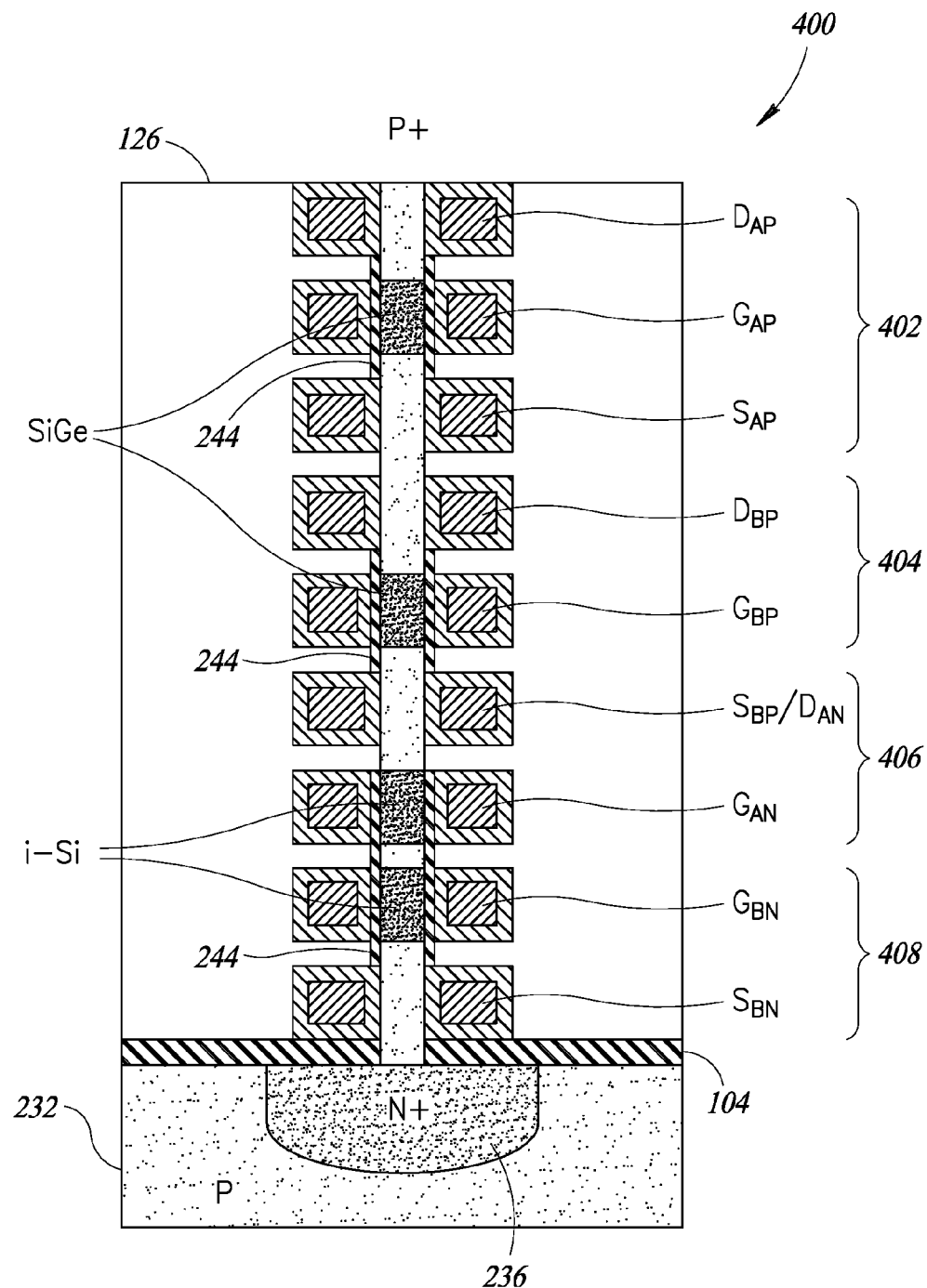
FIG. 19D is a cross-sectional view of a single pillar stacked arrangement of four vertical GAA transistor realization of the NAND gate circuit shown in FIG. 19C.

With reference to FIG. 19D, the NAND circuit 400 can be implemented in silicon with four transistors arranged as a single pillar stack, according to an embodiment of the present disclosure. FIG. 19D shows the four vertically stacked FETs, 402, 404, 406, 408 arranged as a single pillar, to form the NAND gate circuit 400, according to an embodiment of the present disclosure. The NAND gate circuit 400 is thus implemented as a quadruple-stacked GAA nanowire with the anti-leakage diode 308 and the quadruple modular interconnect structure 420. The NAND gate circuit 400 can be fabricated using a method similar to the method 200 used to fabricate the nanowire FETs 230 described above and shown in FIGS. 7A-10.

Figure 20:
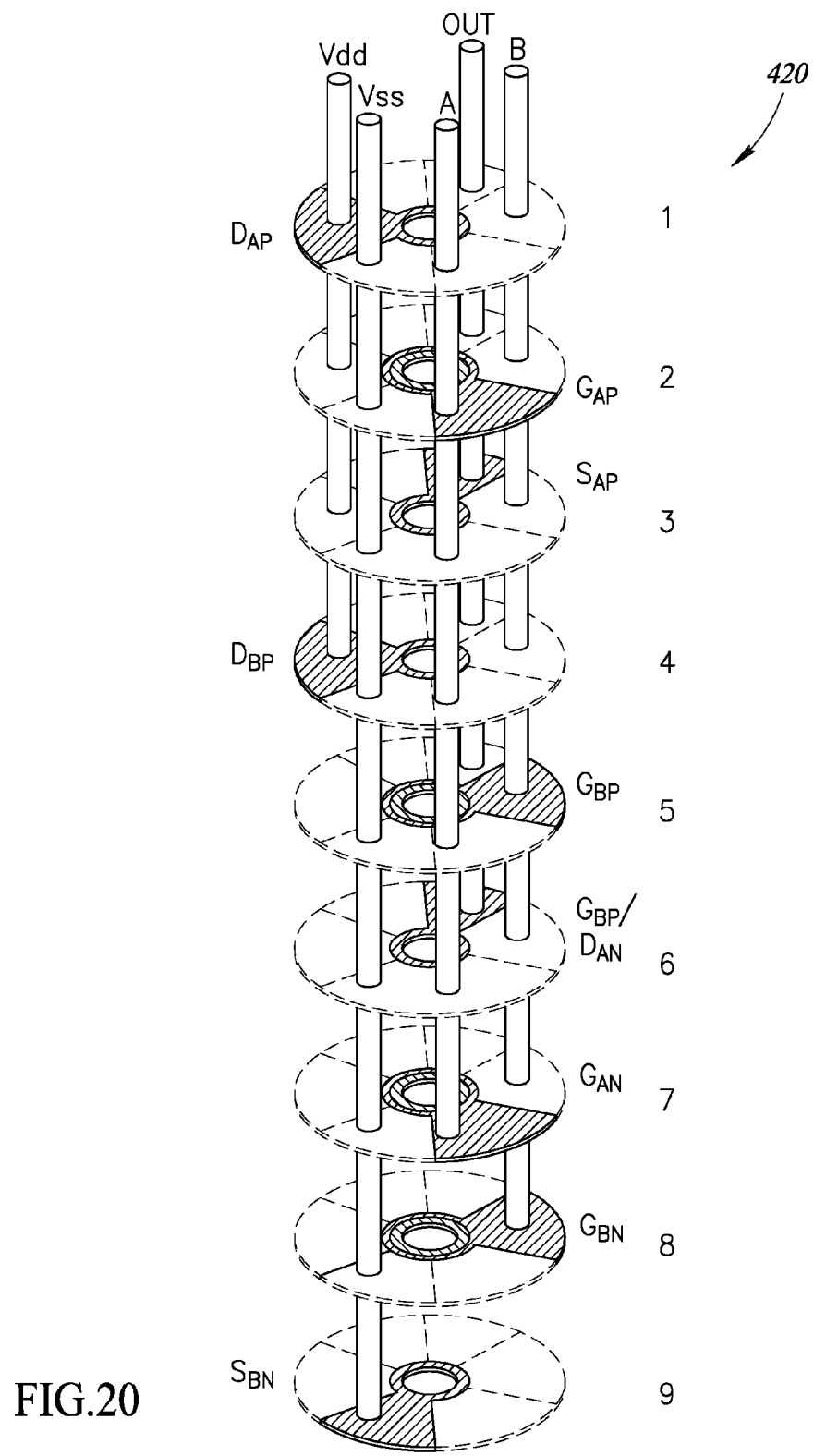
FIG. 20 is a perspective view of a modular interconnect structure coupling the stacked transistors shown in FIG. 19D, according to an embodiment as described herein.

The single pillar stacked arrangement can be accompanied by a quadruple-stacked modular interconnect structure 420 in which five vias A, B, OUT, $V_{DD}$, and $V_{SS}$ extend through nine planar discs, as shown in FIG. 20. The modular interconnect structure 420 is suitable for hard-wiring the four vertically stacked FETs 402-408 into the desired NAND configuration. Once NAND gate building blocks are formed, they can be configured in a modular fashion by either hardware or software, for example, to make an SOP block 394. Alternatively, a plurality of building blocks in the form of NAND gates 400 can be made available to designers to build custom high-performance, high-density circuits.

The modular interconnect structure 420 implements connections between the nFETs 406, 408 and the pFETs 402, 404 of the NAND gate circuit 400 as vias coupling selected sectors of nine planar discs. Each planar disc is divided into six radial sectors to provide contacts to the transistors and to an anti-leakage diode 308. A first gate connection A is implemented as a via that couples the radial sector $G_{AP}$ in planar disc 2 to the radial sector $G_{AN}$ in planar disc 7; a second gate connection B is implemented as a via that couples the radial sector $G_{BP}$ in planar disc 5 to the radial sector $G_{BN}$ in planar disc 8; the connection OUT is implemented as a via that couples the radial sector $S_{AP}$ in planar disc 3 to the radial sector $D_{AN}$ in planar disc 6; the connection $V_{DD}$ to a power supply is implemented as a via that couples the radial sector $D_{AP}$ in planar disc 1 to the radial sector $D_{BP}$ in planar disc 4; and the connection $V_{SS}$ to ground is implemented as a via that accesses the radial sector $S_{BN}$ in planar disc 9. Each of the vias A, B, $V_{DD}$, $V_{SS}$, and OUT extends upward above planar disc 1, while each of the vias A, B, $V_{DD}$, $V_{SS}$, and OUT extends downward only as far as is necessary, according to the circuit design. For example, the $V_{DD}$ connection extends downward only as far as planar disc 4 to contact the radial sector $D_{BP}$, whereas the $V_{SS}$ connection extends downward all the way to planar disc 9 to reach the radial sector $S_{BN}$.

It is noted that planar disc 7, providing electrical access to the gate of the nFET 406, $G_{AN}$, is adjacent to planar disc 8, which provides electrical access to the gate of the nFET 408, $G_{BN}$. This is done to improve efficiency. Instead of fabricating the source of the nFET 406, or $S_{AN}$, and the drain of the nFET 408, $D_{BN}$, as separate terminals, they are formed as one shared terminal. Because there are no connections to the shared $S_{AN}/D_{BN}$ terminal as shown in FIG. 19C, it is not necessary to provide access to $S_{AN}/D_{BN}$ in the modular interconnect structure 420. Accordingly, FIG. 20 shows two consecutive planar discs, 7 and 8, that provide connections to the gates of the nFETs $G_{AN}$ and $G_{BN}$, however there is no need for an intervening planar disc associated with the $S_{AN}/D_{BN}$ shared terminal. Likewise, the source of the nFET 440, or $S_{BP}$, and the drain of nFET 406, or $D_{AN}$, form a shared terminal having one connection to OUT. The shared terminal is accessible by a common sector of a single planar disc, which is planar disc 6. Thus, by accessing a plurality of terminals on a common planar disc, and by omitting planar discs for non-accessed terminals, the modular interconnect structure supporting four stacked transistors can be implemented with only nine planar discs instead of 12. By economizing in this way, transistor density can be further increased in the vertical direction. Regardless of the number of transistor structures and interconnects, the footprint of the pillar, of course, will remain the same. Meanwhile, a complex multi-transistor structure is formed in a compact, neatly-organized column, using as few mask layers as possible.

Figure 21A:
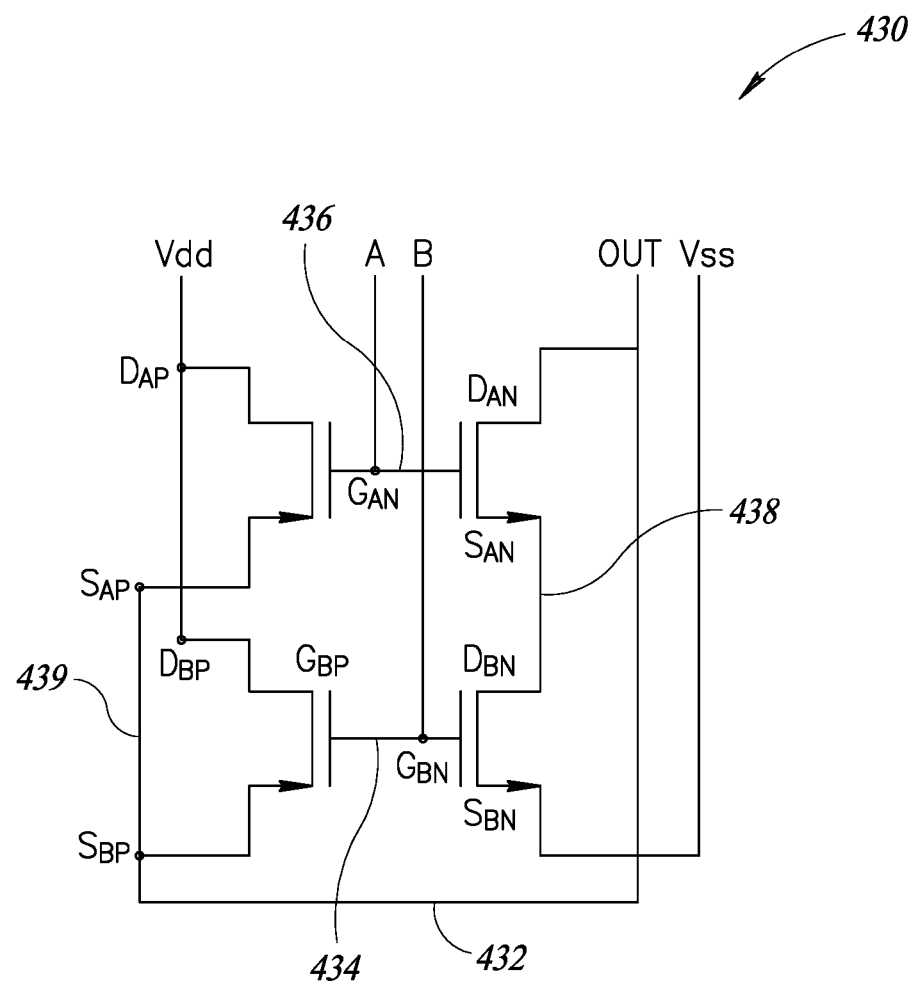
FIGS. 21A-21C show a dual-pillar realization of the four-transistor NAND gate, wherein conducting lines are shown coupling terminals on the two different pillars (FIG. 21B).
Figure 21B:
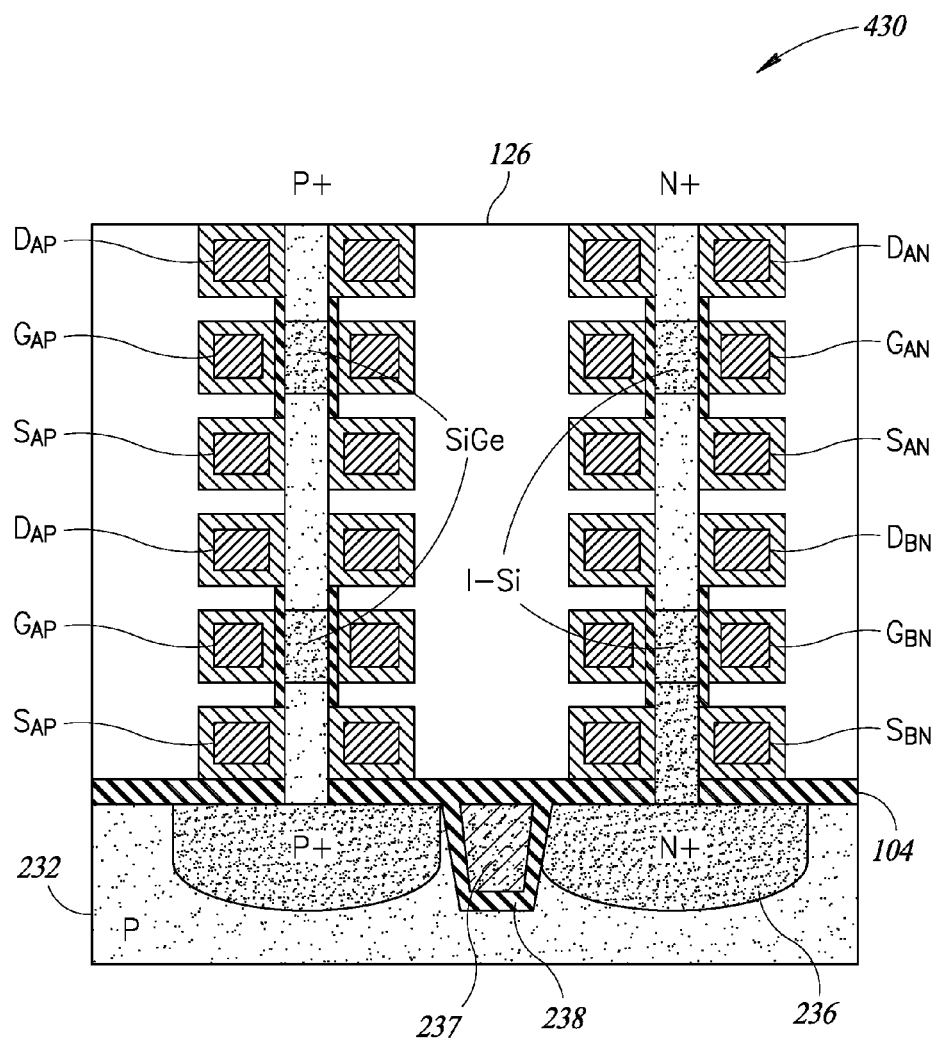

FIG. 21A shows a NAND circuit 430 that is functionally equivalent to the NAND circuit 400, according to an embodiment of the present disclosure. The NAND circuit 430 features a square layout as opposed to the linear layout of the NAND circuit 400. The NAND circuit 430 includes an OUT connection 432, a B gate connection 434, an A gate connection 436, a source-drain connection 438, and a source connection 439. The NAND circuit 430 is implemented with transistors arranged in two pillars, according to an embodiment as shown in FIG. 21B. The two-pillar arrangement includes a stack of two p-type transistors as shown on the left side of FIG. 21B, and a stack of two n-type transistors as shown on the right side of FIG. 21B.

Figure 21C:
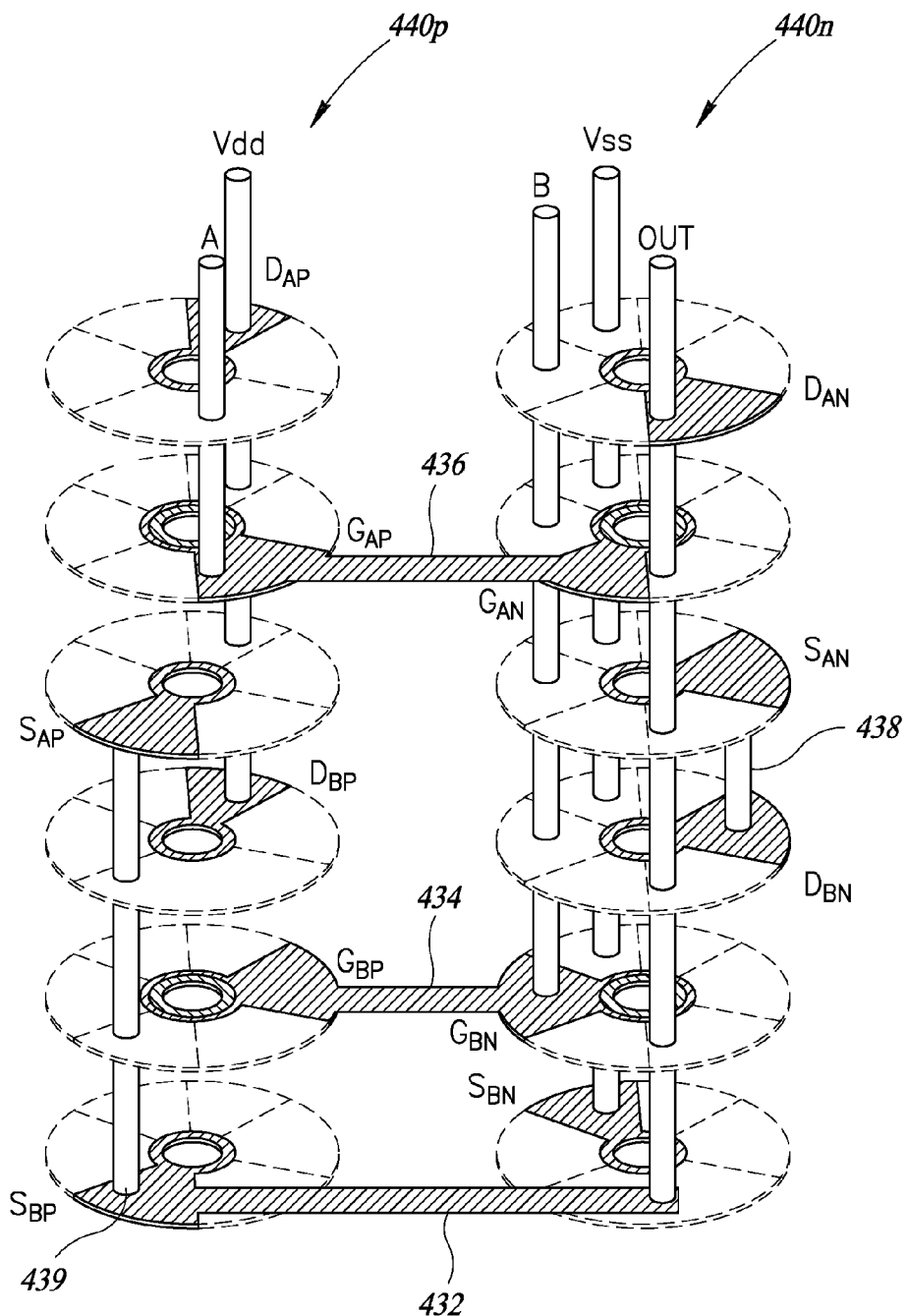

Each pillar shown in FIG. 21B is accompanied by a corresponding double-stacked modular interconnect structure 440n,p, as shown in FIG. 21C. Two vias, A and $V_{DD}$, extend through six planar discs of the modular interconnect structure 440p to provide electrical access to the p-type transistors formed in the left hand pillar. Three vias, B, $V_{SS}$, and OUT, extend through six planar discs of the modular interconnect structure 440n to provide electrical access to the n-type transistors formed in the right hand pillar. The modular interconnect structures 440n,p are linked by three cross-connectors 432, 434, 436 shown in FIG. 21C. The cross-connectors, in the present example, implement an OUT connection 432 that couples $S_{BP}$ to $D_{AN}$, a B gate connection 434 that couples $G_{BP}$ to $G_{BN}$, and an A gate connection 436 that couples $G_{AP}$ to $G_{AN}$. While forming cross-connectors tends to further complicate mask designs, one advantage of the two-pillar arrangement of FIG. 21C is that fewer mask layers are needed, which reduces fabrication costs. On the other hand, the footprint of the NAND circuit 430 is twice as large using the two-pillar arrangement, compared with the single pillar arrangement of the NAND circuit 400 shown in FIG. 19D.

Figure 22A:
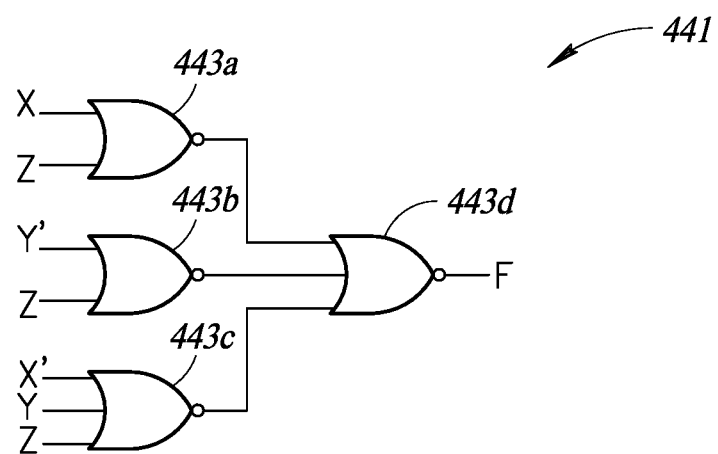
FIG. 22A is a digital circuit schematic of a product-of-sums (POS) logic stage implemented only with NOR gates.

FIG. 22A shows a product-of-sums (POS) block 441, as is known in the art. The POS block is a commonly known arithmetic block used in communication, multimedia, and graphic applications. The POS block 441 is implemented as shown using only NOR Boolean logic gates to produce an output signal F from input signals X, Y, X', Y', and Z, according to the relationship $$F=(X+Z)(Y'+Z)(X'+Y+Z)$$

in which F is a product of the sums X+Z, Y'+Z, and X'+Y+Z. The present inventors have recognized that it would be advantageous to create a high performance, high density version of a POS block, made of vertical GAA transistors coupled, for example, in the NOR gate configuration shown in FIG. 22A, using a modular interconnect structure as described herein.

Figure 22B:
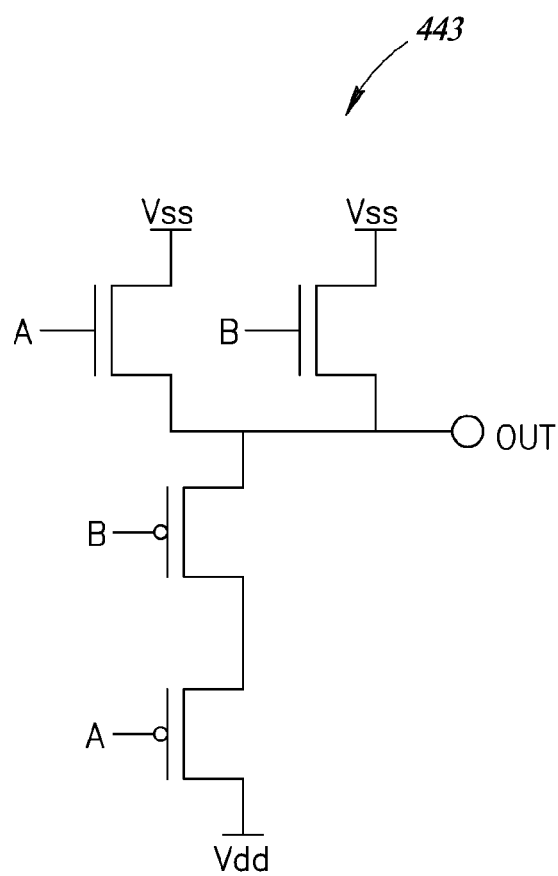
FIG. 22B is a conventional circuit schematic of four MOS transistors coupled together to create a NOR gate.
Figure 22C:
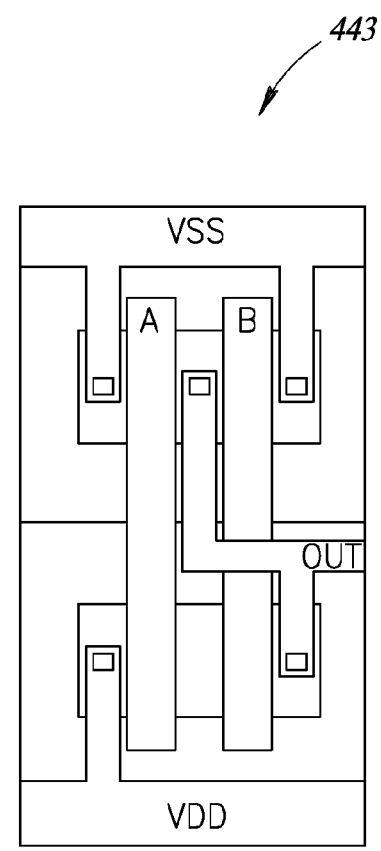
FIG. 22C is a circuit design layout of the four-transistor NOR gate shown in FIG. 22B.
Figure 22D:
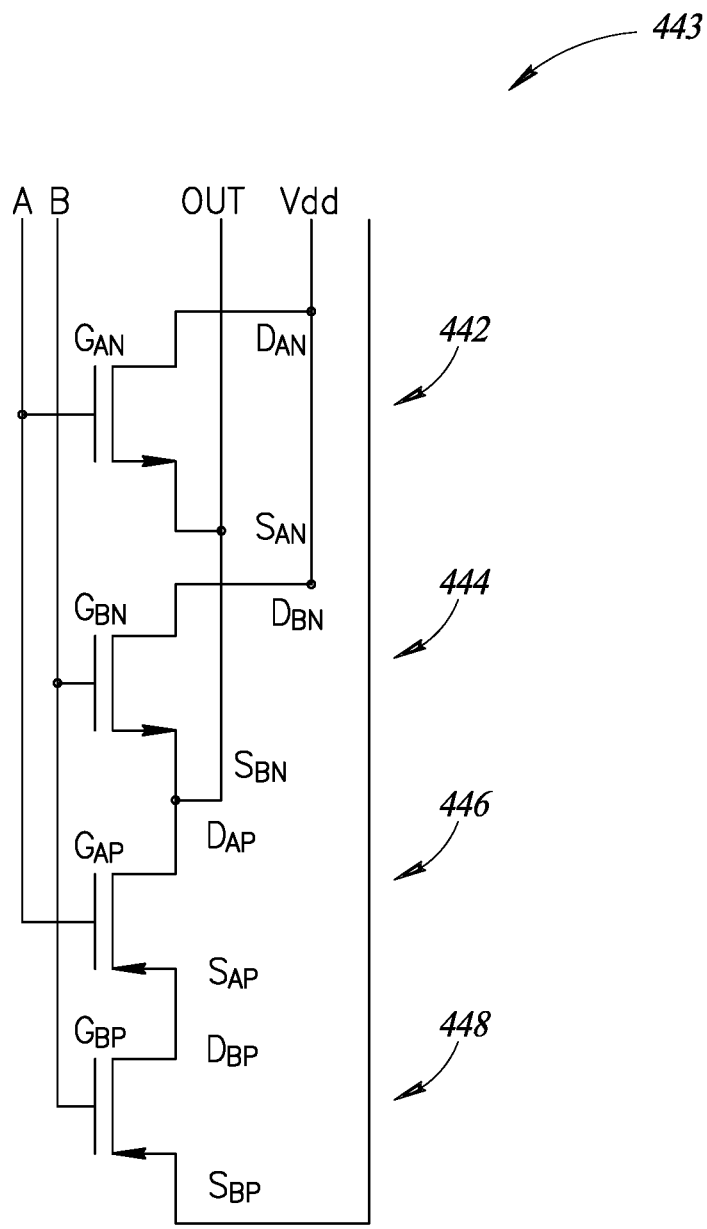
FIG. 22D is a circuit schematic of four MOS transistors coupled together to create a NOR gate, according to an embodiment as described herein.

FIGS. 22A, 22B, 22C, and 22D show different representations of a four-transistor NOR gate circuit 443. FIG. 22B shows a conventional circuit schematic showing four transistors coupled together to form the NOR gate circuit 443. FIG. 22C shows a top plan view of a corresponding conventional transistor layout for the NOR gate circuit 443. FIG. 22D shows a circuit schematic of the NOR gate circuit 443, according to an embodiment of the present disclosure. The NOR gate circuit 443 includes a first nFET "AN" 442, a second nFET 444 "BN", a first pFET 446 "AP," and a second pFET 448 "BNP". The pFETs 446 and 448 are connected in series and the nFETs 442 and 444 are connected in parallel; the gate terminals of the transistors AP and AN are coupled together to the input A; the gate terminals of the transistors BP and BN are coupled together to the input B; the drain terminals of the transistors AP and BP are tied to $V_{DD}$, and the source terminals of the nFETs are coupled together to the output "OUT."

Figure 23A:
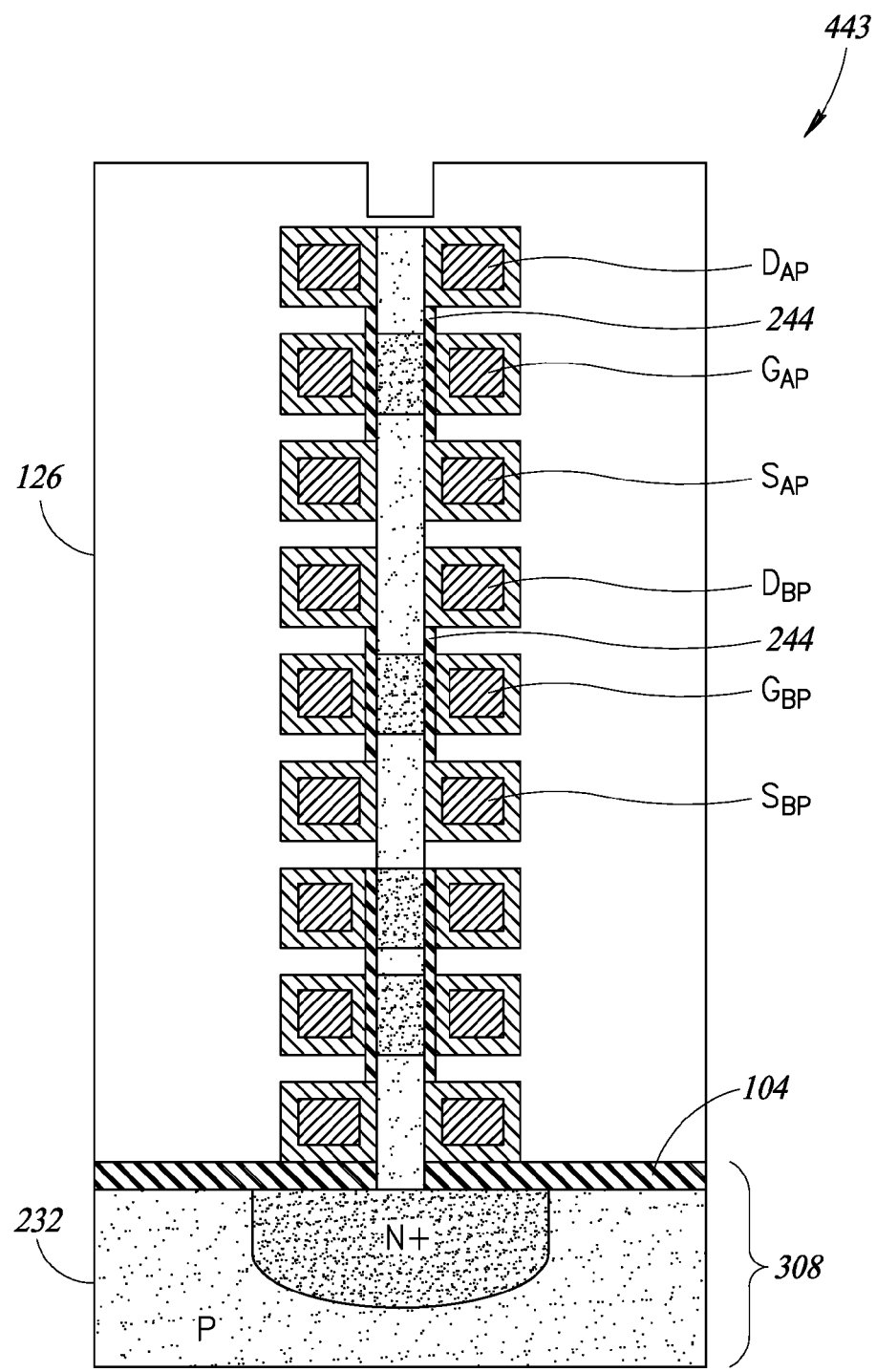
FIG. 23A is a cross-sectional view of a single pillar stacked arrangement of four vertical GAA transistors and annular contacts of the modular interconnect structure described herein, corresponding to the NOR gate shown in FIG. 22D.

The NOR gate circuit 443 is implemented with transistors arranged in a single pillar, according to an embodiment of the present disclosure, as shown in FIG. 23A. FIG. 23C shows the four vertically stacked FETs, 442, 444, 446, 448 arranged as a single pillar, to form the NOR gate 443, according to one embodiment. The NOR gate circuit 443 is thus implemented as a quadruple-stacked GAA nanowire with the anti-leakage diode 308 and the quadruple modular interconnect structure 450. The NOR gate circuit 443 can be fabricated using a method similar to the method 200 used to fabricate the nanowire FETs 230 described above and shown in FIGS. 7A-10.

Figure 23B:
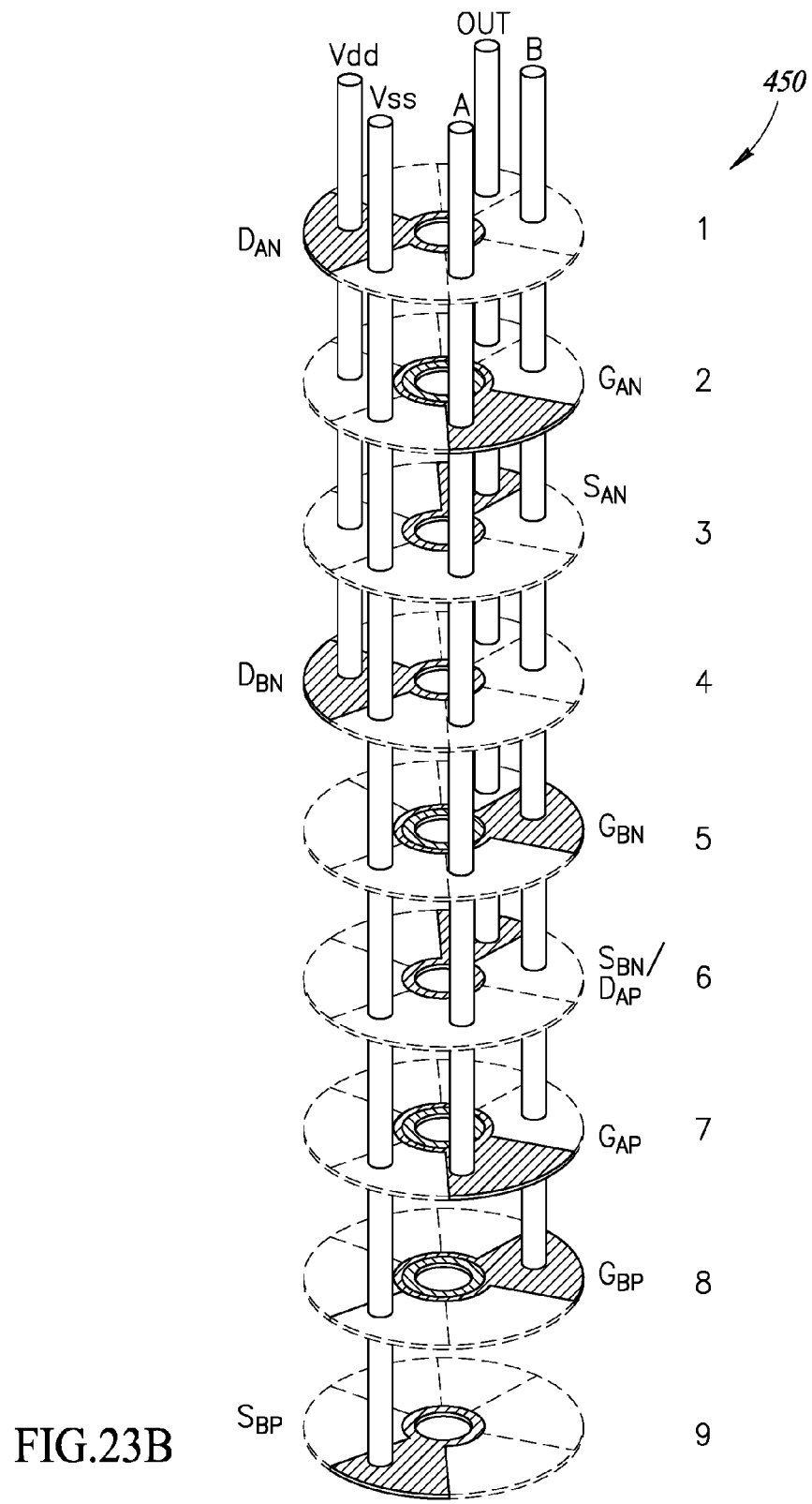
FIG. 23B is a perspective view of the modular interconnect structure shown in FIG. 23A.

The single pillar arrangement is accompanied by a quadruple-stacked modular interconnect structure 450 in which five vias A, B, OUT, $V_{DD}$, and $V_{SS}$ extend through nine planar discs, as shown in FIG. 23B. The modular interconnect structure 450 is suitable for hard-wiring the four vertically stacked FETs 442-448 into the desired NOR configuration. Once NOR gate building blocks are formed, they can be configured in a modular fashion by either hardware or software, for example, to make the POS block 441. Alternatively, a plurality of building blocks in the form of NOR gates 443 can be made available to designers to build custom high-performance, high-density circuits.

The modular interconnect structure 450 implements connections between the pFETs 446, 448 and the nFETs 442, 444 of the NOR gate as vias coupling selected sectors of nine planar discs. Each planar disc is divided into six radial sectors to provide contacts to the transistors and to an anti-leakage diode 308. A first gate connection A is implemented as a via that couples the radial sector $G_{AN}$ in planar disc 2 to the radial sector $G_{AP}$ in planar disc 7; a second gate connection B is implemented as a via that couples the radial sector $G_{BN}$ in planar disc 5 to the radial sector $G_{BP}$ in planar disc 8; the connection OUT is implemented as a via that couples the radial sector $S_{AN}$ in planar disc 3 to the radial sector $D_{AP}$ in planar disc 6; the connection $V_{DD}$ to a power supply is implemented as a via that couples the radial sector $D_{AN}$ in planar disc 1 to the radial sector $D_{BN}$ in planar disc 4; and the connection $V_{SS}$ to ground is implemented as a via that contacts the radial sector $S_{BP}$ in planar disc 9. Each of the vias A, B, $V_{DD}$, $V_{SS}$, and OUT extends upward above the top planar disc, while each of the vias A, B, $V_{DD}$, $V_{SS}$, and OUT extends downward only as far as is necessary, according to the circuit design. For example, the $V_{DD}$ connection extends downward only as far as planar disc 4 to contact the radial sector $D_{BN}$, whereas the $V_{SS}$ connection extends downward all the way to planar disc 9 to reach the radial sector $S_{BP}$.

It is noted that planar disc 7, providing electrical access to the gate of the pFET 446, $G_{AP}$, is adjacent to planar disc 8, which provides electrical access to the gate of the pFET 448, $G_{BP}$. This is done to improve efficiency. Instead of fabricating the source of the pFET 446, or $S_{AP}$, and the drain of the pFET 448, $D_{BP}$, as separate terminals, they are formed as one shared terminal. Because there are no connections to the shared $S_{AP}/D_{BP}$ terminal as shown in FIG. 22D, it is not necessary to provide access to $S_{AP}/D_{BP}$ in the modular interconnect structure 450. Accordingly, FIG. 23B shows two consecutive planar discs, 7 and 8, that provide connections to the gates of the pFETs $G_{AP}$ and $G_{BP}$, however there is no need for an intervening planar disc associated with the $S_{AP}/D_{BP}$ shared terminal. Likewise, the source of the nFET 444, or $S_{BN}$, and the drain of pFET 446, or $D_{AP}$, form a shared terminal having one connection to OUT. The shared terminal is accessible by a common sector of a single planar disc, which is planar disc 6. Thus, by accessing a plurality of terminals on a common planar disc, and by omitting planar discs for non-accessed terminals, the modular interconnect structure supporting four stacked transistors can be implemented with only nine planar discs instead of 12. By economizing in this way, transistor density can be further increased in the vertical direction. Regardless of the number of transistor structures and interconnects, the footprint of the pillar, of course, will remain the same. Meanwhile, a complex multi-transistor structure is formed in a compact, neatly-organized column, using as few mask layers as possible.

Figure 24A:
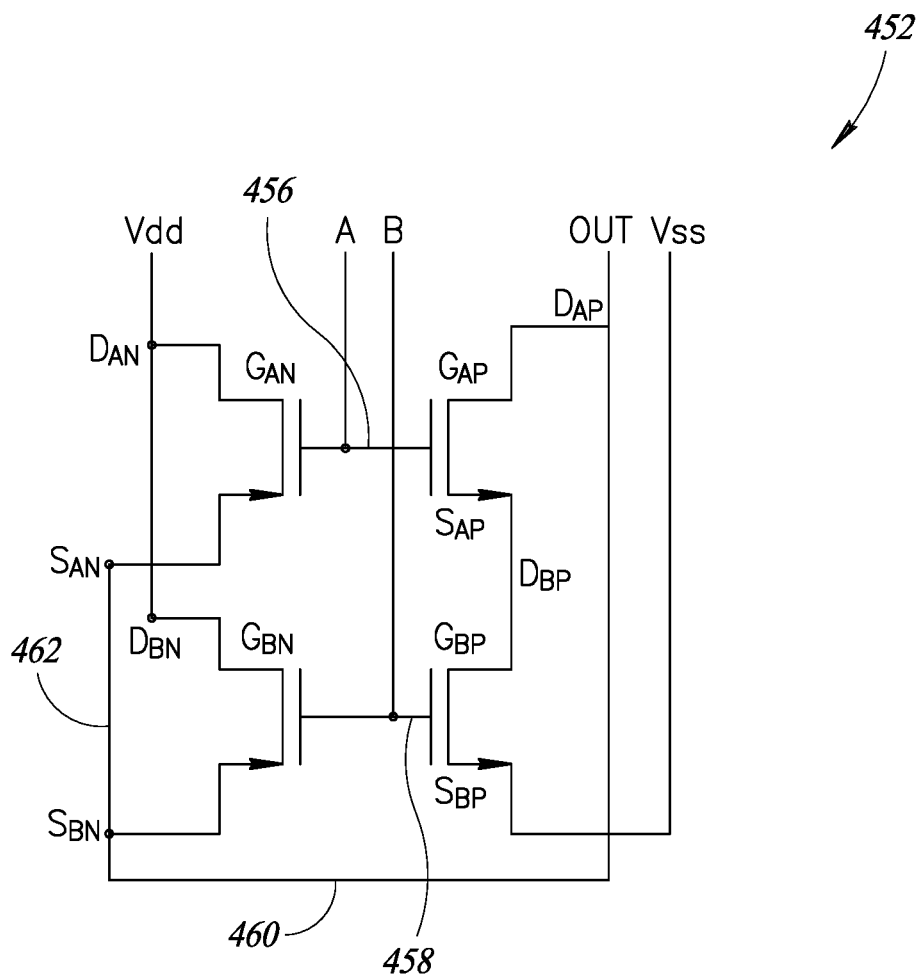
FIGS. 24A-24C show a dual-pillar realization of the four-transistor NOR gate, wherein conducting lines are shown coupling terminals on the two different pillars.
Figure 24B:
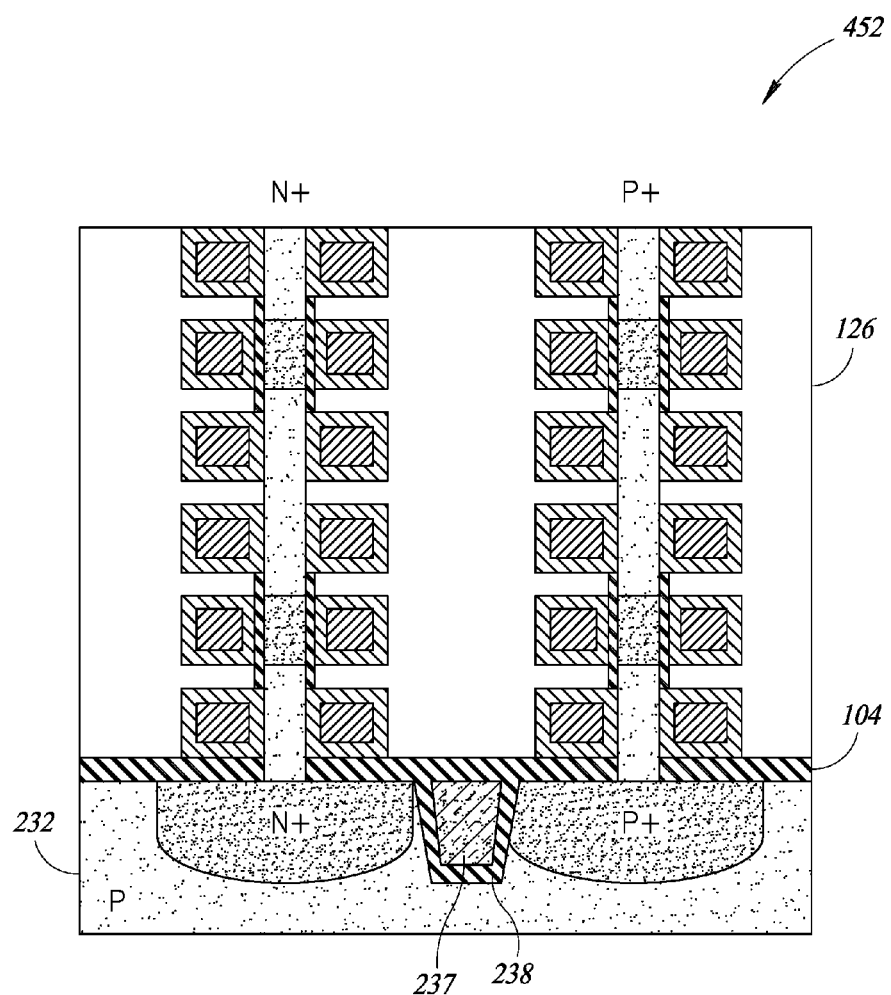

FIG. 24A shows a NOR circuit 452 that is functionally equivalent to the NOR gate circuit 443, according to a second embodiment. The NOR gate circuit 452 features a square layout as opposed to the linear layout of the NOR gate circuit 443. The NOR gate circuit 452 includes an OUT connection 460, an A gate connection 456, a B gate connection 458, and a source connection 462. The NOR circuit 452 is implemented with transistors arranged in two pillars, according to an embodiment as shown in FIG. 24B. The two-pillar arrangement includes a stack of two n-type transistors as shown on the left side of FIG. 24B, and a stack of two p-type transistors as shown on the right side of FIG. 24B.

Figure 24C:
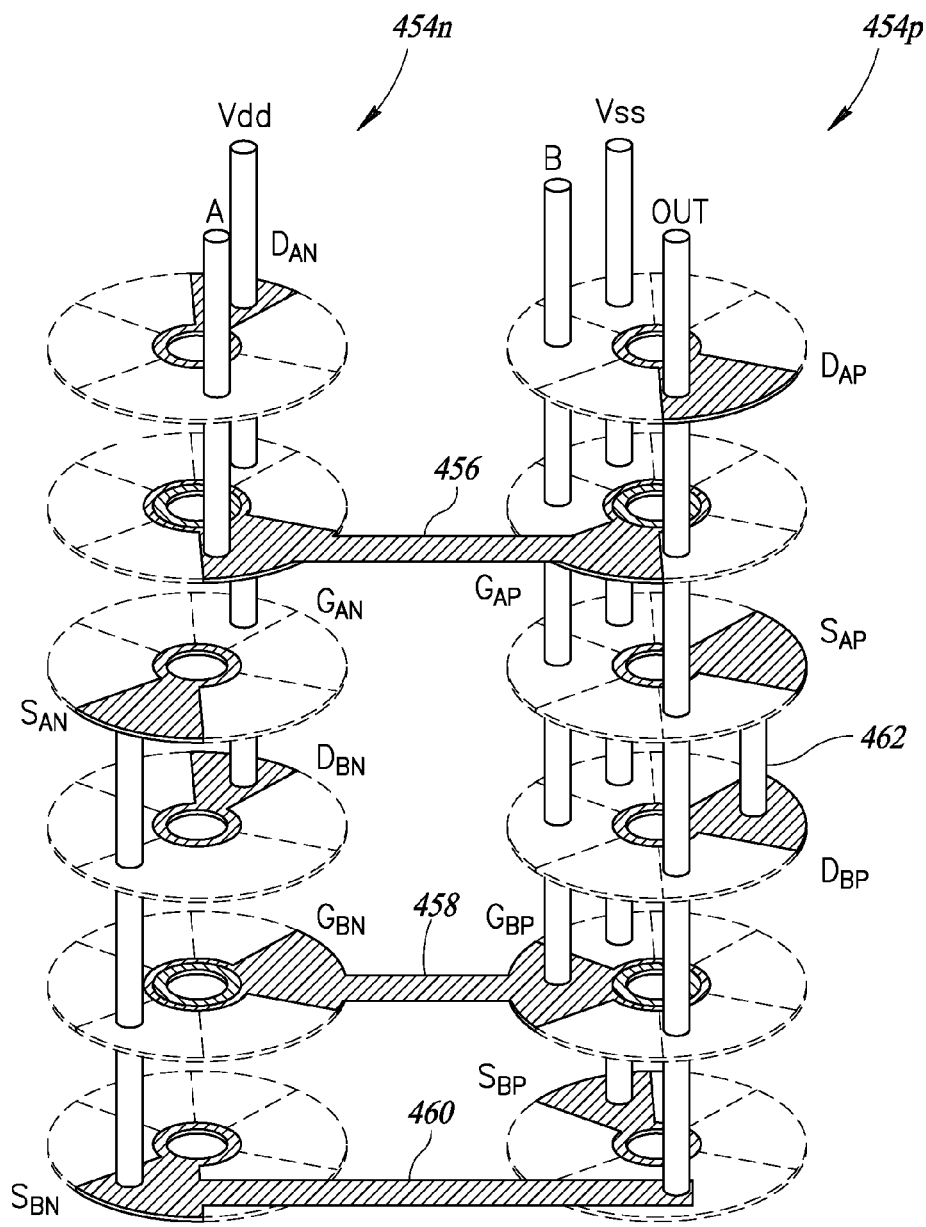

Each pillar shown in FIG. 24B is accompanied by a corresponding double-stacked modular interconnect structure 454n,p, as shown in FIG. 24C. Two vias, A and $V_{DD}$, extend through six planar discs of the modular interconnect structure 454n to provide electrical access to the n-type transistors formed in the left hand pillar. Three vias, B, $V_{SS}$, and OUT, extend through six planar discs of the modular interconnect structure 454p to provide electrical access to the p-type transistors formed in the right hand pillar. The interconnect structures 454n,p are linked by three cross-connectors shown in FIG. 24C. The cross-connectors in the present example implement the OUT connection 460 that couples $S_{AN}$ to $S_{BN}$, the B gate connection 458 that couples $G_{BP}$ to $G_{BN}$, and the A gate connection 456 that couples $G_{AP}$ to $G_{AN}$. While forming the cross-connectors 456, 458, 460 further complicates the mask designs, one advantage of the two-pillar arrangement is that fewer mask layers are needed, which reduces the fabrication cost. On the other hand, the footprint of the NOR circuit 452 is twice as large using the two-pillar arrangement, compared to the single pillar NOR gate circuit 443.

Other devices can be adapted to take advantage of the performance benefits of a vertical GAA implementation having a modular interconnect structure as disclosed herein. One such device is the silicon carbide static induction transistor (SiC-SIT). Generally, the choice of a semiconductor material for switching electrical currents on and off depends on the operating voltage of the switch and how much current must be controlled. Silicon is an excellent material for low-power transistors used in microelectronics. However, for high power applications, the implementation of silicon devices becomes complex, and thermal management issues arise.

The fundamental properties of SiC make it a better substrate choice for handling high voltages and currents at elevated temperatures. The most readily synthesized hexagonal polytypes of SiC, 4H and 6H, have a large indirect band gap (~3.2 eV) and a large breakdown electric field (2 MV cm$^{-1}$), as well as high electron mobility (900 cm2 V$^{-1}$ s$^{-1}$) and thermal conductivity (400 W m$^{-1}$ K$^{-1}$). Given these properties, SiC power switches should have 10 to 100 times better performance than silicon switches. Among SiC power switching devices, the silicon carbide static induction transistor (SiC-SIT) has demonstrated the most promising performance, characterized by ultra-low power loss. However, present designs of the SiC-SIT device, which use ion implantation, can cause SiC substrate damage and reliability concerns. [Koji Yano et al., IEEE Transactions on Electronic Devices, Vol. 57, No. 4, April 2010. p 919-926; U.S. Patent Publication 2011/0049532 A1 to Odekirk, et al.]. Also the guard ring design in transistors greatly increases the chip area. Furthermore, constraints associated with conventional interconnects have so far limited the size of SiC-SIT devices to be in the range of microns as opposed to shrinking the devices to be in the nanometer range.

Figure 25:
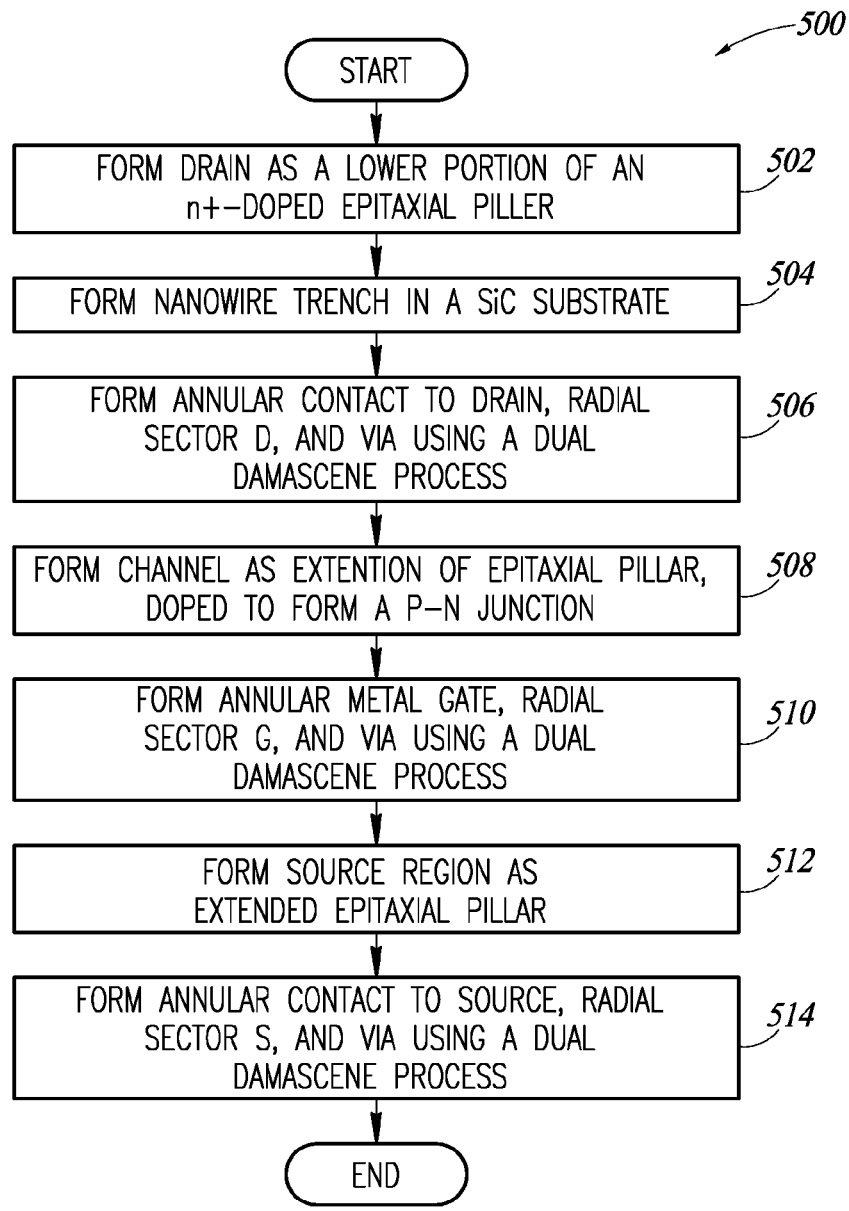
FIG. 25 is a flow diagram showing a sequence of steps in a method of fabricating a vertical GAA SiC static induction transistor and the modular interconnect structure as described herein.

FIG. 25 is a flow diagram showing a sequence of steps in an exemplary method 500 for fabricating a vertical GAA SiC-SIT transistor and an associated modular interconnect structure, according to an embodiment of the present disclosure. A GAA implementation that includes an epitaxially grown nanowire can be implant-free to prevent damage to the SiC substrate. Furthermore, including the ESD diode 348 and the anti-leakage diode 308 in the GAA design of a SiC-SIT can protect the transistors against high voltages and currents without increasing the chip area. Partially-formed GAA SiC-SIT devices are shown in FIGS. 26B-30C. Each set of figures shows a top plan view of the gate electrode and a radial sector G, and two cross-sectional views of the device along cut lines transverse to one another, as indicated in the top plan view.

At 502, a drain region 526 is formed in a 300 micron thick SiC substrate 522, as shown in FIGS. 26A-26D. The SiC substrate desirably has a 4H polytype, but may also be 6H, 3C, or any other suitable polytype of SiC. The substrate layer is preferably n-type with a resistivity less than 0.10 ohm-cm. A first inter-layer dielectric (ILD) 524 is formed on the SiC substrate 522, the first ILD 524 having a thickness anywhere within the wide range of about 2 nm-16 μm. The ILD 524 can be, for example, an oxide such as $SiO_2$, or a low-k dielectric material such as OMCATS, having a dielectric constant in the range of about 2.4-2.8, or any other suitable dielectric material.

At 504, a trench is etched through the first ILD 524 into the SiC substrate 522. The trench may have a diameter anywhere within the wide range of about 2 nm 8 μm. Epitaxial SiC is then grown in the trench to form an epitaxial pillar that extends slightly above a top surface of the first ILD 524. The epitaxial SiC is doped with phosphorous to create an n+ region having two layers. The first layer desirably has a dopant concentration in the range of about $5.0E17$-$1.0E19$ $cm^{-3}$ and a thickness in the range of about 0.00259-1.0 μm. The second layer desirably has a dopant concentration in the range of about $1.0E15$-$1.0E17$ $cm^{-3}$ and a thickness in the range of about 0.0025-1.0 μm. The epitaxial pillar is then planarized by a CMP process to stop on the dielectric layer 524.

FIG. 26A shows a desired doping concentration profile 521 along the vertical length of the epitaxial pillar, from the drain at the bottom of the pillar, through the gate region 520, to the source region at the top of the pillar. The doping concentration profile 521 can be engineered so that a) in the source and drain regions, the doping concentration is higher so as to reduce current leakage and reduce contact resistance; and b) in the gate region, the doping concentration is lower to reduce lattice mismatch at p-n junction boundaries in order to maintain the best crystal quality at the junctions. It is further noted that at the edges of the gate region, where the dopant concentration profile is the steepest and therefore diffusion of dopants will be most likely, spacers are used to prevent ILD breakdown.

Figure 27A:
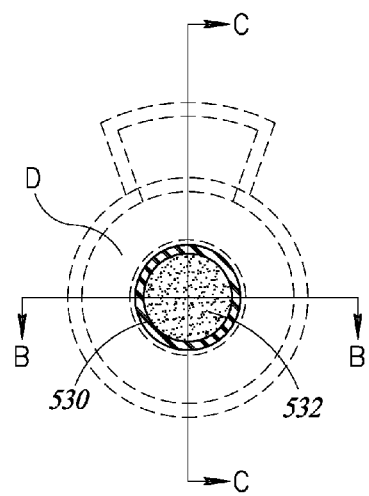
Figures 27B, 27C:
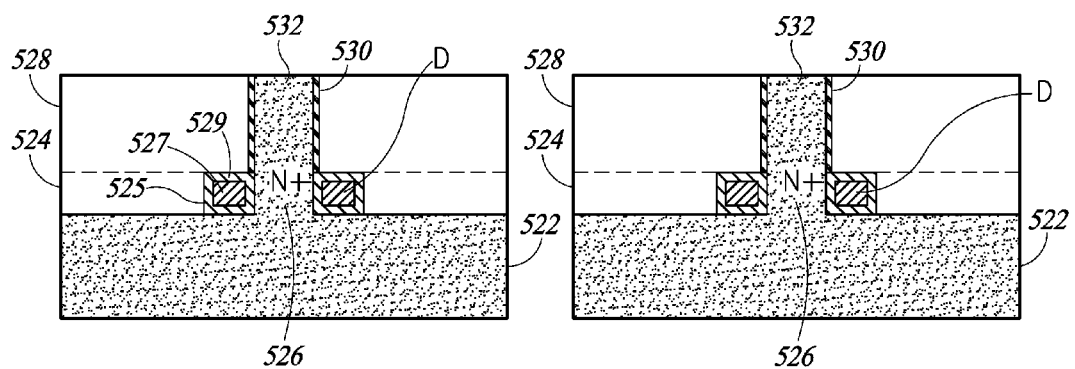

At 506, an annular drain contact and radial sector D are formed by a dual damascene process, according to one embodiment as shown in FIGS. 27A-27C. First, an annular drain trench is etched around the drain region 526. Metal is then deposited into the drain trench in the usual way, first lining the trench with a Ti and/or TiN liner 525, and then filling the trench with a bulk metal 527 such as tungsten. A metal cap 529 is then formed by selective deposition. The metal cap 529 is desirably made of the same material as the liner 525. The metal cap 529 is then polished to the height of the first ILD 524. The drain contact D is then covered by depositing a second ILD 528, according to one embodiment as shown in FIGS. 27B and 27C. The total dielectric thickness of the first and second ILD layers is in the range of about 0.0005-5 μm.

At 508, a SiC channel region 532 having a p-n junction therein is formed according to an embodiment of the present disclosure as shown in FIGS. 27B and 27C. First, a channel trench is formed in the second ILD 528. A spacer 530 is then deposited into the channel trench. The spacer 530 can be made of SiN or a high-k material such as, for example, $HfO_2$. The spacer 530 has a thickness anywhere in the range of about 2-800 nm. Epitaxial SiC is then grown in the channel trench as an extension of the epitaxial pillar. The epitaxial SiC channel region 532 is doped in-situ with negative ions to a concentration in the range of about $1.0E16$-$1.0E18$ $cm^{-3}$. The SiC channel region 532 is then planarized to stop on the second ILD 528.

Figure 28A:
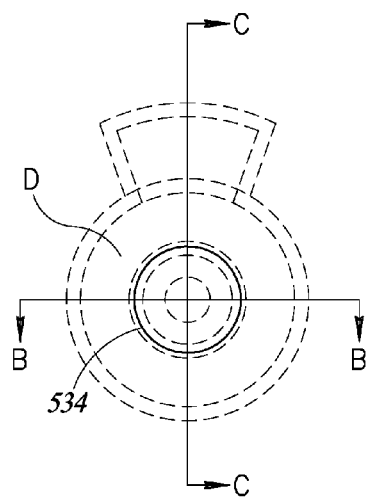
Figures 28B, 28C:
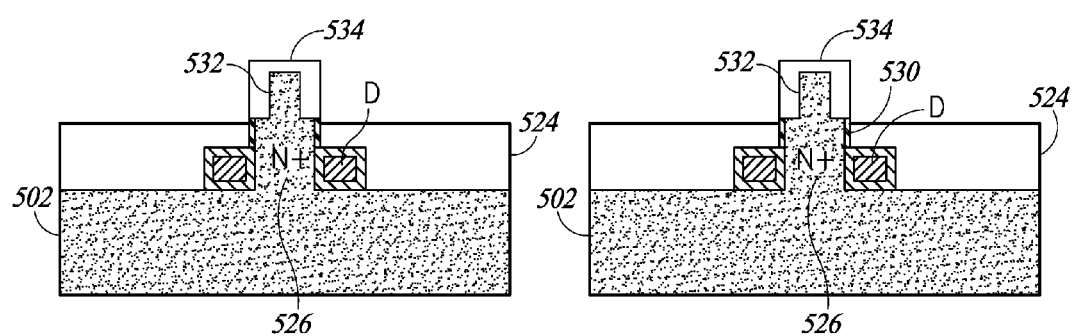

Next, the second ILD 528 is etched back to a target thickness above the metal drain contact D as shown in FIGS. 28B and 28C. The spacer 530 is then selectively etched to reveal the channel region 532 of the n-type SiC pillar. The channel region 532 is then etched isotropically to remove an outer portion of the n-type SiC material. The outer portion is then replaced with a p-type SiC having a thickness in the range of about 0.0005-5 μm. The p-type SiC is formed by selective epitaxial growth, outward from the n-type SiC. During the selective epitaxial growth, the SiC is doped in-situ with boron ions. The doping concentration of the p-type SiC is in the range of about $1E16$-$1E18$ $cm^{-3}$.

At 510, an annular metal gate and radial sector gate contact G are formed by a dual damascene process, according to one embodiment as shown in FIGS. 29B and 29C. The process for creating the annular metal gate is similar to the process as described at 506 above, for forming the annular drain contact D. However, the liner material for the metal gate is desirably titanium and the bulk material of the gate contact G is tungsten. Titanium will form titanium-silicide at the boundary of the metal gate and the p-type SiC. In this case, a gate oxide is unnecessary, and the annular metal gate is permitted to contact the SiC channel directly, as shown in FIGS. 29A-29C. The gate contact G is then covered with a third ILD 535, according to an embodiment as shown in FIGS. 29B and 29C.

At 512, an N+ source region 537 is formed as an extension of the epitaxial pillar, as shown in FIGS. 29B and 29C. First, a source trench is formed in the third ILD 535, having a thickness anywhere in the range of 2 nm-16 μm. A trench having a diameter that matches that of the existing epitaxial pillar is etched through the third ILD 535. A spacer is then deposited on the walls of the trench, as described above. Epitaxial SiC is then grown in the trench to extend the epitaxial pillar slightly above a top surface of the third ILD 535. Like the drain region 526, the epitaxial SiC is doped with phosphorous to create an N+ region having two layers. The first layer desirably has a dopant concentration in the range of about $1.0E15$-$1.0E17$ $cm^{-3}$ and a thickness in the range of about 0.0001-15.0 μm. The second layer desirably has a dopant concentration in the range of about $5.0E17$-$1.0E19$ $cm^{-3}$ and a thickness in the range of about 0.0025-1.0 μm. The epitaxial pillar is then planarized by a CMP process to stop on the third ILD 535.

Figure 30A:
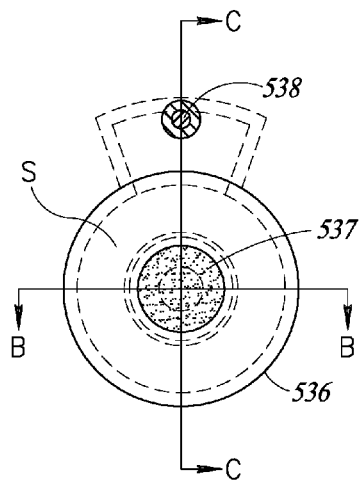
FIGS. 30A-30C show a completed vertical GAA static induction transistor.
Figure 30B:
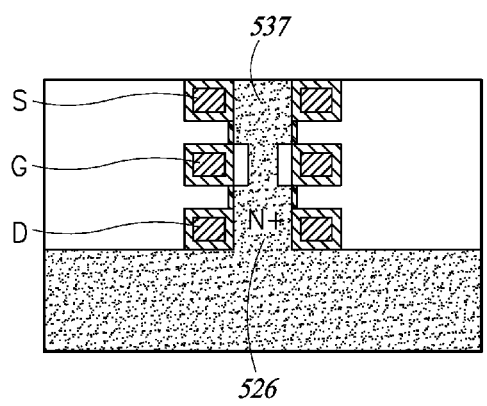
Figure 30C:
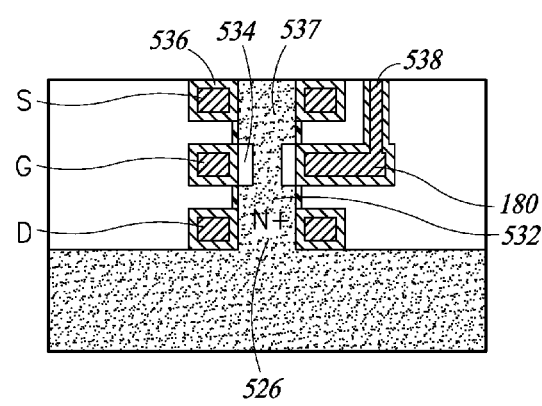

At 514, an annular source and radial sector source contact S are formed by a dual damascene process, according to one embodiment as shown in FIGS. 30A-30C. The process for creating the annular source contacts is similar to the process described above at 506, for forming the annular drain contact D, in which the contact metal includes a metal liner, a bulk metal and a metal cap 536. The metal cap 536 is also shown in the final top plan view, FIG. 30A. It is noted that FIGS. 30A and 30C also show an exemplary via 538 that couples to the extension pad 180.

Figure 31A:
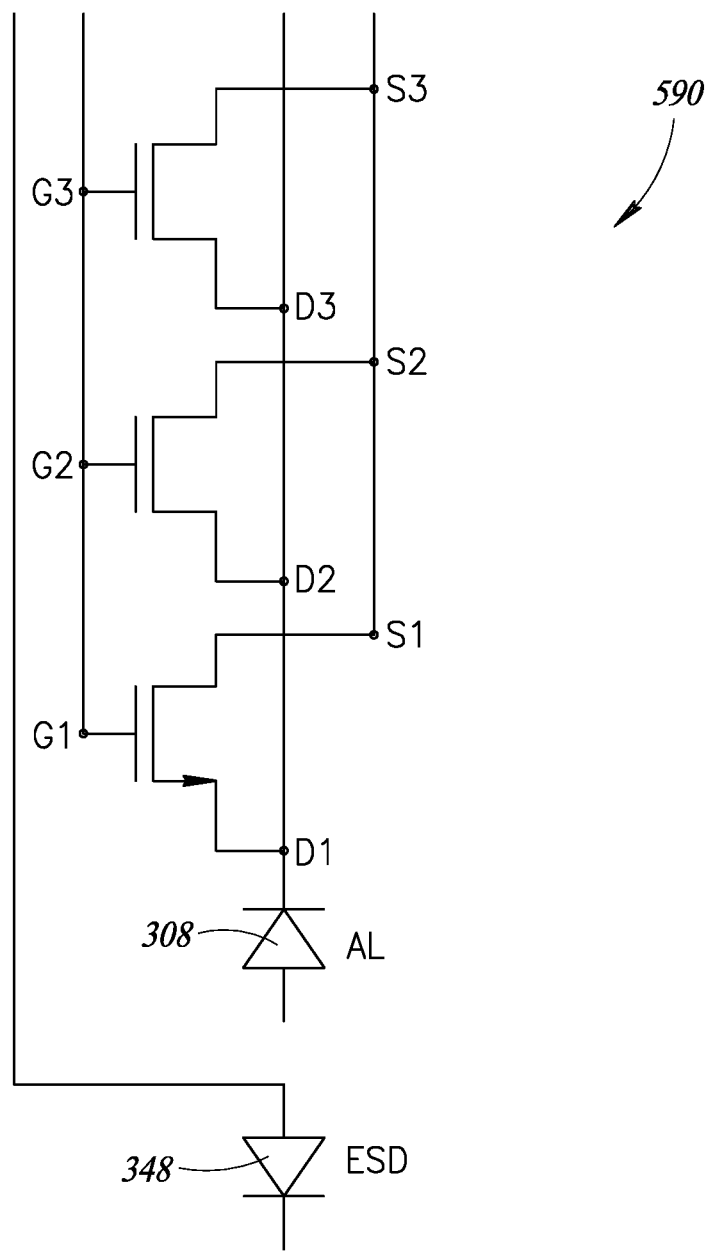
FIG. 31A is a circuit schematic of three SIT transistors, an ESD-type diode, and an anti-leakage type diode coupled together.
Figure 31B:
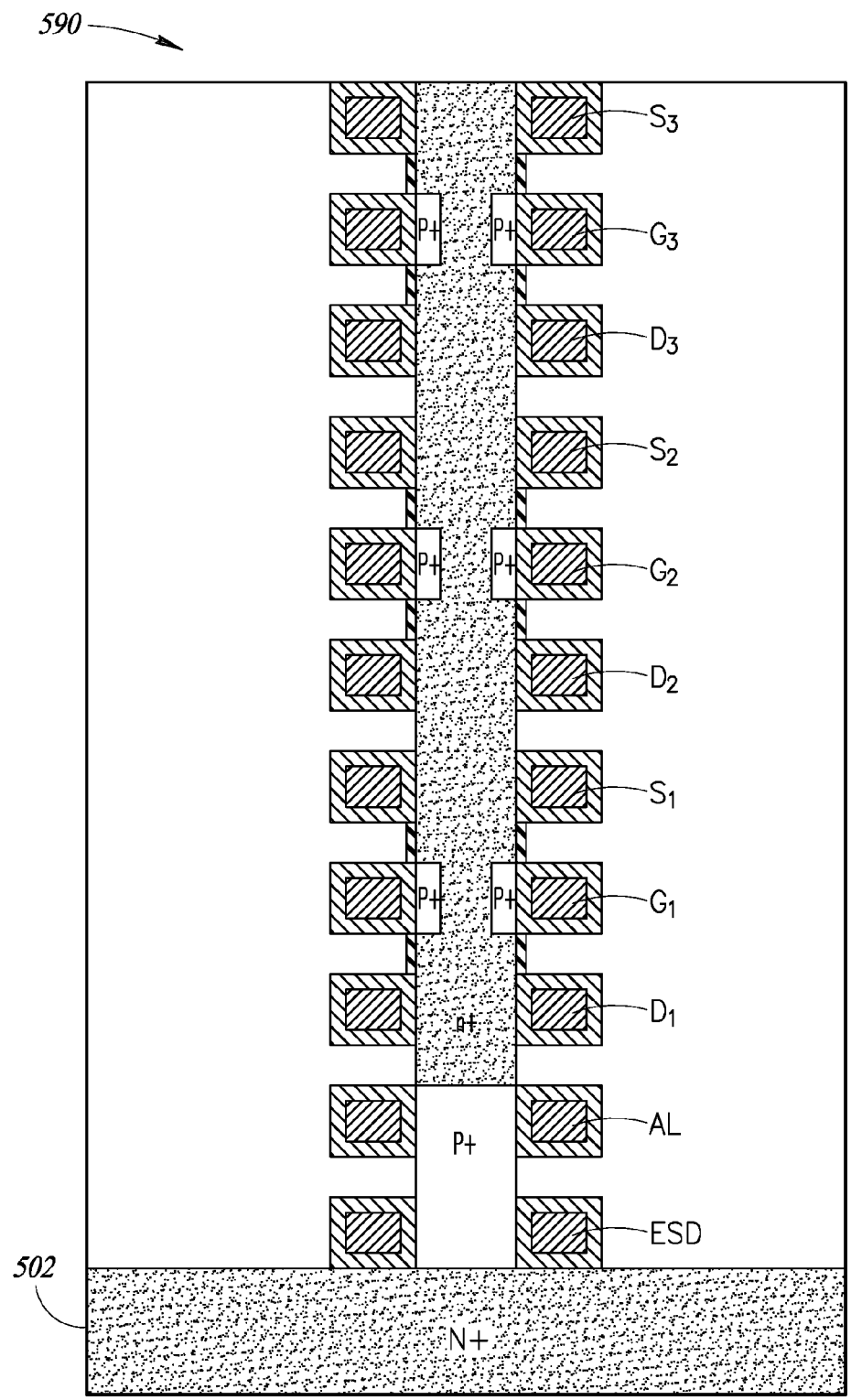
FIG. 31B is a cross-sectional view of a vertical GAA three-transistor single pillar stacked arrangement of SITs and an associated modular interconnect structure as described herein.
Figure 31C:
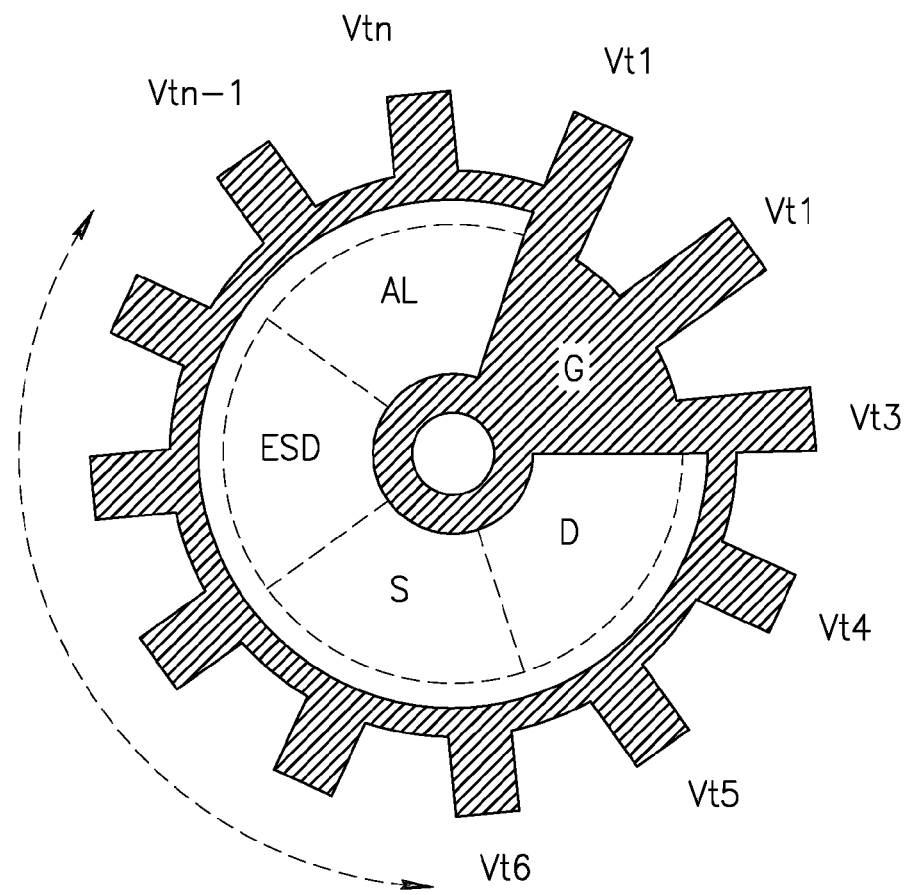
FIG. 31C is a top plan view of a planar disc having five sectors, of which a gate contact sector is coupled to fan-out extension spokes and extension pads for tuning the threshold voltage of the gate, according to an embodiment as described herein.

FIG. 31A is a circuit schematic of a three-transistor circuit 590 that includes three SiC-SIT transistors, an ESD-type diode 348, and an anti-leakage type diode 308. A GAA implementation of the three-transistor circuit 590 is shown in FIG. 31B. The GAA implementation of the circuit 590 includes a single pillar stacked arrangement of three SiC-SITs, which are in turn, stacked on the diodes AL and ESD. The single pillar arrangement can be coupled according to the schematic diagram shown in FIG. 31A, using the modular interconnect structure shown in cross-section in FIG. 31B, which includes eleven planar discs. FIG. 31C shows a representative one of the middle planar discs that includes a radial sector coupled to a metal gate G.

Another device that can be implemented as a vertical GAA having a modular interconnect structure as disclosed herein, is a silicon-oxide-nitride-oxide-silicon (SONOS) floating gate memory. A SONOS device is a type of non-volatile memory closely related to Flash RAM. A SONOS memory device is distinguished from conventional flash memory by the use of silicon nitride ($Si_3N_4$) instead of poly silicon for the charge storage material. A further variant of SONOS is a silicon-high-k-nitride-oxide-silicon (SHINOS) device.

SONOS is currently an area of active research and development because SONOS provides for lower programming voltages and higher program/erase cycle endurance than polysilicon-based flash memory, and because SONOS devices can be used for specialized military and space systems due to the excellent radiation hardness properties of $Si_3N_4$. One challenge is to find effective interconnections for a high density SONOS memory array. In some conventional SONOS memory arrays, only one third of the area is used for the array and two thirds is used for the interconnection [H. Tanaka et al: "Bit Cost Scalable Technology with Punch and Plug Process for Ultra High Density Flash Memory" 2007 Symposium on VLSI Technology Digest of Technical Papers, p. 14-15.]

A GAA SONOS device with a modular interconnect structure as described herein can significantly improve this ratio of the memory array area to the interconnection area. Also, a GAA SONOS device may provide reduced total capacitance and improved memory access speed. Furthermore, a floating gate device implemented as a GAA transistor features greatly increased floating gate area. Adding anti-leakage and ESD diodes can further improve the reliability of SONOS devices. Finally, the lower contact resistance associated with the modular interconnect structure can benefit SONOS devices.

Figure 32:
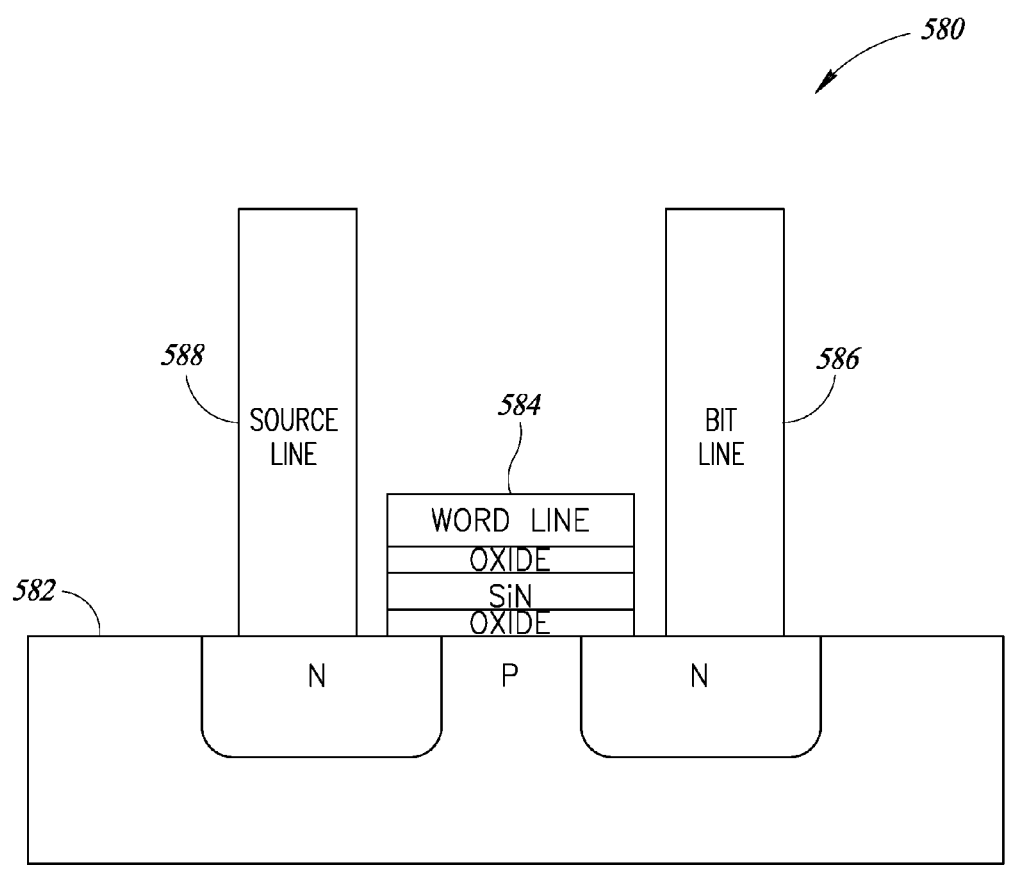
FIG. 32 shows a cross-sectional schematic view of an existing SONOS floating gate memory device.

FIG. 32 shows a cross-sectional schematic view of a conventional SONOS floating gate memory device 580. The memory device 580 is built on a p-type substrate 582 in which n-type source and drain regions 583, 585 have been formed. A gate 584 is formed over a three-layer gate dielectric that includes two oxide layers and a SiN layer disposed between the oxide layers. A bit line 586 is coupled to the drain region 585. A source line 588 is coupled to the source region 583. A word line is coupled to the gate 584.

Figure 33:
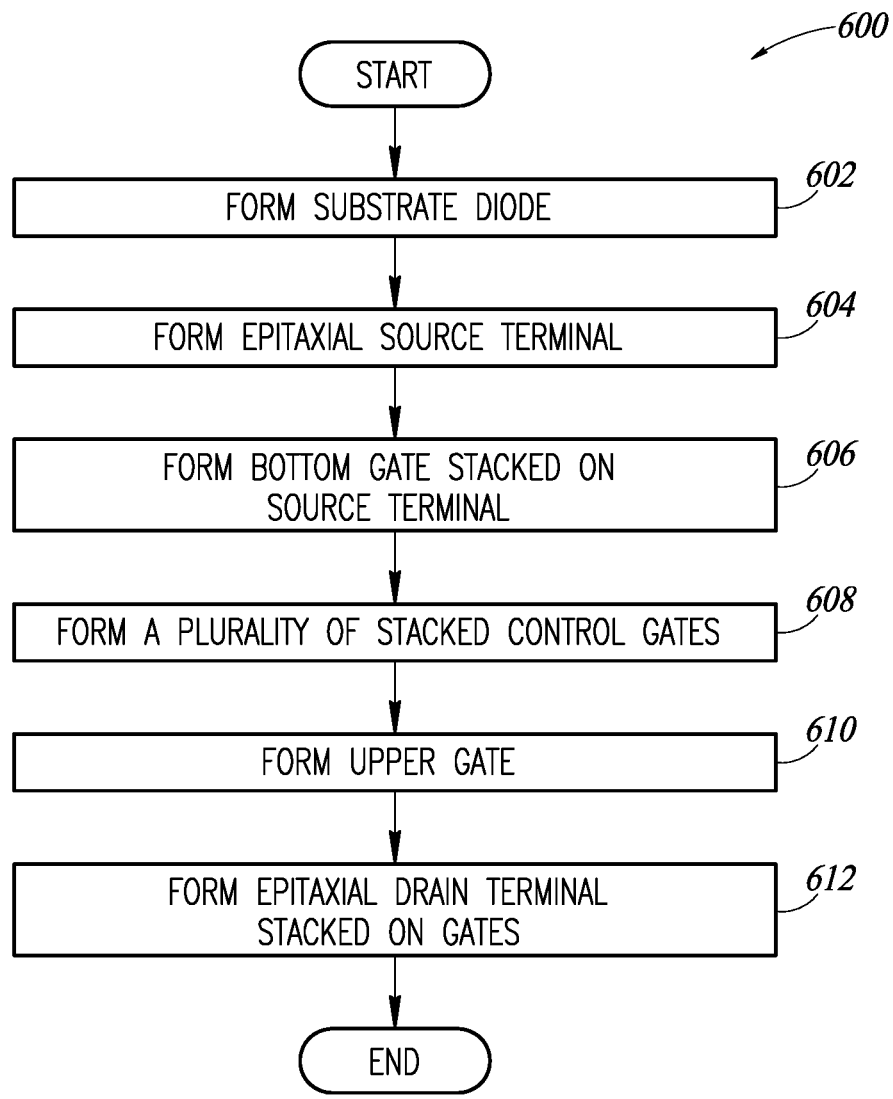
FIG. 33 is a flow diagram showing a sequence of steps in a method of fabricating a vertical GAA SONOS device and corresponding modular interconnect structure as described herein.

FIG. 33 is a flow diagram showing a sequence of steps in a method 600 of fabricating a vertical GAA implementation of a SONOS device having an associated modular interconnect structure, according to an embodiment of the present disclosure. FIGS. 34A-36B show cross-sectional views of the vertical GAA SONOS device and associated electrical connections during fabrication according to the method 600.

Figure 34A:
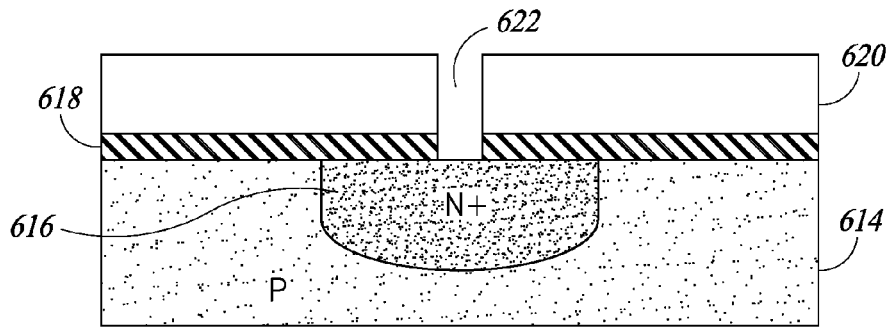
FIGS. 34A-36 are cross-sectional views of the vertical GAA SONOS device and associated electrical connections during fabrication according to the sequence shown in FIG. 33.

At 602, a substrate diode is formed in a semiconductor substrate 614, as shown in FIG. 34A. The semiconductor substrate 614 may be p-silicon, in which an $N^+$ region 616 is formed by implantation with phosphorous or arsenic to a concentration of 1.0E16-3.0E20, with a target concentration of 2.0E19. An insulating layer 618, for example, a 2-10-nm thick layer of silicon nitride or silicon oxynitride, is formed on top of the substrate 614. Next, a thicker ILD layer 620, in the range of about 2-50 nm thick, is formed on top of the insulating layer 618. The ILD may be, for example, a low-k dielectric material having a dielectric constant in the range of about 2.4-2.8. An opening 622 is then formed by patterning the ILD 620 and the insulating layer 618, exposing the $N^+$ region 616. The opening 622 has a width in the range of about 2-30 nm.

Figure 34B:
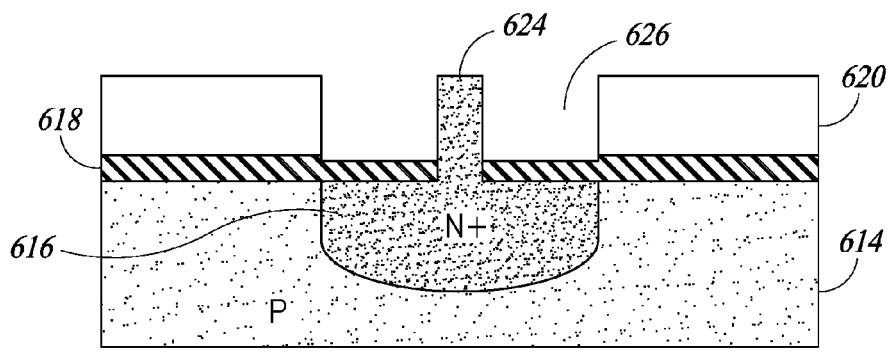

At 604, an epitaxial source terminal 624 is formed, as shown in FIG. 34B. The source terminal 624 is an epitaxially grown extension of the $N^+$ region 616 in a direction transverse to a top surface of the substrate 614. Then, a trench 626 having a radius in the range of about 8-40 nm is formed around the epitaxial source terminal 624, as shown in FIG. 34B. A trench liner, e.g., Ti/TiN is then deposited in the trench 626, followed by a bulk metal 628, e.g., W, to form an annular source contact S to the source terminal 624.

Figure 34C:
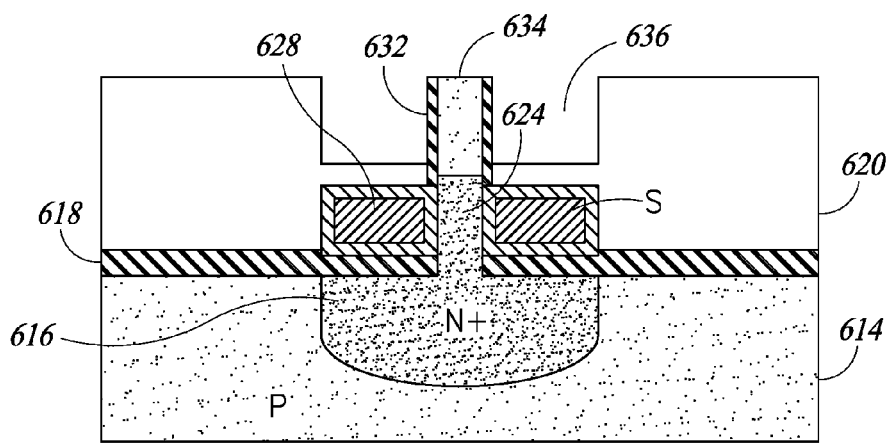
Figure 34D:
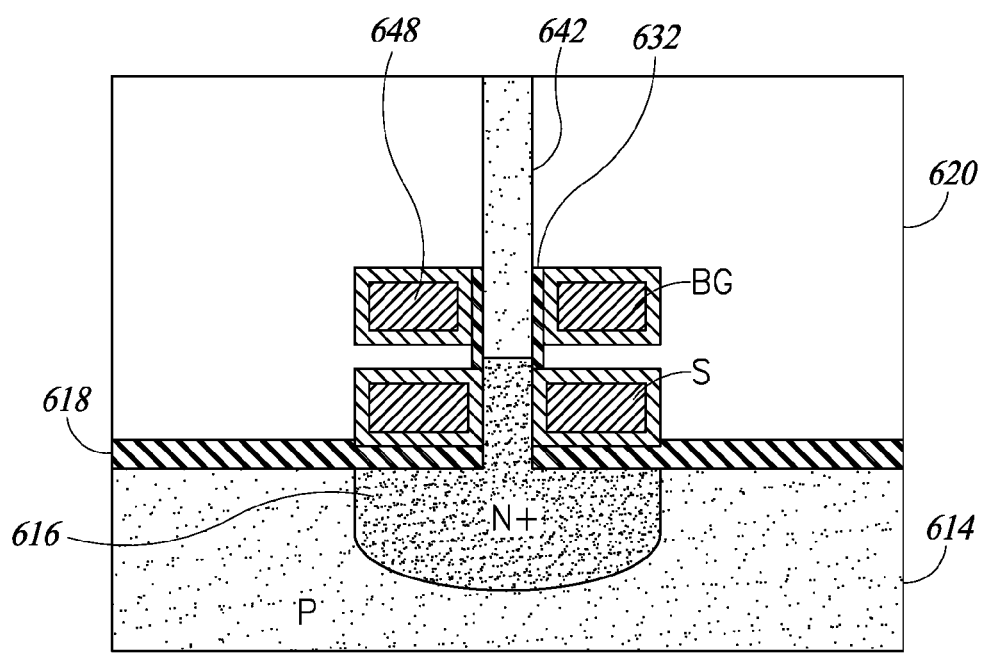

At 606, a bottom gate is stacked on the source terminal 624 as shown in FIGS. 34C,D. First, the ILD 620 is raised, an opening is formed to match the size of the previous opening 622, and epitaxial silicon is grown to fill the opening, forming a bottom channel region 634. The bottom channel region 634 may be lightly doped. The ILD 620 is then planarized to stop on the annular source contact. Finally, a high-k gate oxide 632, e.g., hafnium oxide ($HfO_2$) of thickness 2-40 nm is formed on the sides of the bottom channel region 634 by, for example, plasma vapor deposition (PVD). Next, the ILD 620 is raised again, and a trench 636 is formed as shown in FIG. 34C, to accommodate a wrap-around metal gate and an annular gate contact BG, which are shown in FIG. 34D. Next, the channel 642 is extended vertically to form a pillar as described above, again by raising the ILD 620, forming a trench for the next addition to the pillar, and by polishing the pillar back to be flush with the top surface of the ILD.

Figure 35:
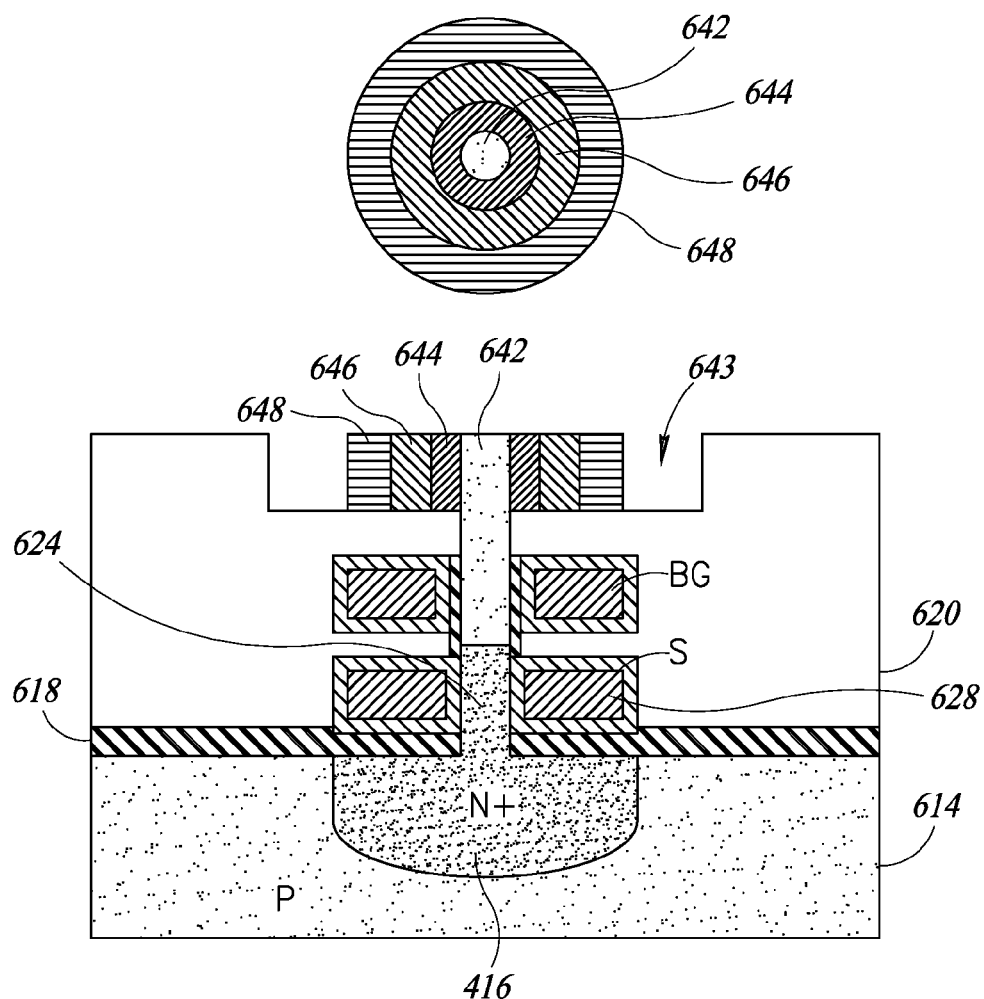
Figure 36:
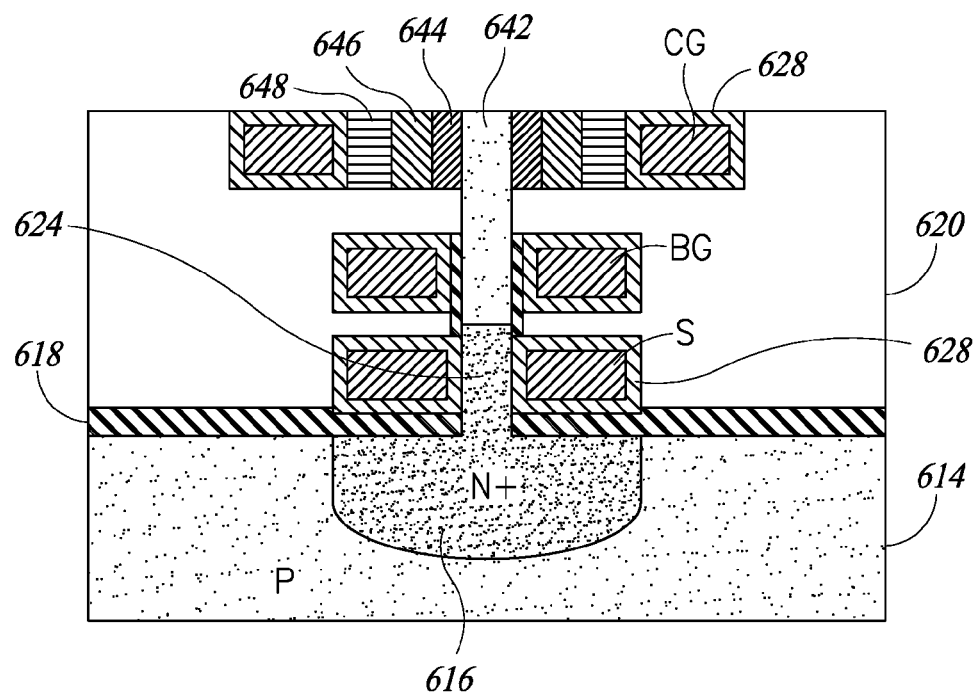

At 608, a first control gate $CG_1$ is formed, as a multi-layer annular structure shown in FIG. 35. In one embodiment, first control gate $CG_1$ is formed by a dual damascene process to include three concentric annular layers: an inner annular layer 644 that wraps around the channel 642 is a first gate oxide layer; a middle annular layer 646, 8-15 nm thick, is a $Si_3N_4$ floating gate; and an outer annular layer 648 is a second gate oxide layer. Each of the gate oxide layers can be either a high-k gate oxide of thickness 2-20 nm formed by PVD, or a low pressure chemical vapor deposition (LPCVD) oxide of thickness 2-40 nm. The control gates may have more or fewer layers and/or different types of layers than are shown and described in the present example. A trench 643 is then formed to accommodate an annular control gate contact CG to the first multi-layer annular control gate $CG_1$, as shown in FIGS. 35, 36. The annular control gate contact CG is similar to the annular source and bottom gate contacts, S and BG, respectively. Formation of the first control gate $CG_1$ and the associated annular control gate contact CG can be repeated to form n control gates along the central pillar, or channel 642. Three representative control gates are shown in FIGS. 37A-37C.

At 610, after the desired number of control gates are complete, an upper gate and an annular upper gate contact UG are formed in similar fashion as the bottom gate and the annular bottom gate contact BG. The completed upper gate is shown in FIG. 37C.

At 612, an epitaxial drain 656 and an associated annular drain contact D are stacked on the gates, in similar fashion as the source terminal 624 and the annular source contact S. The ILD 620 is planarized to stop on the drain 656, as shown in FIG. 37C.

Figure 37A:
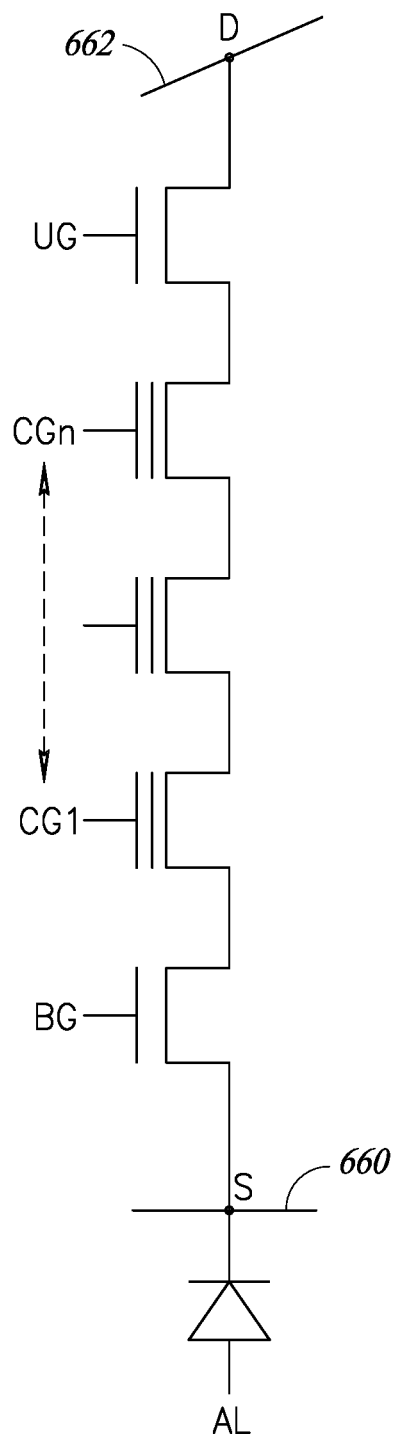
FIG. 37A is a circuit schematic of a SONOS device according to an embodiment as described herein.
Figure 37B:
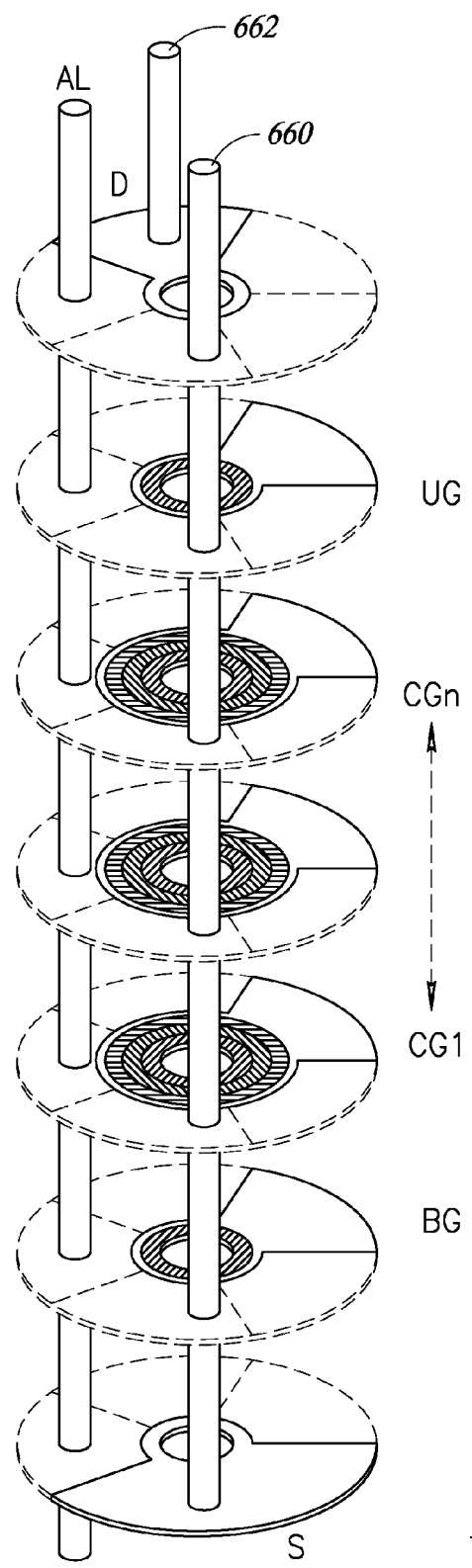
FIG. 37B is a perspective view of a modular interconnect structure for a vertical GAA SONOS device in which annular contacts are made of multiple concentric layers of metal, according to an embodiment as described herein.
Figure 37C:
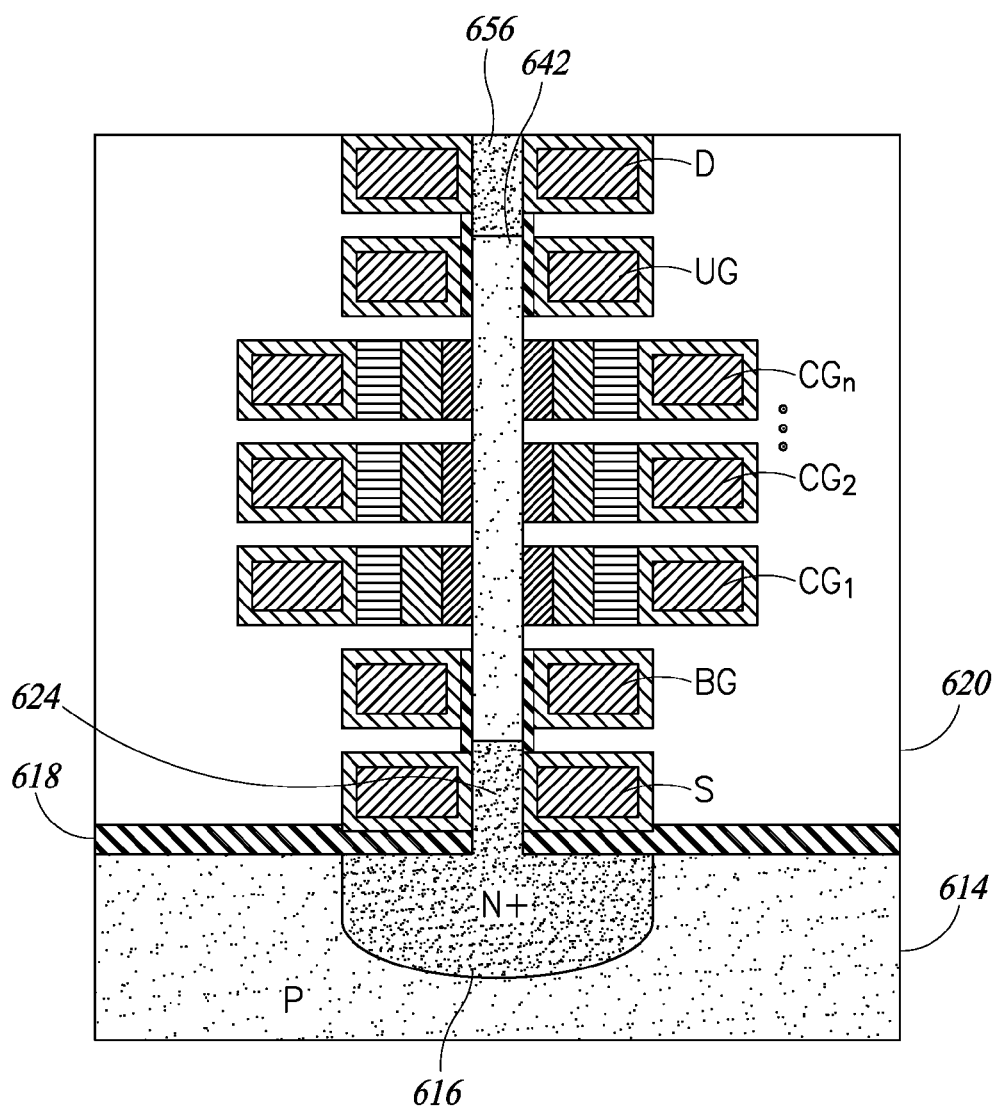
FIG. 37C is a cross-sectional view of a completed vertical GAA Silicon-oxide-nitride-oxide-silicon device (SONOS) and a corresponding modular interconnect structure.

FIGS. 37A-37C show a schematic view, a transistor cross-sectional view, and cross-sectional view, respectively, of the modular interconnect structure for a completed vertical GAA SONOS memory cell. The vertical GAA SONOS memory cell has a source connection provided by a via 660 and a drain connection provided by a via 662. The vertical GAA SONOS memory cell may include an anti-leakage diode coupled to the source S and accessible by the via AL.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entireties. Aspects of the embodiments can be modified, if necessary to employ concepts of the various patents, applications and publications to provide yet further embodiments.

The invention claimed is:

1. An apparatus comprising:
a substrate having a substrate surface;
a plurality of transistors, each transistor having a source, a gate, and a drain, each transistor including:
a modular interconnect structure including:
a plurality of annular contacts, each annular contact aligned with and coupled to one of the source, gate, and drain of the transistor;
a plurality of radial sectors, each radial sector having a first interior edge and a second exterior edge, the first interior edge being coupled to one of the annular contacts, the first interior edge having a first dimension and the second exterior edge having a second dimension that is greater than the first dimension, each radial sector is a conductive domain in a plane aligned with a respective one of the source, gate, and drain; and
a plurality of vias, each via coupled to one of the plurality of radial sectors between the first interior edge and the second exterior edge.

2. The apparatus of claim 1 wherein the substrate is doped.

3. The apparatus of claim 2, further comprising wells formed in the doped substrate, the wells having a polarity opposite that of the doped substrate, a diode formed in the wells and the doped substrate, the diode configured to reduce current leakage to the substrate.

4. The apparatus of claim 1 wherein each of the transistors includes an epitaxial semiconducting pillar that includes:
the source stacked on the drain;
an epitaxial channel extending between the source and drain.

5. The apparatus of claim 4 wherein a width dimension of each pillar is in a range of about 0.03 and 1.0 µm.

6. The apparatus of claim 4, further comprising a gate dielectric around the epitaxial channel, the gate dielectric being a high-k gate oxide.

7. The apparatus of claim 6 wherein the high-k gate oxide has a thickness in a range of 2 and 800 nm and a length in a range of 2 nm and 2 µm.

8. The apparatus of claim 4 wherein each transistor includes one or more of metal-oxide-semiconductor field effect transistors (MOSFETs), tunneling field effect transistors (TFETs), silicon-oxide-nitride-oxide-silicon (SONOS) devices, silicon-on-insulator (SOI) devices, and static induction transistors (SITS).

9. The apparatus of claim 1 wherein the substrate includes one or more of silicon, silicon carbide (SiC), and a buried oxide (BOX).

10. The apparatus of claim 1 wherein the modular interconnect structure is coupled ones of the plurality of transistors according to a circuit design that includes a gate-all-around TFET stacked on a gate-all-around CMOS transistor.

11. The apparatus of claim 4, further including an additional via disposed between the substrate and at least one of the plurality of transistors, the additional terminal configured to protect the transistor against electrostatic discharge.

12. The apparatus of claim 1 wherein the modular interconnect structure is coupled to ones of the plurality of transistors according to a circuit design that implements Boolean logic using NOR gates in product-of-sum blocks.

13. The apparatus of claim 12 wherein each NOR gate includes vertical transistors stacked in a single pillar arrangement.

14. The apparatus of claim 12 wherein each NOR gate includes vertical transistors stacked in a two-pillar arrangement.

15. The apparatus of claim 1 wherein the modular interconnect structure is coupled to ones of the plurality of transistors according to a circuit design that implements Boolean logic using NAND gates in sum-of-product blocks.

16. The apparatus of claim 15 wherein each NAND gate includes vertical transistors stacked in a single pillar arrangement.

17. The apparatus of claim 15 wherein each NAND gate includes vertical transistors stacked in a two-pillar arrangement.

18. The apparatus of claim 1, including a tunneling field effect transistor stacked on a CMOS transistor, stacked on a diode.

19. The apparatus of claim 1, wherein the modular interconnect structure further comprises domain extension pads coupled to and extending radially outward from the second exterior edge of the radial sectors.

20. The apparatus of claim 19 wherein the domain extension pads are in the shape of radial spokes.

21. The apparatus of claim 19 wherein the modular interconnect structure further comprises enlarged via landing pads coupled to the domain extension pads.

22. The apparatus of claim 21 wherein the enlarged via landing pads are circular.

23. The apparatus of claim 21 wherein the modular interconnect structure is coupled to ones of the plurality of transistors according to a circuit design that includes additional enlarged via landing pads arranged around a circumference of a conductive ring coupled to the conductive domain.

24. An apparatus comprising:
a semiconductor substrate;
a plurality of vertical transistors that each include:
a plurality of semiconducting pillars extending along respective axes transverse to a surface of the semiconductor substrate; and
a plurality of discs, each disc having a first area and each disc surrounding the respective semiconducting pillar, each disc including:
a conducting region having a second area that is less than the first area; and
a non-conducting region adjacent to the conducting region having a third area, the third area being less than the first area;
a plurality of vias extending substantially parallel to the axes, ones of the plurality of vias coupled to ones of the conducting regions and ones of the plurality of vias passing through ones of the non-conducting regions.

25. The apparatus of claim 24 wherein the conducting regions include one or more of annular contacts, radial sectors, domain extension pads, enlarged via landing pads, and conductive lines.

26. An apparatus, comprising:
a silicon substrate;
a plurality of vertical transistors stacked on the silicon substrate, each vertical transistor including a source, a gate, and a drain; and
a modular interconnect structure that includes:
a plurality of discs, each transistor having a first disc that includes a source contact, a second disc that includes a drain contact, and a third disc that includes a gate contact, each of the source contact, the drain contact, and the gate contact including:
a central annular metallic portion; and
a conductive annular sector coupled to the central annular metallic portion at a first end and a second end of the conductive annular sector being wider than the first end.

27. The apparatus of claim 26 wherein the vertical transistors are metal-oxide-semiconductor transistors.

28. The apparatus of claim 26 wherein the vertical transistors are gate-all-around field effect transistors.

29. An apparatus comprising:
a substrate having a substrate surface;
a plurality of transistors, each transistor having a source terminal, a gate terminal, and a drain terminal arranged in a stack that is extending away from the substrate surface; and
a modular interconnect structure coupled to the terminals of selected ones of the plurality of transistors, the modular interconnect structure is coupled to the terminals of the selected ones of the plurality of transistors according to a circuit design that includes a gate-all-around TFET stacked on a gate-all-around CMOS transistor, the modular interconnect structure including:
a plurality of annular contacts, each annular contact aligned with and coupled to one of the terminals of the selected ones of the plurality of transistors;
a plurality of radial sectors, each radial sector coupled to one of the annular contacts, the radial sector and the annular contact being a conductive domain in a plane aligned with a respective one of the terminals; and
a plurality of vias coupled to selected ones of the conductive domains, the vias aligned with the stack extending away from the substrate surface.

30. The apparatus of claim 29, wherein each radial sector has first end positioned adjacent to the stack and a second end spaced from the stack, the second end having an outer curved edge that is larger than an inner edge of the first end.

31. An apparatus comprising:
a substrate having a substrate surface;
a diode in the substrate;
a CMOS transistor stacked on the diode, the CMOS transistor having a source terminal, a gate terminal, and a drain terminal extending away from the substrate surface;
a tunneling field effect transistor stacked on the CMOS transistor, the tunneling field effect transistor having a source terminal, a gate terminal, and a drain terminal extending away from the substrate surface and spaced from the substrate surface by the CMOS transistor;
a modular interconnect structure coupled to selected terminals of the CMOS and tunneling field effect transistors, the modular interconnect structure including:
a plurality of annular contacts, each annular contact aligned with and coupled to one of the terminals of one of the CMOS and tunneling field effect transistors;
a plurality of radial sectors, each radial sector coupled to one of the annular contacts, a conductive domain formed by the radial sector and respective annular contact in a plane aligned with a respective one of the terminals; and
a plurality of vias coupled to selected ones of the conductive domains, the vias extending away from the substrate surface.

32. The apparatus of claim 31 wherein each radial sector has first end positioned adjacent to the annular contact and a second end spaced from the annular contact, the second end having an outer curved edge that has a larger dimension than an inner edge of the first end.

* * * * *